(12) United States Patent
Iwasawa et al.

(10) Patent No.: US 7,108,955 B2
(45) Date of Patent: *Sep. 19, 2006

(54) POLYSILOXANE, PROCESS FOR PRODUCTION THEREOF AND RADIATION-SENSITIVE RESIN COMPOSITION

(75) Inventors: Haruo Iwasawa, Tokyo (JP); Akihiro Hayashi, Tokyo (JP); Tsutomu Shimokawa, Tokyo (JP); Masafumi Yamamoto, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/476,453

(22) PCT Filed: Apr. 30, 2002

(86) PCT No.: PCT/JP02/04333

§ 371 (c)(1),
(2), (4) Date: Oct. 31, 2003

(87) PCT Pub. No.: WO02/090427

PCT Pub. Date: Nov. 14, 2002

(65) Prior Publication Data
US 2004/0143082 A1 Jul. 22, 2004

(30) Foreign Application Priority Data
May 1, 2001 (JP) .............................. 2001-133795
Feb. 25, 2002 (JP) .............................. 2002-048643

(51) Int. Cl.
*G03C 1/73* (2006.01)
(52) U.S. Cl. ..................... 430/270.1; 524/99; 524/165; 528/42; 528/43
(58) Field of Classification Search ............. 430/270.1; 528/42
See application file for complete search history.

(56) References Cited

U.S. PATENT DOCUMENTS 6,531,260 B1 * 3/2003 Iwasawa et al. .......... 430/270.1

* cited by examiner

*Primary Examiner*—Marc S. Zimmer
(74) *Attorney, Agent, or Firm*—Merchant & Gould, PC; Steven B. Kelber

(57) ABSTRACT

A novel polysiloxane having high transparency to radiations with a wavelength of 193 nm or less, particularly 157 nm or less, and exhibiting superior dry etching resistance and a radiation-sensitive resin composition comprising the polysiloxane exhibiting superior sensitivity, resolution, and the like are provided. The polysiloxane is a resin having the structural unit (I) and/or structural unit (II) of the following formula (1), and having an acid-dissociable group, wherein $R^1$ represents a monovalent aromatic group substituted with a fluorine atom or a fluoroalkyl group or a monovalent aliphatic group substituted with a fluorine atom or a fluoroalkyl group and $R^2$ represents the above a monovalent aromatic group, the above monovalent aliphatic group, a hydrogen atom, a monovalent hydrocarbon group, haloalkyl group, or amino group. The radiation-sensitive resin composition (A) comprises the polysiloxane (A) and the photoacid generator (B)

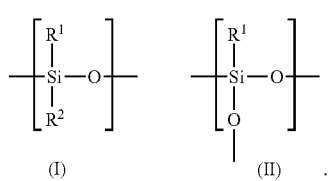

(1)

17 Claims, 1 Drawing Sheet

POLYSILOXANE, PROCESS FOR PRODUCTION THEREOF AND RADIATION-SENSITIVE RESIN COMPOSITION

TECHNICAL FIELD

The present invention relates to a radiation sensitive resin composition comprising a polysiloxane having a fluorine-substituted cyclic organic group suitable for microprocessing using various types of radiation such as deep ultraviolet radiation, electron beams, and X-rays.

BACKGROUND ART

A recent strong demand for high density and highly integrated LSIs (large-scale integrated circuits) radically accelerates miniaturization of wiring patterns.

A method of using short wavelength radiation in lithography is one of the means for responding to the progress in miniaturization. In recent years, deep ultraviolet rays such as an F2 excimer laser (wavelength: 157 nm), ArF excimer laser (wavelength: 193 nm), or KrF excimer laser (wavelength: 248 nm), electron beams, or X rays are used instead of ultraviolet rays such as g-line (wavelength: 436 nm) and i-line (wavelength: 365 nm). Deep ultraviolet rays with a wavelength of 193 nm or less are attracting particular attention.

As a resist applicable to such short wavelength radiations, a number of resists utilizing a chemical amplification effect between a component having an acid-dissociable functional group and a photoacid generator which generates an acid upon irradiation (hereinafter called "exposure") has been proposed. Such a resist is hereinafter called a chemically amplified resist.

As a radiation sensitive resin composition applicable to short wavelength radiations, a number of compositions utilizing a chemical amplification effect between a component having an acid-dissociable functional group and a photoacid generator which generates an acid upon irradiation (hereinafter called "exposure") has been proposed. Such a composition is hereinafter called a chemically-amplified radiation sensitive composition.

As the chemically-amplified radiation sensitive composition, Japanese Patent Publication No. 27660/1990 discloses a composition comprising a polymer containing a t-butyl ester group of carboxylic acid or a t-butylcarbonate group of phenol and a photoacid generator. This composition utilizes the effect of the polymer to release a t-butyl ester group or t-butyl carbonate group by the action of an acid generated upon exposure to form an acidic group such as a carboxylic group or a phenolic hydroxyl group, which renders an exposed area on a resist film readily soluble in an alkaline developer.

Novolac resins, poly(vinylphenol) resins, and the like have been conventionally used in resist compositions. However, because these resins exhibit strong absorbance at a wavelength of 193 nm due to inclusion of aromatic rings in the structure, a lithographic process by an ArF excimer laser, for example, using these resins cannot provide high accuracy corresponding to high photosensitivity, high resolution, and a high aspect ratio.

Therefore, a resin for use in a resist, transparent to a wavelength of 193 nm or less, particularly to an F2 excimer laser (wavelength: 157 nm), Kr2 excimer laser (wavelength: 147 nm), or ArKr excimer laser (wavelength: 134 nm) and exhibiting excellent dry etching resistance equivalent to or better than aromatic rings has been desired. A polysiloxane is one such a polymer. R. R. Kunz et al. of the MIT have reported their research results showing excellent transparency of a polysiloxane at a wavelength of 193 nm or less, particularly at 157 nm, commenting on superiority of this polymer as a resist in a lithographic process using radiation with a wavelength of 193 nm or less (J. Photopolym. Sci. Technol., Vol. 12, No. 4, 1999). Moreover, polysiloxanes are known to exhibit excellent dry etching properties. In particular, a resist containing polyorganosilsesquioxane having a ladder structure is known to possess high plasma resistance.

Several resist materials using a siloxane polymer have also been reported. For example, Japanese Patent Application Laid-open No. 323611/1993 discloses a chemically amplified radiation sensitive composition comprising a polysiloxane having an acid-dissociable group such as a carboxylic acid ester group, phenol ether group, etc., on the side chain, bonded to a silicon atom via one or more carbon atoms. However, this polysiloxane cannot provide high resolution if the acid-dissociable carboxylic acid groups on the side chain do not efficiently dissociate. If a large number of acid-dissociable groups dissociate, on the other hand, the curing shrinkage stress of the resist film increases, causing cracks and peels in the resist film.

Japanese Patent Application Laid-open No. 160623/1996 discloses a positive tone resist using a polymer in which the carboxyl group of poly(2-carboxyethylsiloxane) is protected with an acid-dissociable group such as a t-butyl group. Since this resist protects the carboxyl groups only insufficiently, it is difficult to develop the resist containing a large amount of carboxylic acid components remaining in the non-exposed area using a common alkaline developing solution.

Japanese Patent Application Laid-open No. 60733/1999 discloses a chemically amplified radiation sensitive composition containing a polyorganosilsesquioxane having an acid-dissociable ester group. This polyorganosilsesquioxane is prepared by the addition reaction of an acid-dissociable group-containing (meth)acryl monomer to a condensation product of vinyl trialkoxysilane, γ-methacryloxypropyltrialkoxysilane, or the like. The resin has a problem of insufficient transparency to light with a wavelength of 193 nm or less due to unsaturated groups originating from a (meth) acrylic monomer remaining on the polymer side chains. The patent specification also describes a resist resin composition containing a polymer made by the esterification of polyhydroxycarbonylethylsilsesquioxane with t-butyl alcohol. This polymer also has the same problem as a resist as encountered by the polymer disclosed in Japanese Patent Application Laid-open No. 160623/1996 due to a low degree of carboxyl group protection.

In addition, to respond to miniaturization in recent years, the chemically amplified radiation sensitive composition must not only exhibit higher resolution, but also be applicable to substrates with different reflection coefficients. In particular, when applied to a substrate with a large reflection coefficient, effects of standing waves and swing curves must be minimized. To this end, it is essential to control radiation transmittance. One method of reducing radiation transmittance is increasing the amount of a photoacid generator with a low radiation transmittance. However, this method is not necessarily appropriate in view of resist performance. The addition of a third component, such as a dye, is considered to be more appropriate.

Japanese Patent Application Laid-open Publications No. 319155/1995 and No. 265061/1999 propose the addition of an anthracene compound as a dye to control the radiation transmittance of chemically amplified radiation sensitive compositions. However, merely adding a compound with a low radiation transmittance may impair performance as a resist, such as decreased resolution and incomplete development. In addition, since anthracene compounds are generally sublimative, the exposure apparatus may be adversely affected. Moreover, many anthracene compounds exhibit insufficient compatibility with resin components and additives contained in chemically amplified radiation sensitive compositions.

Japanese Patent Application Laid-open Publication No. 120628/1998 discloses a carboxylic acid derivative having a tricyclic aromatic skeleton, such as an anthracene skeleton, with a carboxyl group bonded via a divalent hydrocarbon group or an oxygen atom, the carboxyl group being protected with a group unstable in the presence of an acid. The patent application describes that the carboxylic acid derivative exhibits superior light absorption properties and is suitable as an additive to chemically amplified radiation sensitive compositions.

Under the above-described technological background and in view of further technological development in the photolithographic process requiring increasingly stringent performance accommodating the rapid progress of miniaturization, development of a chemically amplified radiation sensitive composition exhibiting high transparency to radiation with a wavelength of 193 nm or less and possessing excellent basic properties as a resist still remains as an important technological subject.

DISCLOSURE OF THE INVENTION

The present invention provides a polysiloxane having the structural unit (I) and/or structural unit (II), shown by the following formula (1), having an acid-dissociable group dissociable with an acid, and possessing a polystyrene-reduced weight average molecular weight determined by gel permeation chromatography (GPC) in the range of 500–1,000,000.

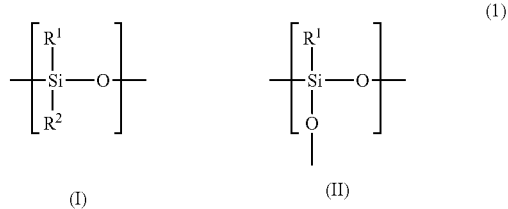

wherein $R^1$ represents a monovalent aromatic group having 6–20 carbon atoms substituted with at least one group selected from the group consisting of a fluorine atom and fluoroalkyl groups having 1–10 carbon atoms or a monovalent alicyclic group having 3–15 carbon atoms substituted with at least one group selected from the group consisting of a fluorine atom and fluoroalkyl groups having 1–10 carbon atoms and $R^2$ represents a monovalent aromatic group having 6–20 carbon atoms substituted with at least one group selected from the group consisting of a fluorine atom and fluoroalkyl groups having 1–10 carbon atoms, a monovalent alicyclic group having 3–15 carbon atoms substituted with at least one group selected from the group consisting of a fluorine atom and fluoroalkyl groups having 1–10 carbon atoms, a hydrogen atom, a halogen atom, a monovalent hydrocarbon group having 1–20 carbon atoms, a haloalkyl group having 1–20 carbon atoms, or a primary, secondary, or tertiary amino group.

The present invention further provides a process for producing a polysiloxane comprising polycondensing a silane compound (i) and/or a silane compound (ii) shown by the following formula (10) in the presence of an acid catalyst and further proceeding the condensation reaction in the presence of a base catalyst,

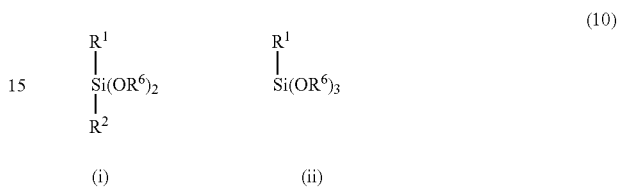

wherein $R^1$ represents a monovalent aromatic group having 6–20 carbon atoms substituted with at least one group selected from the group consisting of a fluorine atom and fluoroalkyl groups having 1–10 carbon atoms or a monovalent alicyclic group having 3–15 carbon atoms substituted with at least one group selected from the group consisting of a fluorine atom and fluoroalkyl groups having 1–10 carbon atoms, $R^2$ represents a monovalent aromatic group having 6–20 carbon atoms substituted with at least one group selected from the group consisting of a fluorine atom and fluoroalkyl groups having 1–10 carbon atoms, a monovalent alicyclic group having 3–15 carbon atoms substituted with at least one group selected from the group consisting of a fluorine atom and fluoroalkyl groups having 1–10 carbon atoms, a hydrogen atom, a halogen atom, a monovalent hydrocarbon group having 1–20 carbon atoms, a haloalkyl group having 1–20 carbon atoms, or a primary, secondary, or tertiary amino group, and $R^6$ individually represents a linear, branched, or cyclic alkyl group having 1–10 carbon atoms or a linear, branched, or cyclic haloalkyl group having 1–10 carbon atoms.

The present invention still further provides a radiation sensitive resin composition comprising (A) a polysiloxane having the structural unit (I) and/or structural unit (II), shown by the following formula (1), having an acid-dissociable group dissociable with an acid, and possessing a polystyrene-reduced weight average molecular weight determined by gel permeation chromatography (GPC) in the range of 500–1,000,000 and (B) a photoacid generator.

The present invention is described below in detail.

<Polysiloxanes>

Polysiloxane (1)

The polysiloxane of the present invention is a compound having the above structural unit (I) and/or structural unit (II), shown by the above formula (1), and having an acid-dissociable group dissociable with an acid (hereinafter referred to as "polysiloxane (1)").

The acid-dissociable group in the polysiloxane (1) may be present in the structural unit (I) and/or structural unit (II) or may be present in another structural unit described later.

In the structural unit (I) and/or structural unit (II), as examples of the monovalent aromatic group having 6–20 carbon atoms substituted with at least one group selected from the group consisting of a fluorine atom and fluoroalkyl groups having 1–10 carbon atoms represented by $R^1$ and $R^2$, the groups shown by the following formula (2), formula (3), or formula (4) can be given:

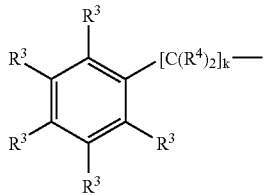
(2)

wherein $R^3$ individually represents a fluorine atom, fluoroalkyl group having 1–10 carbon atoms, hydrogen atom, halogen atom other than fluorine atom, alkyl group having 1–10 carbon atoms, or monovalent organic group having an acid-dissociable group, a hydroxyl group, or a carboxyl group, $R^4$ individually represents a fluorine atom, fluoroalkyl group having 1–10 carbon atoms, hydrogen atom, halogen atom other than fluorine atom, or alkyl group having 1–10 carbon atoms, provided that at least one of five $R^3$ groups and 2k $R^4$ groups represents a fluorine atom or fluoroalkyl group having 1–10 carbon atoms, and k is an integer of 0 to 10,

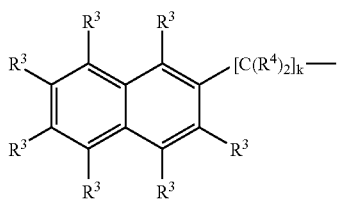
(3)

wherein $R^3$ individually represents a fluorine atom, fluoroalkyl group having 1–10 carbon atoms, hydrogen atom, halogen atom other than fluorine atom, alkyl group having 1–10 carbon atoms, or monovalent organic group having an acid-dissociable group, a hydroxyl group, or a carboxyl group, $R^4$ individually represents a fluorine atom, fluoroalkyl group having 1–10 carbon atoms, hydrogen atom, halogen atom other than fluorine atom, or alkyl group having 1–10 carbon atoms, provided that at least one of seven $R^3$ groups and 2k $R^4$ groups represents a fluorine atom or fluoroalkyl group having 1–10 carbon atoms, and k is an integer of 0 to 10,

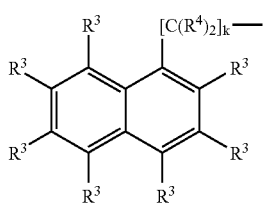
(4)

wherein $R^3$ individually represents a fluorine atom, fluoroalkyl group having 1–10 carbon atoms, hydrogen atom, halogen atom other than fluorine atom, alkyl group having 1–10 carbon atoms, or monovalent organic group having an acid-dissociable group, a hydroxyl group, or a carboxyl group, $R^4$ individually represents a fluorine atom, fluoroalkyl group having 1–10 carbon atoms, hydrogen atom, halogen atom other than fluorine atom, or alkyl group having 1–10 carbon atoms, provided that at least one of seven $R^3$ groups and 2k $R^4$ groups represents a fluorine atom or fluoroalkyl group having 1–10 carbon atoms, and k is an integer of 0 to 10.

In the structural unit (I) and/or structural unit (II), as examples of the monovalent alicyclic group having 3–15 carbon atoms substituted with at least one group selected from the group consisting of a fluorine atom and fluoroalkyl groups having 1–10 carbon atoms represented by $R^1$ and $R^2$, the groups shown by the following formula (5), formula (6), or formula (7) can be given:

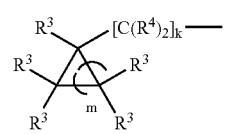
(5)

wherein $R^3$ individually represents a fluorine atom, fluoroalkyl group having 1–10 carbon atoms, hydrogen atom, halogen atom other than fluorine atom, alkyl group having 1–10 carbon atoms, or monovalent organic group having an acid-dissociable group, a hydroxyl group, or a carboxyl group, $R^4$ individually represents a fluorine atom, fluoroalkyl group having 1–10 carbon atoms, hydrogen atom, halogen atom other than fluorine atom, or alkyl group having 1–10 carbon atoms, provided that at least one of (3+2m) $R^3$ groups and 2k $R^4$ groups represents a fluorine atom or fluoroalkyl group having 1–10 carbon atoms, k is an integer of 0 to 10, and m is an integer of 1 to 18,

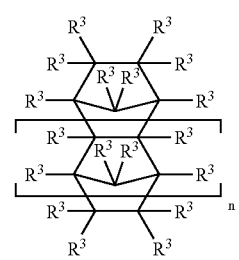
(6)

wherein one of (12+6n) $R^3$ groups represents a group —[C$(R^4)_2]_k$— (wherein $R^4$ individually represents a fluorine atom, fluoroalkyl group having 1–10 carbon atoms, hydrogen atom, halogen atom other than fluorine atom, alkyl group having 1–10 carbon atoms and k is an integer of 0–10) and the remaining $R^3$ groups individually represent a fluorine atom, fluoroalkyl group having 1–10 carbon atoms, hydrogen atom, halogen atom other than fluorine atom, alkyl group having 1–10 carbon atoms, or monovalent organic group having an acid-dissociable group, a hydroxyl group, or a carboxyl group, provided that at least one of the remaining (11+6n) $R^3$ groups and 2k $R^4$ groups represents a fluorine atom or fluoroalkyl group having 1–10 carbon atoms, and n is an integer of 0–3,

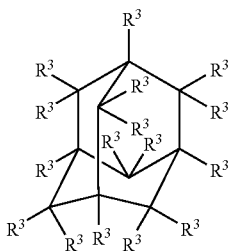
(7)

wherein one of 16 $R^3$ groups represents a group —[C($R^4$)$_2$]$_k$— (wherein $R^4$ individually represents a fluorine atom, fluoroalkyl group having 1–10 carbon atoms, hydrogen atom, halogen atom other than fluorine atom, alkyl group having 1–10 carbon atoms and k is an integer of 0–10) and the remaining $R^3$ groups individually represent a fluorine atom, fluoroalkyl group having 1–10 carbon atoms, hydrogen atom, halogen atom other than fluorine atom, alkyl group having 1–10 carbon atoms, or monovalent organic group having an acid-dissociable group, a hydroxyl group, or a carboxyl group, provided that at least one of the remaining 15 $R^3$ groups and 2k $R^4$ groups represents a fluorine atom or fluoroalkyl group having 1–10 carbon atoms.

As examples of the fluoroalkyl group having 1–10 carbon atoms represented by $R^3$ or $R^4$ in the formulas (2)–(7), linear, branched, or cyclic groups such as a fluoromethyl group, difluoromethyl group, trifluoromethyl group, pentafluoroethyl group, heptafluoro-n-propyl group, heptafluoro-i-propyl group, nonafluoro-n-butyl group, perfluoro-n-pentyl group, perfluoro-n-hexyl group, perfluoro-n-heptyl group, perfluoro-n-octyl group, perfluoro-n-nonyl group, perfluoro-n-decyl group, perfluorocyclopentyl group, and perfluorocyclohexyl group can be given.

As examples of the halogen atom other than fluorine atom represented by $R^3$ or $R^4$, a chlorine atom, bromine atom, and iodine atom can be given.

As examples of the alkyl groups having 1–10 carbon atoms represented by $R^3$ or $R^4$, a linear, branched, or cyclic group such as a methyl group, ethyl group, n-propyl group, i-propyl group, n-butyl group, i-butyl group, sec-butyl group, t-butyl group, n-pentyl group, n-hexyl group, n-heptyl group, n-octyl group, n-octyl group, n-nonyl group, n-decyl group, cyclopentyl group, and cyclohexyl group can be given.

In the monovalent organic group having an acid-dissociable group dissociable with an acid, a hydroxyl group, or a carboxyl group represented by $R^3$, as examples of the acid-dissociable group, one or more acid-dissociable groups that are dissociable with an acid and produce preferably a carboxyl group, phenolic hydroxyl group, or alcoholic hydroxyl group can be given; as examples of the hydroxyl group, a phenolic hydroxyl group or alcoholic hydroxyl group can be given; and as examples of the monovalent organic group skeleton, a group stable under the reaction conditions for producing the polysiloxane (1) such as a linear or branched hydrocarbon group having 1–10 carbon atoms or a monovalent cyclic hydrocarbon group having 4–30 carbon atoms can be given.

The groups of the following formula (8) are preferable as the monovalent organic group.

—P-Q-$R^5$ (8)

wherein P represents a single bond, a methylene group, difluoromethylene group, linear or branched alkylene group having 2–10 carbon atoms, or a linear or branched fluoroalkylene group having 2–10 carbon atoms, Q is —O— or —COO—, and $R^5$ represents a hydrogen atom or a monovalent organic group dissociating with an acid to produce a hydrogen atom.

As examples of the linear or branched alkylene group having 1–10 carbon atoms represented by P in the formula (8), an ethylene group, propylene group, trimethylene group, and tetramethylene group can be given. As examples of the linear or branched fluoroalkylene group having 2–10 carbon atoms, a tetrafluoroethylene group, hexafluorotrimethylene group, octafluorotetramethylene group, 1,1-bis(trifluoromethyl)ethylene group, and 2,2-bis(trifluoromethyl)ethylene group can be given.

As P in the formula (8), a single bond, methylene group, difluoromethylene, 1,1-bis(trifluoromethyl)ethylene group, and 2,2-bis(trifluoromethyl)ethylene group are preferable.

As examples of the monovalent organic group dissociable with an acid to produce hydrogen atoms represented by $R^5$, linear, branched, or cyclic alkyl groups such as a methyl group, ethyl group, n-propyl group, i-propyl group, n-butyl group, i-butyl group, sec-butyl group, t-butyl group, n-pentyl group, n-hexyl group, n-heptyl group, n-octyl group, n-decyl group, cyclopentyl group, cyclohexyl group, 4-t-butylcyclohexyl group, cycloheptyl group, and cyclooctyl group; aryloxycarbonyl groups such as a phenoxycarbonyl group, 4-t-butylphenyl group, and 1-naphthyl group; aralkyl groups such as a benzyl group, 4-t-butylbenzyl group, phenethyl group, and 4-t-butylphenethyl group; carbonyl groups such as a t-butoxycarbonyl group, methoxycarbonyl group, ethoxycarbonyl group, i-propoxycarbonyl group, 9-fluorenylmethylcarbonyl group, 2,2,2-trichloroethylcarbonyl group, 2-(trimethylsilyl)ethylcarbonyl group, i-butylcarbonyl group, vinylcarbonyl group, allylcarbonyl group, benzylcarbonyl group, 4-ethoxy-1-naphthylcarbonyl group, and methyldithiocarbonyl group; organic groups bonding to the oxygen atom in the formula (8) to form an acetal structure such as a methoxymethyl group, methylthiomethyl group, ethoxymethyl group, ethylthiomethyl group, t-butoxymethyl group, t-butylthiomethyl group, (phenyldimethylsilyl)methoxymethyl group, benzyloxymethyl group, t-butoxymethyl group, siloxymethyl group, 2-methoxyethoxymethyl group, 2,2,2-trichloroethoxymethyl group, bis(2-chloroethoxy)methyl group, 2-(trimethylsilyl)ethoxymethyl group, 1-methoxycyclohexyl group, tetrahydropyranyl group, 4-methoxytetrahydropyranyl group, tetrahydrofuranyl group, tetrahydrothiopyranyl group, tetrahydrothiofuranyl group, 1-ethoxyethyl group, 1-(2-chloroethoxy)ethyl group, 1-methyl-1-methoxyethyl group, 1-methyl-1-benzyloxyethyl group, 1-(2-chloroethoxy)ethyl group, 1-methyl-1-benzyloxy-2-fluoroethyl group, 2,2,2-trichloroethyl group, 2-trimethylsilylethyl group, and 2-(phenylcerenyl??)ethyl group; and alkylsilyl groups such as a trimethylsilyl group, triethylsilyl group, tri-i-propylsilyl group, dimethyl-i-propylsilyl group, diethyl-i-propylsilyl group, dimethylethylsilyl group, t-butyldimethylsilyl group, t-butyldiphenylsilyl group, tribenzylsilyl group, tri-p-xylylsilyl group, triphenylsilyl group, diphenylmethylsilyl group, and t-butylmethoxyphenylsilyl group can be given.

Of these monovalent organic groups dissociable by the action of an acid to produce hydrogen atoms, the t-butyl group, t-butoxycarbonyl group, tetrahydropyranyl group, tetrahydrofuranyl group, methoxymethyl group, ethoxymethyl group, 1-methoxyethyl group, 1-ethoxyethyl group, and t-butyldimethylsilyl group, are preferable.

When the polysiloxane (1) has the structural unit (I) and the structural unit (II), $R^1$ in the structural unit (I) and $R^1$ in the structural unit (II) may be either the same or different.

As examples of the halogen atom represented by $R^2$ in the structural unit (I), a fluorine atom, chlorine atom, bromine atom, iodine atom, and the like can be given.

As examples of the monovalent hydrocarbon groups having 1–20 carbon atoms represented by $R^2$, a linear, branched, or cyclic alkyl groups such as a methyl group, ethyl group, n-propyl group, i-propyl group, n-butyl group, i-butyl group, sec-butyl group, t-butyl group, n-pentyl group, neopentyl group, n-hexyl group, n-heptyl group, n-octyl group, 2-ethylhexyl group, n-nonyl group, n-decyl group, n-dodecyl group, n-tetradecyl group, n-hexadecyl group, n-octadecyl group, cyclobutyl group, cyclopentyl group, and cyclohexyl group; aromatic hydrocarbon groups such as a phenyl group, o-tolyl group, m-tolyl group, p-tolyl group, benzyl group, phenethyl group, 1-naphthyl group, and 2-naphthyl group; and bridged hydrocarbon groups such as a norbornyl group, tricyclodecanyl group, tetracyclodecanyl group, and adamantyl group can be given.

Of these monovalent hydrocarbon groups, a methyl group, ethyl group, cyclopentyl group, cyclohexyl group, norbornyl group, tetracyclodecanyl group, and the like are preferable.

As examples of the monovalent haloalkyl group having 1–20 carbon atoms represented by $R^2$, a monovalent hydrocarbon group having 1–20 carbon atoms in which one or more hydrogen atoms are replaced by one or more halogen atoms, preferably one or more fluorine atoms, can be given. Specific examples include a trifluoromethyl group, pentafluoroethyl group, and 3,3,3,2,2-pentafluoro-n-propyl group. As examples of the secondary or tertiary amino groups represented by $R^2$, a methylamino group, ethylamino group, n-propylamino group, i-propylamino group, n-butylamino group, cyclopentylamino group, cyclohexylamino group, phenylamino group, benzylamino group, dimethylamino group, diethylamino group, di-n-propylamino group, di-i-propylamino group, di-n-butylamino group, dicyclopentylamino group, dicyclohexylamino group, diphenylamino group, and dibenzylamino group can be given.

As the amino groups represented by $R^2$, an amino group, dimethylamino group, diethylamino group, dicyclopentylamino group, dicyclohexylamino group, and diphenylamino group are preferable.

Particularly preferable groups represented by $R^2$ in the structural unit (I) are a methyl group, ethyl group, cyclohexyl group, pentafluorophenyl group, chlorine atom, dimethylamino group, and the like.

As the polysiloxane (1) in the present invention, a polysiloxane having a group of the formula (6) for $R^1$ in the structural unit (I) and/or the structural unit (II), wherein the group of the formula (6) contains a group of the formula (8), is preferable.

Given as preferable specific examples of the group shown by the formula (6) are groups of the following formulas (9-1) to (9-121) can be given:

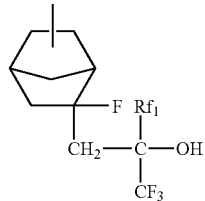
(9-1)

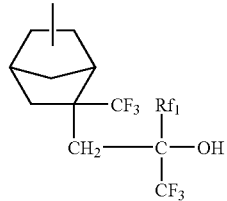
(9-2)

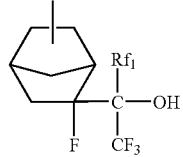
(9-3)

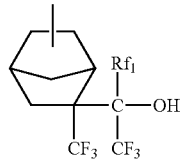
(9-4)

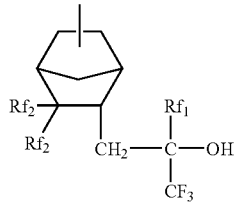
(9-5)

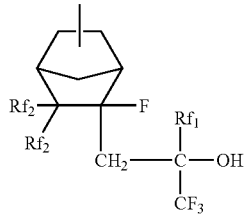
(9-6)

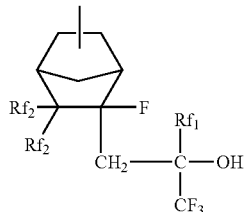
(9-7)

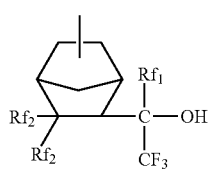
(9-8)

(9-9) 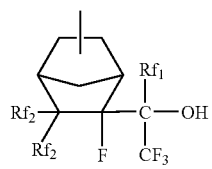
(9-10) 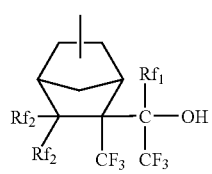
(9-11) 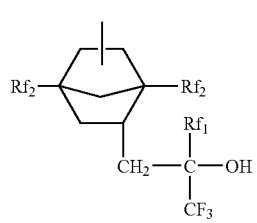
(9-12) 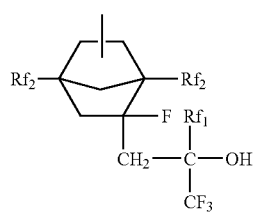
(9-13) 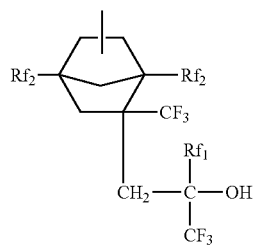
(9-14) 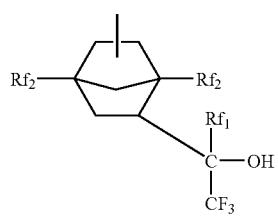
(9-15) 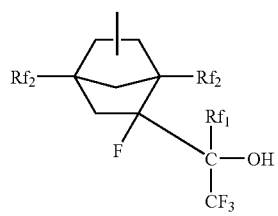
(9-16) 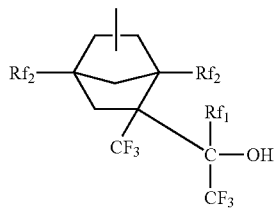
(9-17) 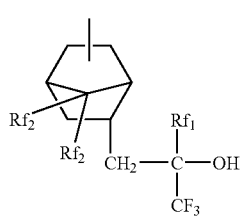
(9-18) 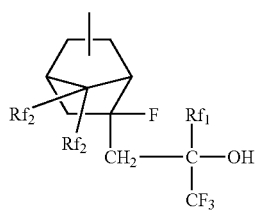
(9-19) 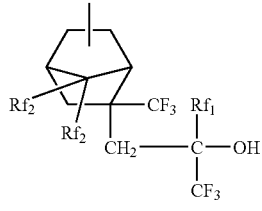
(9-20) 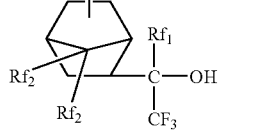
(9-21) 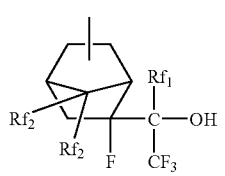
(9-22) 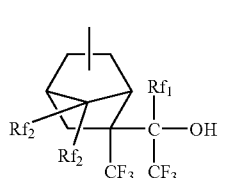

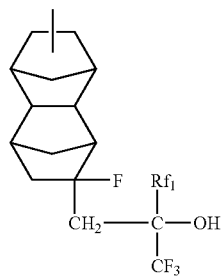 (9-23)
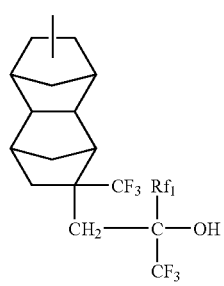 (9-24)
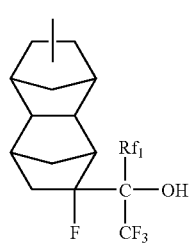 (9-25)
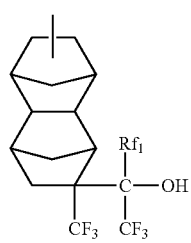 (9-26)
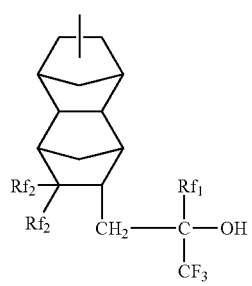 (9-27)
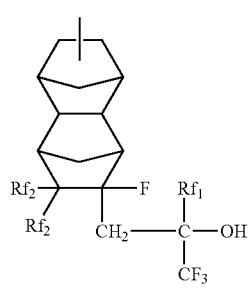 (9-28)
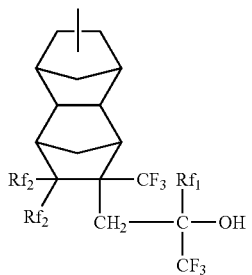 (9-29)
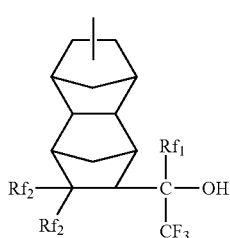 (9-30)
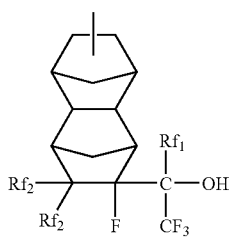 (9-31)
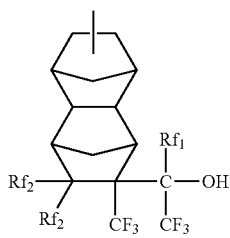 (9-32)
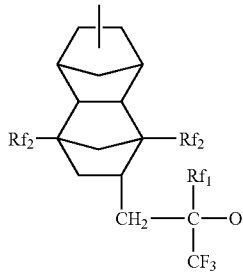 (9-33)
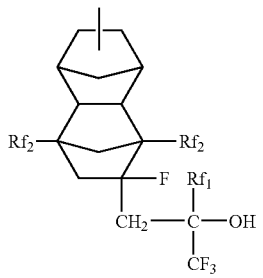 (9-34)

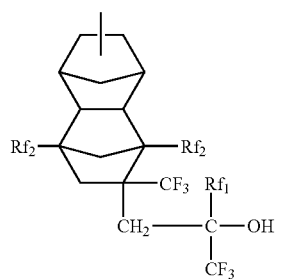
(9-35)
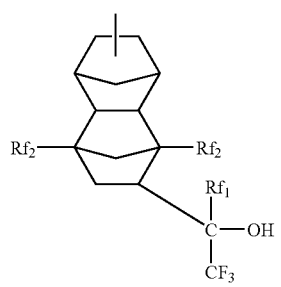
(9-36)
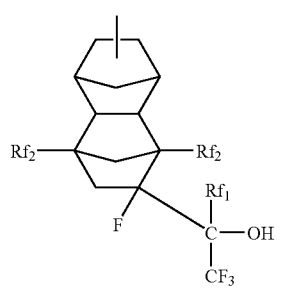
(9-37)
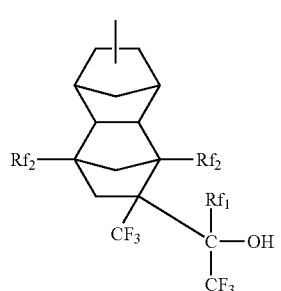
(9-38)
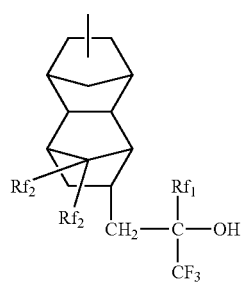
(9-39)
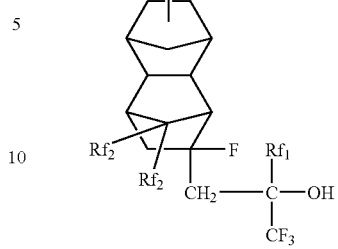
(9-40)
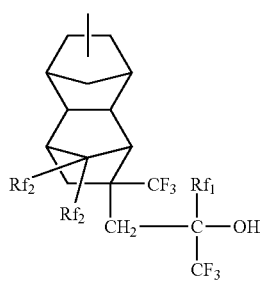
(9-41)
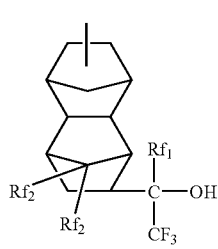
(9-42)
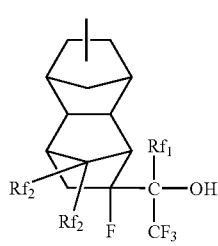
(9-43)
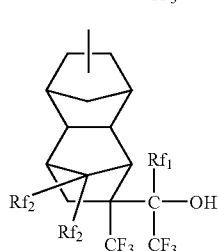
(9-44)
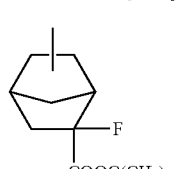
(9-45)
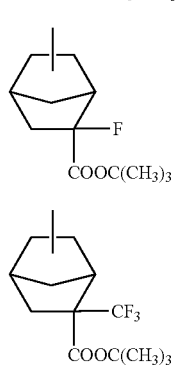
(9-46)

-continued
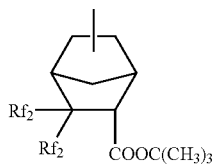 (9-47)
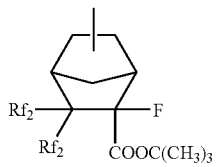 (9-48)
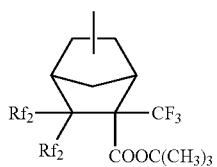 (9-49)
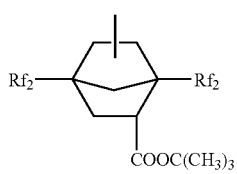 (9-50)
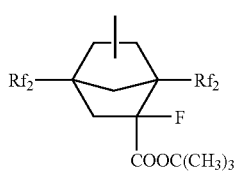 (9-51)
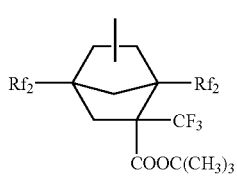 (9-52)
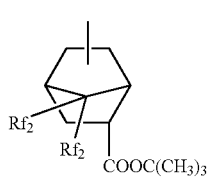 (9-53)
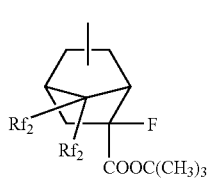 (9-54)
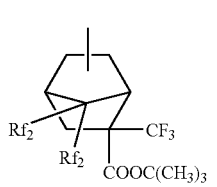 (9-55)
-continued
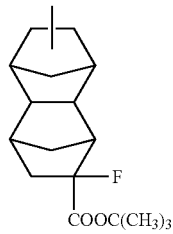 (9-56)
(9-57)
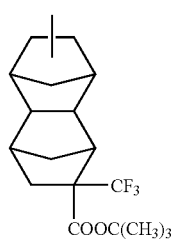 (9-58)
(9-59)
(9-60)
(9-61)

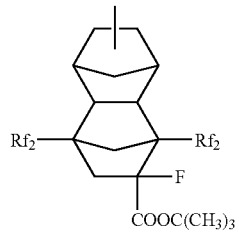 (9-62)
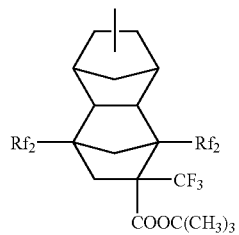 (9-63)
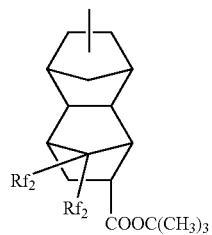 (9-64)
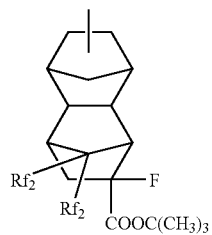 (9-65)
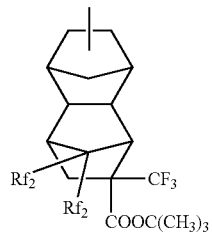 (9-66)
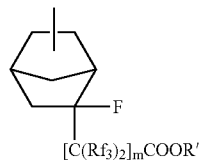 (9-67)
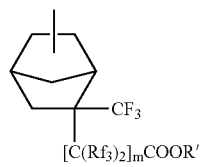 (9-68)
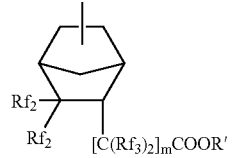 (9-69)
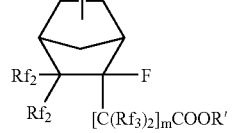 (9-70)
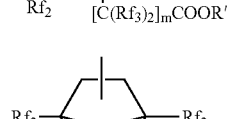 (9-71)
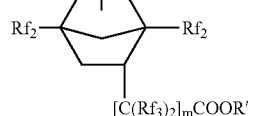 (9-72)
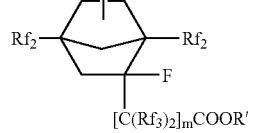 (9-73)
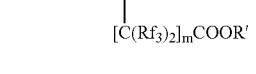 (9-74)
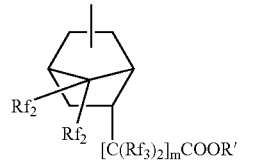 (9-75)
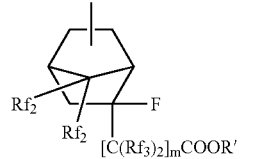 (9-76)
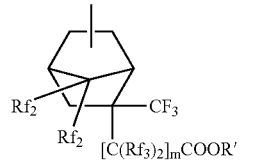 (9-77)

-continued
(9-78)
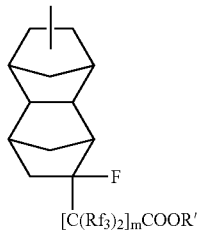
(9-79)
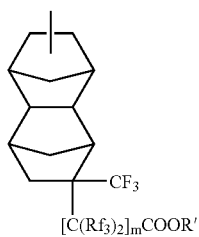
(9-80)
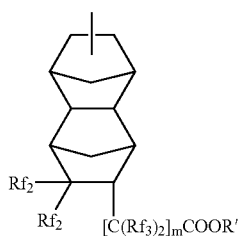
(9-81)
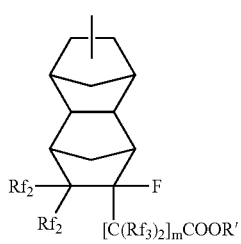
(9-82)
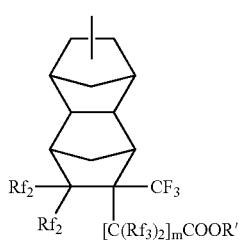
(9-83)
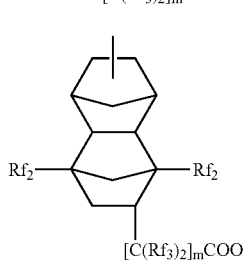
-continued
(9-84)
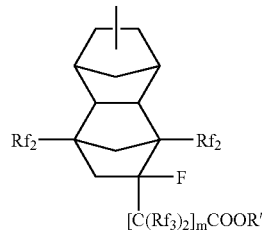
(9-85)
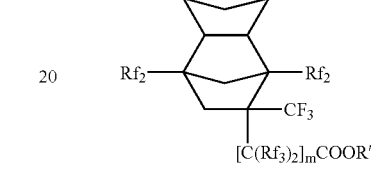
(9-86)
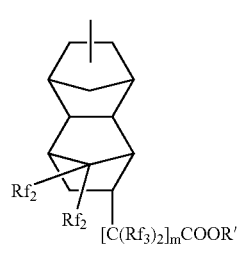
(9-87)
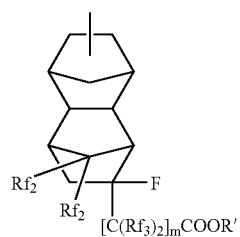
(9-88)
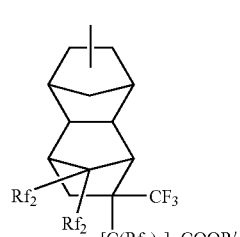
(9-89)
(9-90)
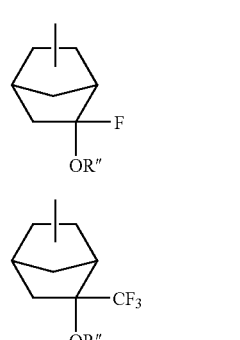

-continued
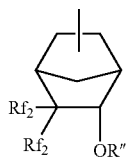 (9-91)
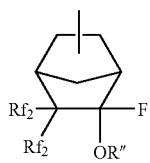 (9-92)
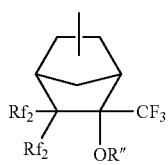 (9-93)
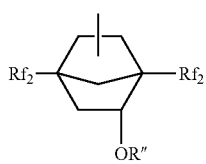 (9-94)
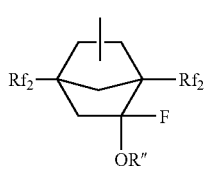 (9-95)
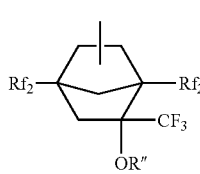 (9-96)
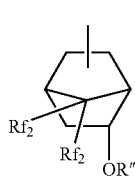 (9-97)
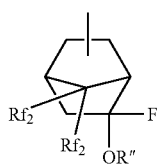 (9-98)
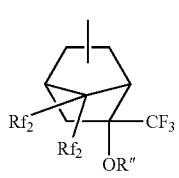 (9-99)
-continued
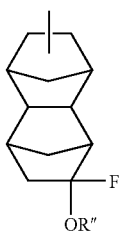 (9-100)
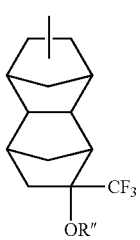 (9-101)
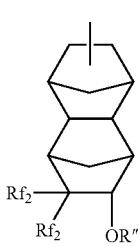 (9-102)
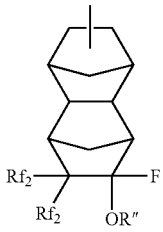 (9-103)
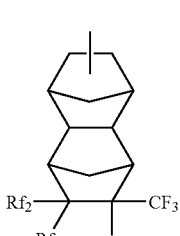 (9-104)
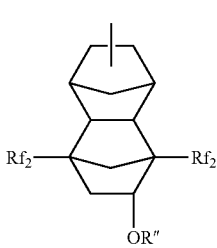 (9-105)

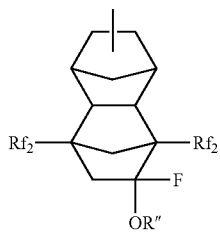
(9-106)
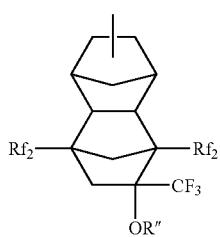
(9-107)
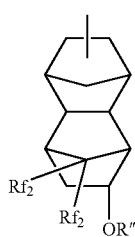
(9-108)
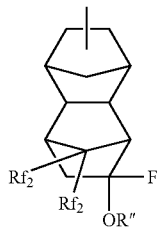
(9-109)
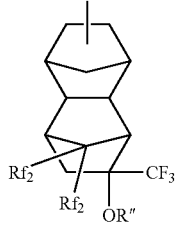
(9-110)
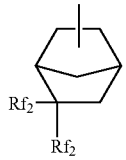
(9-111)
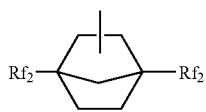
(9-112)
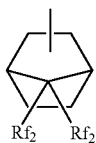
(9-113)
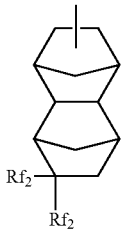
(9-114)
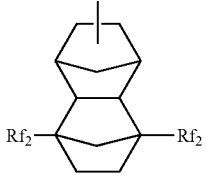
(9-115)
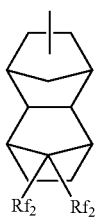
(9-116)
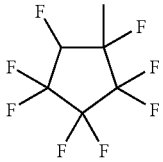
(9-117)
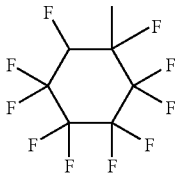
(9-118)
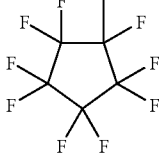
(9-119)
(9-120)

-continued (9-121)

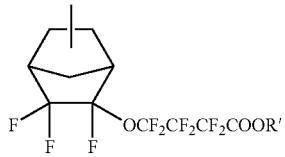

wherein Rf$_1$ represents a hydrogen atom, methyl group, or trifluoromethyl group, Rf$_2$ represents a hydrogen atom, fluorine atom, or trifluoromethyl group, Rf$_3$ represents a hydrogen atom or fluorine atom, m is an integer of 1–5, R' represents a hydrogen atom, methyl group, ethyl group, or t-butyl group, and R" represents a hydrogen atom, hydroxyl group, or acetyl group.

As examples of the condensing component that can produce the structural unit (I), a silane compound (i) of the above formula (10) can be given. As examples of the condensing component that can produce the structural unit (II), a silane compound (ii) of the above formula (10) can be given. All or part of these silane compounds (i) and (ii) may be used individually as a partial condensate.

As examples of the linear, branched, or cyclic alkyl group having 1–10 carbon atoms represented by R$^6$ in the formula (10), a methyl group, ethyl group, n-propyl group, i-propyl group, n-butyl group, i-butyl group, sec-butyl group, t-butyl group, n-pentyl group, n-hexyl group, n-heptyl group, n-octyl group, n-nonyl group, n-decyl group, cyclopentyl group, and cyclohexyl group can be given. As examples of the linear, branched, or cyclic haloalkyl group having 1–10 carbon atoms, a fluoromethyl group, chloromethyl group, bromomethyl group, difluoromethyl group, dichloromethyl group, and trifluoromethyl group can be given.

As R$^6$ in the formula (10), a methyl group, ethyl group, n-propyl group, i-propyl group, n-butyl group, and the like are preferable.

The silane compounds (i) and (ii) can be synthesized, for example, by the following methods.

(1) A method of reacting a halogenated compound formed from any one of the groups of the formula (2)–(7) and a chlorine atom, bromine atom, or iodine atom bonded thereto with a corresponding silane compound by a Grignard reaction (Journal of Polymer Science: Polymer Chemistry Edition, Vol. 11, 509–521 (1973); Journal of Chemical Society of Japan, 1972, 1876–1881).

(2) When R$^1$ or R$^2$ in the silane compound (i) and silane compound (ii) is the group of the above-described formulas (2)–(4) (provided that k is 2 or more and at least one of the 2k R$^4$ groups is a hydrogen atom) or the group of the above-described formulas (5)–(7) (provided that k is 2 or more and at least one of the 2k R$^4$ groups is a hydrogen atom), a method of reacting an olefin compound corresponding to each of these groups with a corresponding hydrosilane compound by a conventional hydrosilylation reaction.

The silane compounds (i) and (ii) may be used either individually or in combination of two or more.

The polysiloxane (1) may contain one or more structural units other than the structural unit (I) or the structural unit (II) (such other structural units are hereinafter referred to as "other structural units"). As examples of condensing components providing the other structural units, a silane compound (iii) and a silane compound (iv) shown in the following formula (11) and a silane compound (v) and a silane compound (vi) shown in the following formula (12) can be given.

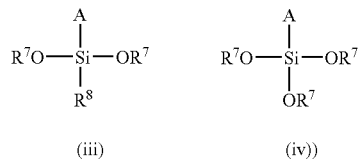

wherein A represents a monovalent organic group having an oxygen atom, R$^7$ individually represents a linear, branched, or cyclic alkyl group having 1–10 carbon atoms or a linear, branched, or cyclic haloalkyl group having 1–10 carbon atoms, and R$^8$ represents a hydrogen atom, a linear, branched, or cyclic alkyl group having 1–20 carbon atoms, or a linear, branched, or cyclic haloalkyl group having 1–20 carbon atoms, or a monovalent aromatic hydrocarbon group having 6–20 carbon atoms.

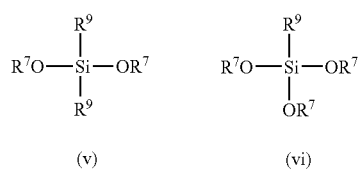

wherein R$^7$ is the same as the R$^7$ in the above formula (11) and R$^9$ represents a hydrogen atom, a hydroxyl group, a halogen atom, a substituted or unsubstituted linear, branched, or cyclic alkyl group having 1–20 carbon atoms (excluding a group having a fluorine atom), a substituted or unsubstituted linear, branched, or cyclic alkoxyl group having 1–20 carbon atoms, a substituted or unsubstituted acetoxy group, or a substituted or unsubstituted aromatic hydrocarbon group having 6–20 carbon atoms (excluding a group having a fluorine atom), provided that R$^9$ does not include the group A in the formula (11).

All or part of these silane compounds (iii) to (vi) may be used individually as a partial condensate.

The silane compounds (iii) to (vi) will be described below.

As examples of the monovalent organic group having an oxygen atom represented by A in the silane compound (iii) or (iv), a monovalent organic group having a carboxyl group, phenolic hydroxyl group, or alcoholic hydroxyl group, a linear or branched C$_{1-20}$ alkyl group having an acid-dissociable group dissociable with an acid to produce preferably a carboxyl group, phenolic hydroxyl group, or alcoholic hydroxyl group, and a monovalent cyclic C$_{4-30}$ hydrocarbon group having the acid-dissociable group can be given. As the monovalent organic group having an oxygen atom represented by A, a group shown by the following formula (13), a group shown by the following formula (14), a monovalent organic group having an acid-dissociable group, and the like are preferable.

—X—OH (13)

—X—COOH (14)

wherein X indicates a methylene group, difluoromethylene group, linear, branched, or cyclic alkylene group having 2–20 carbon atoms, linear or branched fluoroalkylene group having 2–20 carbon atoms, divalent aromatic group having 6–20 carbon atoms (excluding a group having a fluorine atom), or divalent alicyclic group having 3–20 carbon atoms (excluding a group having a fluorine atom).

As examples of the linear, branched, or cyclic alkylene groups having 2–20 carbon atoms represented by X in the formula (13) or formula (14), an ethylene group, trimethylene group, propylene group, and tetramethylene group can be given; as examples of the linear or branched fluoroalkylene group having 2–20 carbon atoms, a tetrafluoroethylene group, hexafluorotrimethylene group, and octafluorotetramethylene group can be given; as examples of the divalent aromatic group having 6–20 carbon atoms, a phenylene group and naphthylene group can be given; and as examples of the divalent alicyclic group having 3–20 carbon atoms, a divalent hydrocarbon group having a norbornane skeleton, tricyclodecane skeleton, or adamantane skeleton can be given.

As the group X in the formula (13) or formula (14), a methylene group, trifluoromethylene group, divalent hydrocarbon group having an adamantane skeleton, divalent hydrocarbon group having a norbornane skeleton, and the like are preferable.

As examples of the monovalent organic group having an acid-dissociable group represented by A in the silane compound (iii) or (iv), groups stable under the reaction conditions for producing the polysiloxane (1) such as a linear or branched $C_{1-20}$ alkyl group having an acid-dissociable group dissociable with an acid to produce preferably a carboxyl group, phenolic hydroxyl group, or alcoholic hydroxyl group and a monovalent $C_{4-30}$ alicyclic hydrocarbon group having the acid-dissociable group can be given.

As the acid-dissociable group in the group A, a group shown by the following formula (15), a group shown by the following formula (16), and the like are preferable.

$$Y—O—R^{10} \quad (15)$$

$$—Y—COO—R^{10} \quad (16)$$

wherein Y indicates a single bond, methylene group, difluoromethylene group, linear, branched, or cyclic alkylene group having 2–20 carbon atoms, linear or branched fluoroalkylene group having 2–20 carbon atoms, divalent aromatic group having 6–20 carbon atoms (excluding a group having a fluorine atom), or divalent alicyclic group having 3–20 carbon atoms (excluding a group having a fluorine atom) and $R^{10}$ is a monovalent organic group dissociable with an acid to produce a hydrogen atom.

As examples of the linear or branched alkylene group having 2–20 carbon atoms, linear or branched fluoroalkylene group having 2–20 carbon atoms, divalent aromatic groups having 6–20 carbon atoms, and other divalent alicyclic groups having 3–20 carbon atoms represented by Y in the formulas (15) and (16), the same groups corresponding to the groups previously given as examples of the group X in the formulas (13) and (14) can be given.

As the group Y in the formula (15) or formula (16), an ethylene group, cyclohexylene group, phenylene group, divalent hydrocarbon group having a norbornane skeleton, and the like are preferable.

As examples of the monovalent organic group dissociable with an acid to produce a hydrogen atom represented by $R^{10}$, the same monovalent organic groups dissociable with an acid to produce a hydrogen atom previously given for the group $R^5$ in the formula (8) can be given.

Of these monovalent organic groups dissociating by the action of an acid to produce hydrogen atoms, the t-butyl group, tetrahydropyranyl group, tetrahydrofuranyl group, methoxymethyl group, ethoxymethyl group, 1-methoxyethyl group, 1-ethoxyethyl group, t-butyldimethylsilyl group, and the like are preferable.

As the group A in the formula (10), 2-t-butoxycarbonylethyl group, 4-t-butoxycarbonylcyclohexyl group, 4-t-butoxycarbonylphenyl group, 4-t-butoxycarbonyl-2,3,5,6-tetrafluorophenyl group, 5-t-butoxycarbonylnorbornyl group, 5-t-butoxycarbonyladamantyl group, and the like are particularly preferable.

As examples of the linear, branched, or cyclic alkyl group having 1–10 carbon atoms and the linear, branched, or cyclic haloalkyl group having 1–10 carbon atoms represented by $R^7$ in the formulas (11) and (12), the groups illustrated for $R^6$ in the formula (10) can be given.

As $R^7$ in the formulas (11) and (12), a methyl group, ethyl group, n-propyl group, i-propyl group, n-butyl group, and the like are preferable. As examples of the linear, branched, or cyclic alkyl group having 1–20 carbon atoms represented by $R^8$, a methyl group, ethyl group, n-propyl group, i-propyl group, n-butyl group, i-butyl group, sec-butyl group, t-butyl group, n-pentyl group, n-hexyl group, n-heptyl group, n-octyl group, n-nonyl group, n-decyl group, cyclopentyl group, and cyclohexyl group can be given. As examples of the linear, branched, or cyclic haloalkyl group having 1–20 carbon atoms, a trifluoromethyl group, pentafluoroethyl group, heptafluoro-n-propyl group, and heptafluoro-i-propyl group can be given. As examples of the monovalent aromatic hydrocarbon group having 6–20 carbon atoms, a phenyl group, α-naphthyl group, β-naphthyl group, benzyl group, and phenethyl group can be given.

As $R^8$ in the formula (11), a methyl group, ethyl group, trifluoromethyl group, pentafluoroethyl group, and the like are preferable.

As examples of the halogen atom represented by $R^9$ in the formula (12), a fluorine atom, chlorine atom, bromine atom, and iodine atom can be given.

As examples of the substituted or unsubstituted linear, branched, or cyclic alkyl group having 1–20 carbon atoms represented by $R^9$, alkyl groups such as a methyl group, ethyl group, n-propyl group, i-propyl group, n-butyl group, 2-methylpropyl group, 1-methylpropyl group, t-butyl group, n-pentyl group, n-hexyl group, n-heptyl group, n-octyl group, n-nonyl group, n-decyl group, cyclopentyl group, and cyclohexyl group; hydroxyalkyl groups such as a trifluoromethyl group, pentafluoroethyl group, hydroxymethyl group, 2-hydroxyethyl group, 3-hydroxypropyl group, 4-hydroxybutyl group, and 4-hydroxycyclohexyl group; alkoxyalkyl groups such as a methoxymethyl group, 2-methoxyethyl group, 3-methoxypropyl group, 4-methoxybutyl group, and 4-methoxycyclohexyl group; acyloxyalkyl groups such as an acetoxymethyl group, 2-acetoxyethyl group, 3-acetoxypropyl group, 4-acetoxybutyl group, and 4-acetoxycyclohexyl group; mercaptoalkyl groups such as a mercaptomethyl group, 2-mercaptoethyl group, 3-mercaptopropyl group, 4-mercaptobutyl group, and 4-mercaptocyclohexyl group; cyanoalkyl groups such as a cyanomethyl group, 2-cyanoethyl group, 3-cyanopropyl group, and 4-cyanohexyl group; and epoxy group-containing alkyl groups such as a 3-glycidoxypropyl group, 2-(3,4-epoxy)cyclohexyl group, and 2-(3,4-epoxy)cyclohexylethyl group; and a 3-morpholinopropyl group can be given.

As examples of the substituted or unsubstituted alkoxyl group having 1–20 carbon atoms represented by $R^9$, amethoxy group, ethoxy group, n-propoxy group, i-propoxy group, n-butoxy group, 2-methylpropoxy group, 1-methylpropoxy group, t-butoxy group, cyclohexyloxy group, fluoromethoxy group, chloromethoxy group, 2-chloroethoxy group, 2-bromoethoxy group, 3-chloropropoxy group, 3-bromopropoxy group, 3-glycidoxypropoxy group, 4-fluorocyclohexyloxy group, and 3,4-epoxycyclohexyloxy group can be given.

As examples of the substituted or unsubstituted acetoxy group represented by $R^9$, an acetoxy group, trifluoroacetoxy group, chloroacetoxy group, and bromoacetoxy group can be given.

As examples of the substituted or unsubstituted aromatic hydrocarbon group having 6–20 carbon atoms represented by $R^9$, a phenyl group, 1-naphthyl group, benzyl group, phenethyl group, 4-chlorophenyl group, 4-bromophenyl group, 2-hydroxyphenyl group, 3-hydroxyphenyl group, 4-hydroxyphenyl group, 2-methoxyphenyl group, 3-methoxyphenyl group, 4-methoxyphenyl group, 2-acetoxyphenyl group, 3-acetoxyphenyl group, 4-acetoxyphenyl group, 2-trimethylsiloxyphenyl group, 3-trimethylsiloxyphenyl group, 4-trimethylsiloxyphenyl group, 4-chlorobenzyl group, 4-bromobenzyl group, 2-hydroxybenzyl group, 3-hydroxybenzyl group, 4-hydroxybenzyl group, 2-methoxybenzyl group, 3-methoxybenzyl group, 4-methoxybenzyl group, 2-acetoxybenzyl group, 3-acetoxybenzyl group, 4-acetoxybenzyl group, 2-trimethylsiloxybenzyl group, 3-trimethylsiloxybenzyl group, 4-trimethylsiloxybenzyl group, perfluorophenethyl group, and 3-(perfluorophenyl)hexafluoro-n-propyl group can be given.

As $R^9$ in the formula (12), a methyl group, ethyl group, trifluoromethyl group, pentafluoroethyl group, and the like are preferable.

These silane compounds (iii)–(vi) may be used either individually or in combination of two or more. In addition, two or more of them from different types may be used in combination. Appropriate selection and suitable combination of these silane compounds can ensure control of the molecular weight and glass transition temperature (Tg) of the resulting polysiloxane (1), whereby transparency at the wavelength of 193 nm or less, particularly preferable at the wavelength of 157 nm, can be further improved.

Furthermore, hexamethyldisiloxane may be added to the reaction mixture of the polycondensation reaction for producing the polysiloxane (1) to control the molecular weight of the resulting polysiloxane and to increase stability.

The amount of hexamethyldisiloxane to be added is usually 500 parts by weight or less, and preferably 50 parts by weight or less, for 100 parts by weight of all of the silane compounds. If the amount of hexamethyldisiloxane exceeds 500 parts by weight, the resulting polymer tends to have a small molecular weight and a low glass transition temperature (Tg).

Process for Producing Polysiloxane (1)

The polysiloxane (1) can be produced by a polycondensation reaction of the silane compound (i) and/or silane compound (ii), optionally together with the silane compounds (iii)–(vi), in a conventional manner in the presence of a catalyst and in the presence or absence of a solvent.

In the polycondensation reaction, an acid catalyst is preferably used. A particularly preferable method comprises a polycondensation reaction in the presence of an acid catalyst (hereinafter referred to as "acidic polycondensation reaction"), followed by a polycondensation reaction in the presence of a base catalyst (hereinafter referred to as "basic polycondensation reaction"). The polysiloxane (1) produced in this manner has a narrow molecular weight distribution and can produce a resist exhibiting excellent resolution and pattern profile.

The process for producing the polysiloxane (1) will now be described.

As the above acid catalyst, an inorganic acid such as hydrochloric acid, sulfuric acid, nitric acid, boric acid, phosphoric acid, titanium tetrachloride, zinc chloride, and aluminum chloride can be used.

An organic acid such as formic acid, acetic acid, n-propionic acid, butyric acid, valeric acid, oxalic acid, malonic acid, succinic acid, maleic acid, fumaric acid, adipic acid, phthalic acid, terephthalic acid, acetic anhydride, maleic anhydride, citric acid, benzenesulfonic acid, p-toluenesulfonic acid, and methanesulfonic acid can also be used as the acid catalyst.

These acid catalysts may be used either individually or in combination of two or more.

As the base catalyst, an inorganic base such as lithium hydroxide, sodium hydroxide, potassium hydroxide, calcium hydroxide, barium hydroxide, sodium hydrogencarbonate, potassium hydrogencarbonate, sodium carbonate, and potassium carbonate can be used.

In addition, the following organic bases can also be used as the base catalyst:

linear, branched, or cyclic monoalkylamines such as n-hexylamine, n-heptylamine, n-octylamine, n-nonylamine, n-decylamine, andcyclohexylamine; linear, branched, or cyclic dialkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; linear, branched, or cyclic trialkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, dicyclohexylmethylamine, and tricyclohexylamine; aromatic amines such as aniline, N-methylaniline, N,N-dimethylaniline, 2-methylaniline, 3-methylaniline, 4-methylaniline, 4-nitroaniline, diphenylamine, triphenylamine, and naphthylamine; diamines such as ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, and 1,3-bis[1-(4-aminophenyl)-1-methylethyl]benzene; imidazoles such as imidazole, benzimidazole, 4-methylimidazole, and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine and 1-(2-hydroxyethyl)piperazine; as well as other nitrogen-containing heterocyclic compounds such as pyrazine, pyrazole, pyridazine, quinoxaline, purine, pyrrolidine, piperidine, morpholine, 4-methylmorpholine, 1,4-dimethylpiperazine, and 1,4-diazabicyclo[2.2.2]octane; and the like.

These base catalysts may be used either individually or in combination of two or more.

Of these acid catalysts and base catalysts, hydrochloric acid, sulfuric acid, acetic acid, oxalic acid, malonic acid, maleic acid, fumaric acid, acetic anhydride, maleic anhydride, triethylamine, tri-n-propylamine, tri-n-butylamine, pyridine, and the like are preferable.

The acid catalyst and base catalyst are usually used in the amount of 0.01–10,000 parts by weight for 100 parts by weight of the silane compound.

As examples of the solvent used in the polycondensation, linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; alcohols such as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, propylene glycol monomethyl ether, propylene glycol monoethyl ether, and propylene glycol mono-n-propyl ether; dialkylene glycol dialkyl ethers such as diethylene glycol dimethyl ether, diethylene glycol diethyl ether, diethylene glycol di-n-propyl ether, and diethylene glycol di-n-butyl ether; ethylene glycol monoalkyl ether acetates such as ethylene glycol monomethyl ether acetate, ethylene glycol monoethyl ether acetate, and ethylene glycol mono-n-propyl ether acetate; aromatic hydrocarbons such as toluene and xylene; other esters such as ethyl 2-hydroxy-2-methylpropionate, ethyl ethoxyacetate, ethyl hydroxyacetate, methyl 2-hydroxy-3-methylbutyrate, butyl 3-methoxyacetate, butyl 3-methyl-3-methoxyacetate, butyl 3-methyl-3-methoxypropionate, butyl 3-methyl-3-methoxybutyrate, ethyl acetate, n-propyl acetate, n-butyl acetate, methyl acetoacetate, ethyl acetoacetate, methyl pyruvate, ethyl pyruvate; N-methylpyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, and propylene carbonate can be given.

The solvent may be used either individually or in combination of two or more.

These solvents are usually used in the amount of 2,000 parts by weight or less for 100 parts by weight of all of the silane compounds.

The polycondensation reaction for producing the polysiloxane (1) can be preferably carried out either in the presence or absence of a solvent, such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, 2-octanone, cyclopentanone, 3-methylcyclopentanone, cyclohexanone, 2-methylcyclohexanone, 2,6-dimethylcyclohexanone, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, and ethylene glycol mono-n-propyl ether acetate.

In addition, water may be added to the reaction mixture of the polycondensation reaction. The amount of water to be added is usually 10,000 parts by weight or less for 100 parts by weight of all of the silane compounds.

The polycondensation reaction is carried out at a temperature of usually −50 to 300° C., and preferably 20 to 100° C., usually for a period of one minute to 100 hours.

When the polysiloxane (1) is formed only from bifunctional structural units such as the structural unit (I) and another structural unit derived from a silane compound (iii) or a silane compound (v), the whole molecular chains have a linear structure. When the polysiloxane (1) is formed only from trifunctional structural units such as the structural unit (II) and another structural unit derived from a silane compound (iv) or a silane compound (vi), a part or the whole molecular chains have a ladder structure.

Although a specific content of each structural unit in the polysiloxane (1) varies according to the types and combination of the structural units, the total of the structural unit (I) and the structural unit (II) is usually 1–99 mol %, preferably 5–95 mol %, and particularly preferably 10–90 mol % of the total amount of the structural units. If the above total amount is less than 1 mol %, transparency at a wavelength of 193 nm or less, particularly 157 nm or less, tends to decrease; if more than 99 mol %, hydrophobicity of the resulting polysiloxane increases, giving rise to a tendency of poor solubility of the resist after exposure in a developing solution.

The amount of the other structural units is usually 99 mol % or less, and preferably 95 mol % or less of the total amount of all structural units.

The total amount of the structural units having an acid-dissociable group is usually 1–99 mol %, preferably 5–95 mol %, and particularly preferably 10–90 mol %. If this total amount is less than 1 mol %, solubility in a developing solution of resist after exposure tends to decrease; if more than 99 mol %, adhesion of the resist to a substrate tends to be insufficient.

The polystyrene-reduced weight average molecular weight (Mw) of the polysiloxane (1) determined by gel permeation chromatography (GPC) is 500–1,000,000, preferably 500–500,000, and particularly preferably 1,000–100,000. If the Mw of the polysiloxane (1) is less than 500, the glass transition temperature (Tg) of the resulting polymer tends to decrease. If the Mw exceeds 1,000,000, solubility of the polymer in solvents tends to decrease.

The ratio (Mw/Mn) of Mw to the polystyrene-reduced number average molecular weight (Mn) determined by gel permeation chromatography (GPC) of the polysiloxane (1) is preferably 1.5 or less, more preferably 1.3 or less, and particularly preferably 1.2 or less.

The glass transition temperature (Tg) of polysiloxane (1) is usually from −50 to 500° C., and preferably from 0 to 300° C. If the glass transition temperature (Tg) of polysiloxane (1) is less than −50° C., pattern formation using the resulting radiation sensitive resin composition tends to be difficult. If more than 500° C., solubility of the polymer in solvents tends to decrease.

Radiation Sensitive Resin Composition

The radiation sensitive resin composition comprises (A) the polysiloxane (1) and (B) a photoacid generator as essential components.

The polysiloxane (1) can be used either individually or in combination of two or more in the radiation sensitive resin composition of the present invention.

One or more other polysiloxanes can be used in combination with the polysiloxane (1) in the radiation sensitive resin composition of the present invention. The polysiloxane (1) and the other polysiloxanes may be referred to collectively as "polysiloxane (A)" from time to time in the following description.

As examples of the other polysiloxanes, polysiloxanes obtained by polycondensation of the above silane compounds (iii) to (vi) can be given.

In this instance, the proportion of the other polysiloxanes used is usually 50 wt % or less, and preferably 20 wt % or less of the total amount of the polysiloxane (1) and other polysiloxanes.

<Acid Generator (B)>

The acid generator (hereinafter referred to as "acid generator (B)") used in the radiation sensitive resin composition of the present invention is a component generating an acid by exposure to radiation. The acid causes an acid-dissociable group in the polysiloxane (A) to dissociate. As a result, an exposed part of the resist film becomes readily soluble in an alkaline developer, thereby forming a positive-tone resist pattern.

The action of the photoacid generator (B) in the present invention is not specifically limited to the above action. As a preferable acid generator (B), an acid generator containing a compound (hereinafter referred to as "an acid generator (B1)") that generates trifluoromethane sulfonic acid or an acid of the following formula (17) (hereinafter collectively referred to as "acid (I)") upon exposure can be given.

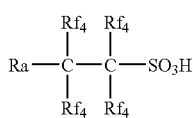
(17)

wherein $Rf_4$ individually represents a fluorine atom or trifluoromethyl group, Ra represents a hydrogen atom, fluorine atom, linear or branched alkyl group having 1–20 carbon atoms, linear or branched fluoroalkyl group having 1–20 carbon atoms, substituted or unsubstituted monovalent cyclic hydrocarbon group having 3–20 carbon atoms, or substituted or unsubstituted monovalent cyclic fluoro-hydrocarbon group having 3–20 carbon atoms.

As examples of the acid generator (B1), onium salts, sulfone compounds, sulfonic acid compounds, carboxylic acid compounds, diazoketone compounds, and halogen-containing compounds can be given.

Although an acid generator (B1) alone can be used as the acid generator (B), the acid generator (B1) can be used in combination with a compound (hereinafter referred to as "photoacid generator (B2)") generating an acid of the following formula (18) ("acid (II-1)"), an acid of the following formula (19) ("acid (II-2)"), or an acid of the following formula (20) ("acid (II-3)"):

(18)

(19)

(20)

in the formula (18), $Rf_4$ represents a fluorine atom or trifluoromethyl group, $Rf_5$ represents a hydrogen atom, fluorine atom, methyl group, or trifluoromethyl group, Rb represents a hydrogen atom, a linear or branched alkyl group having 1–20 carbon atoms, a substituted or unsubstituted monovalent cyclic hydrocarbon group having 3–20 carbon atoms, or a substituted or unsubstituted monovalent cyclic fluoro-hydrocarbon group having 3–20 carbon atoms, in the formula (19), Rs represents a linear or branched alkyl group having 1–20 carbon atoms or a substituted or unsubstituted monovalent cyclic hydrocarbon group having 3–20 carbon atoms, and in the formula (20), Rc represents a linear or branched alkyl group having 1–20 carbon atoms, or a linear or branched fluoroalkyl group having 1–20 carbon atoms, a substituted or unsubstituted monovalent cyclic hydrocarbon group having 3–20 carbon atoms, or a substituted or unsubstituted monovalent cyclic fluoro-hydrocarbon group having 3–20 carbon atoms.

As specific examples of the linear or branched alkyl group having 1–20 carbon atoms represented by Ra, Rb, Rs, or Rc in the formulas (17) to (20), a methyl group, ethyl group, n-propyl group, i-propyl group, n-butyl group, i-butyl group, sec-butyl group, t-butyl group, n-pentyl group, n-hexyl group, n-heptyl group, and n-octyl group can be given.

As specific examples of the linear or branched fluoroalkyl group having 1–20 carbon atoms represented by Ra or Rc, a trifluoromethyl group, pentafluoroethyl group, heptafluoro-n-propyl group, heptafluoro-i-propyl group, nonafluoro-n-butyl group, nonafluoro-i-butyl group, nonafluoro-sec-butyl group, nonafluoro-t-butyl group, perfluoro-n-pentyl group, perfluoro-n-hexyl group, perfluoro-n-heptyl group, and perfluoro-n-octyl group can be given.

As examples of the monovalent cyclic hydrocarbon group having 3–20 carbon atoms, the monovalent cyclic fluoro-hydrocarbon group having 3–20 carbon atoms, or their substituted derivatives represented by Ra, Rb, Rs, or Rc groups of the following formulas (21)–(27) can be given.

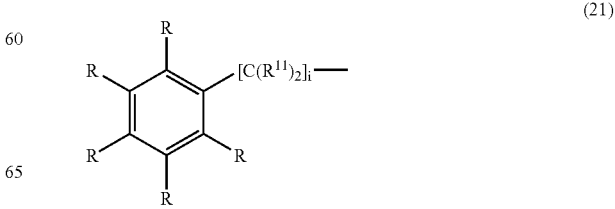
(21)

-continued

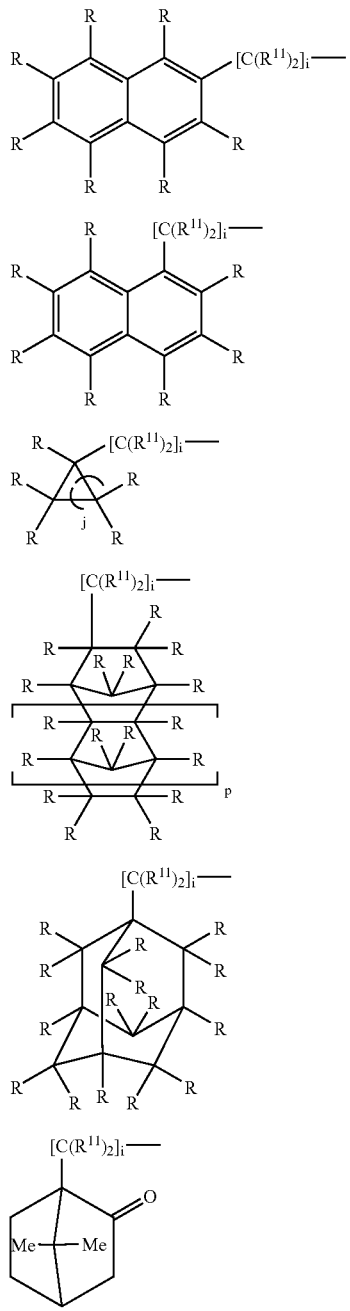

(Meはメチル基。以下同様。)

wherein Me indicates a methyl group (hereinafter the same).

In the formulas (21)–(27), R individually represents a hydrogen atom, halogen atom, hydroxyl group, acetyl group, carboxyl group, nitro group, cyano group, primary amino group, secondary amino group, linear or branched alkoxyl group having 1–10 carbon atoms, linear or branched alkyl group having 1–10 carbon atoms, or linear or branched fluoroalkyl group having 1–10 carbon atoms, $R^{11}$ individually represents a hydrogen atom, halogen atom, linear or branched alkyl group having 1–10 carbon atoms, or a linear or branched fluoroalkyl group having 1–10 carbon atoms, and i is an integer of 0 to 10; in the formula (24), j is an integer of 1–18; and in the formula (25), p is an integer of 0–3.

Preferable examples of the acid (I) include: trifluoromethanesulfonic acid, pentafluoroethanesulfonic acid, heptafluoro-n-propanesulfonic acid, nonafluoro-n-butanesulfonic acid, perfluoro-n-octanesulfonic acid, 1,1,2,2,-tetrafluoro-n-propanesulfonic acid, 1,1,2,2,-tetrafluoro-n-butanesulfonic acid, and 1,1,2,2-tetrafluoro-n-octanesulfonic acid, as well as acids produced by bonding a group —$CF_2CF_2SO_3H$, —$CF_2CF(CF_3)SO_3H$, —$CF(CF_3)CF_2SO_3H$, —$CF(CF_3)CF(CF_3)SO_3H$, —$C(CF_3)_3CF_2SO_3H$, or —$CF_2C(CF_3)_2SO_3H$ to the bonding site of the group of any of the formulas (21)–(27), for example, the acids of the following formula (17-1) to (17-10):

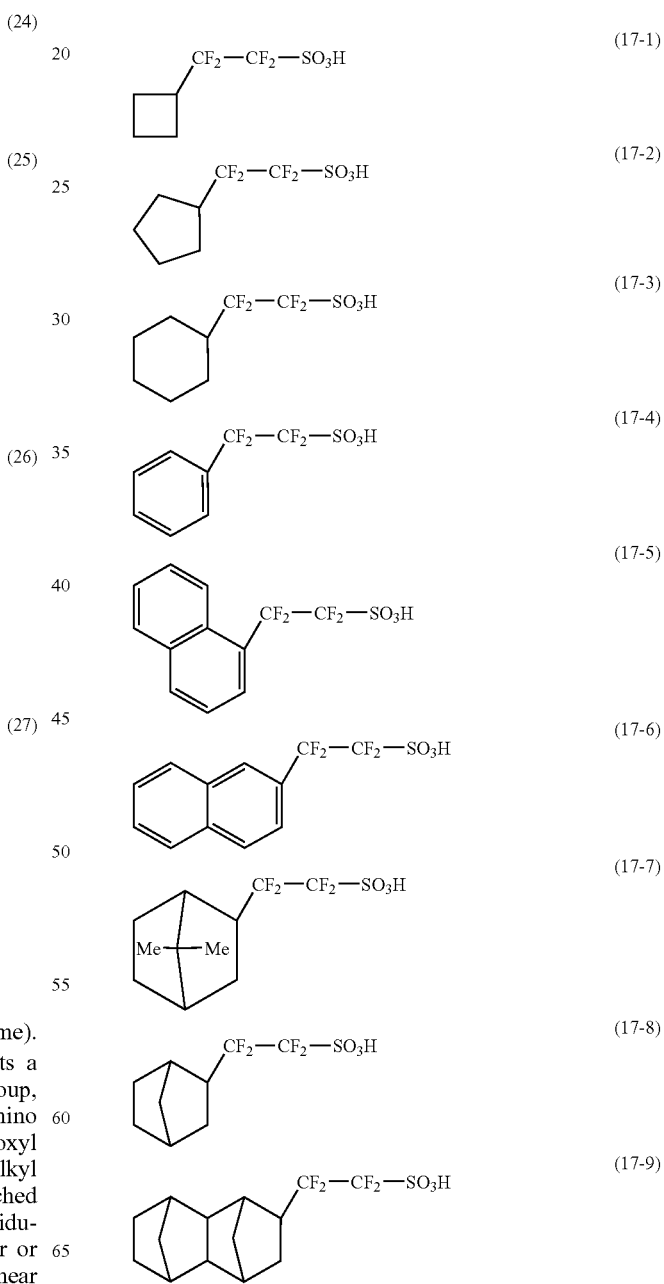

(17-10)

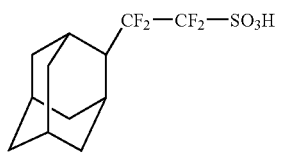

Preferable examples of the acid (II-1) include: 1-fluoroethanesulfonic acid, 1-fluoro-n-propanesulfonic acid, 1-fluoro-n-butanesulfonic acid, 1-fluoro-n-octanesulfonic acid, 1,1-difluoroethanesulfonic acid, 1,1-difluoro-n-propanesulfonic acid, 1,1-difluoro-n-butanesulfonic acid, 1,1-difluoro-n-octanesulfonic acid, 1-trifluoromethyl-n-propanesulfonic acid, 1-trifluoromethyl-n-butanesulfonic acid, 1-trifluoromethyl-n-octanesulfonic acid, 1,1-bis(trifluoromethyl)ethanesulfonic acid, 1,1-bis(trifluoromethyl)-n-propanesulfonic acid, 1,1-bis(trifluoromethyl)-n-butanesulfonic acid, and 1,1-bis(trifluoromethyl)-n-octanesulfonic acid; as well as acids produced by bonding a group —CF$_2$SO$_3$H, —CHFSO$_3$H, —CH(CF$_3$)SO$_3$H, or —C(CF$_3$)$_2$SO$_3$H to the bonding site of the group of any of the formulas (21)–(27), for example, the acids of the following formula (18-1) to (18-40):

(18-1)
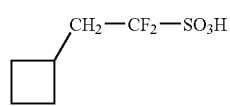

(18-2)
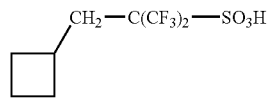

(18-3)
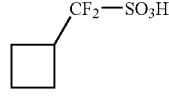

(18-4)
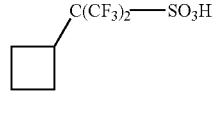

(18-5)
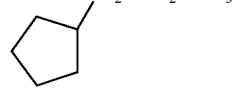

(18-6)
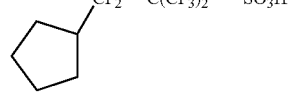

(18-7)
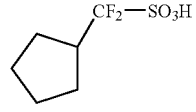

(18-8)
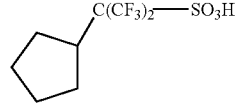

(18-9)
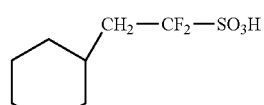

(18-10)
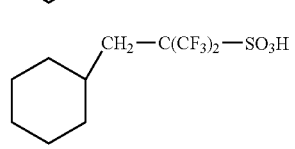

(18-11)
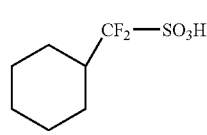

(18-12)
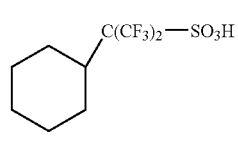

(18-13)
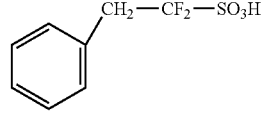

(18-14)
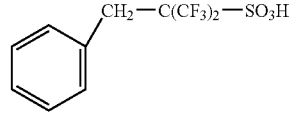

(18-15)
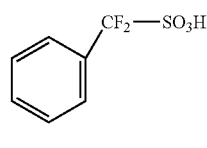

(18-16)
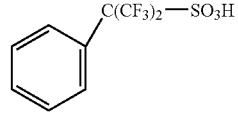

(18-17)
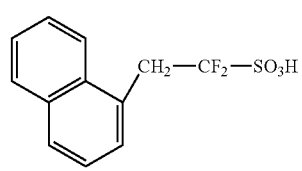

(18-18)
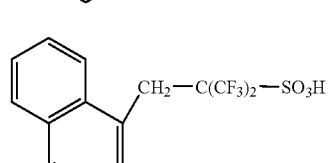

(18-19)
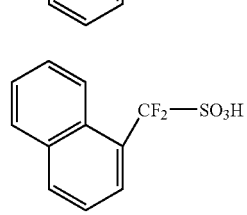

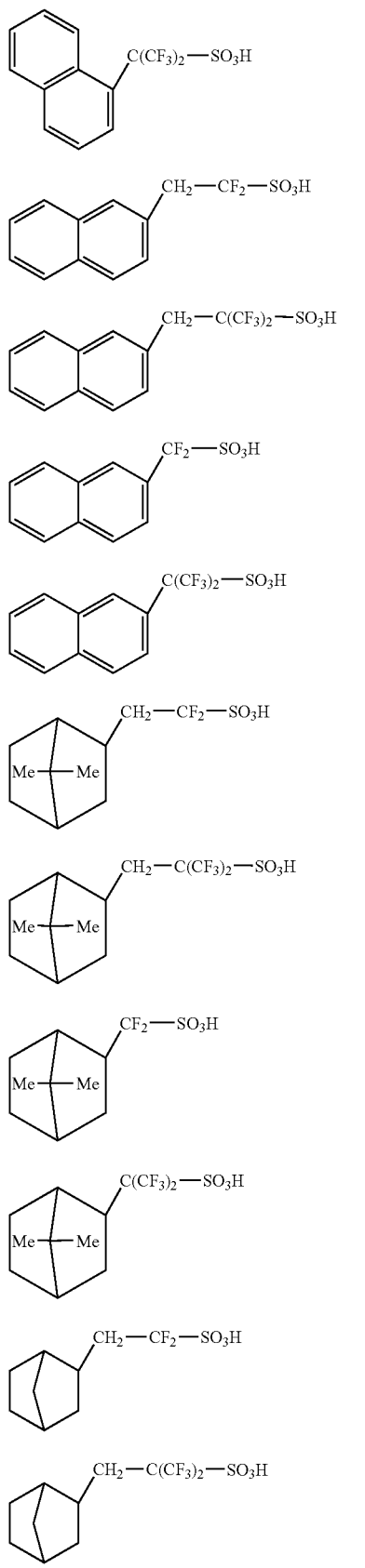
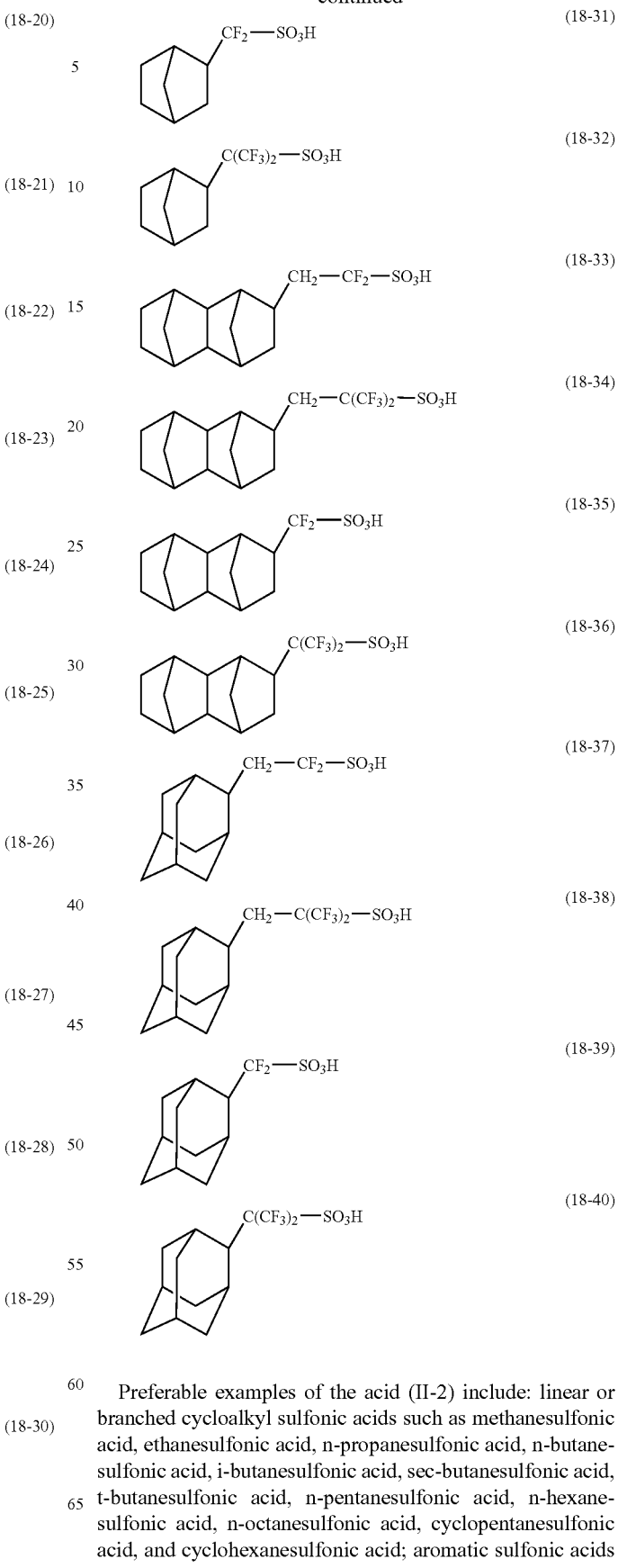

Preferable examples of the acid (II-2) include: linear or branched cycloalkyl sulfonic acids such as methanesulfonic acid, ethanesulfonic acid, n-propanesulfonic acid, n-butanesulfonic acid, i-butanesulfonic acid, sec-butanesulfonic acid, t-butanesulfonic acid, n-pentanesulfonic acid, n-hexanesulfonic acid, n-octanesulfonic acid, cyclopentanesulfonic acid, and cyclohexanesulfonic acid; aromatic sulfonic acids such as benzenesulfonic acid, p-toluenesulfonic acid, benzylsulfonic acid, α-naphthalenesulfonic acid, and β-naphthalenesulfonic acid; 10-camphorsulfonic acid; and acids produced by bonding a group —SO₃H to the bonding site of the group of any of the formulas (21)–(27).

The following acids can be given as preferable examples of the acids (II-3) in the present invention: acetic acid, n-propionic acid, butyric acid, isobutyric acid, valeric acid, isovaleric acid, caproic acid, benzoic acid, salicylic acid, phthalic acid, terephthalic acid, α-naphthalenecarboxylic acid, β-naphthalenecarboxylic acid, cyclobutanecarboxylic acid, cyclopentanecarboxylic acid, cyclohexanecarboxylic acid, 1,1-cyclobutanedicarboxylic acid, 1,2-cyclobutanedicarboxylic acid, 1,1-cyclopentanedicarboxylic acid, 1,2-cyclopentanedicarboxylic acid, 1,3-cyclopentanedicarboxylic acid, 1,1-cyclohexanedicarboxylic acid, 1,2-cyclohexanedicarboxylic acid, 1,3-cyclohexanedicarboxylic acid, 1,4-cyclohexanedicarboxylic acid, 2-norbornanecarboxylic acid, 2,3-norbornanedicarboxylic acid, norbornyl-2-acetic acid, 1-adamantanecarboxylic acid, 1-adamantaneacetic acid, 1,3-adamantanedicarboxylic acid, 1,3-adamantanediacetic acid, lithocholic acid, deoxycholic acid, chenodeoxycholic acid, and cholic acid, as well as acids produced by bonding a group —COOH to the bonding site of the group of any of the formulas (21)–(27).

As examples of the onium salt compound generating the acid (I), acid (II-1), acid (II-2), or acid (II-3), diphenyliodonium salt, bis(4-t-butylphenyl)iodonium salt, triphenylsulfonium salt, 4-hydroxyphenyl.phenyl.methylsulfonium salt, cyclohexyl.2-oxocyclohexyl.methylsulfonium salt, dicyclohexyl.2-oxocyclohexylsulfonium salt, 2-oxocyclohexyldimethylsulfonium salt, 4-hydroxyphenyl.benzyl.methylsulfonium salt, 1-naphthyldimethylsulfonium salt, 1-naphthyldiethylsulfonium salt, 4-cyano-1-naphthyldimethylsulfonium salt, 4-cyano-1-naphthyldiethylsulfonium salt, 4-nitro-1-naphthyldimethylsulfonium salt, 4-nitro-1-naphthyldiethylsulfonium salt, 4-methyl-1-naphthyldimethylsulfonium salt, 4-methyl-1-naphthyldiethylsulfonium salt, 4-hydroxy-1-naphthyldimethylsulfonium salt, 4-hydroxy-1-naphthyldiethylsulfonium salt, 1-[1-(4-hydroxynaphthyl)]tetrahydrothiophenium salt, 1-[1-(4-methoxynaphthyl)]tetrahydrothiophenium salt, 1-[1-(4-ethoxynaphthyl)]tetrahydrothiophenium salt, 1-[1-(4-n-butoxynaphthyl)]tetrahydrothiophenium salt, 1-[1-(4-methoxymethoxynaphthyl)]tetrahydrothiophenium salt, 1-[1-(4-ethoxymethoxynaphthyl)]tetrahydrothiophenium salt, 1-[1-{4-(1-methoxyethoxy)naphthyl}]tetrahydrothiophenium salt, 1-[1-{4-(2-methoxyethoxy)naphthyl}]tetrahydrothiophenium salt, 1-[1-(4-methoxycarbonyloxynaphthyl)]tetrahydrothiophenium salt, 1-[1-(4-ethoxycarbonyloxynaphthyl)]tetrahydrothiophenium salt, 1-[1-(4-n-propoxycarbonyloxynaphthyl)]tetrahydrothiophenium salt, 1-[1-(4-i-propoxycarbonyloxynaphthyl)]tetrahydrothiophenium salt, 1-[1-(4-n-butoxycarbonyloxynaphthyl)]tetrahydrothiophenium salt, 1-[1-(4-t-butoxycarbonyloxynaphthyl)]tetrahydrothiophenium salt, 1-[1-{4-(2-tetrahydrofuranyloxy)naphthyl}]-tetrahydrothiophenium salt, 1-[1-{4-(2-tetrahydropyranyloxy)naphthyl}]-tetrahydrothiophenium salt, 1-[1-(4-benzyloxynaphthyl)]tetrahydrothiophenium salt, and 1-[1-(1-naphthylacetomethyl)]tetrahydrothiophenium salt can be given.

As examples of sulfone compounds generating the acid (I), acid (II-1), or acid (II-2), β-ketosulfone and β-sulfonylsulfone, and α-diazo compounds of these compounds can be given.

As examples of the sulfonic acid compound generating the acid (I), acid (II-1), or acid (II-2), sulfonic acid esters, sulfonic acid imides, aryl sulfonic acid esters, and imino sulfonates can be given.

As examples of carboxylic acid compounds generating the acid (II-3), carboxylic acid ester, carboxylic acid imide, and carboxylic acid cyanate can be given. As examples of diazoketone compounds generating the acid (I), acid (II-1), acid (II-2), or acid (II-3), 1,3-diketo-2-diazo compounds, diazobenzoquinone compounds, and diazonaphthoquinone compounds can be given.

As examples of halogen-containing compounds generating the acid (I), acid (II-1), acid (II-2), or acid (II-3), haloalkyl group-containing hydrocarbon compounds, and haloalkyl group-containing heterocyclic compounds can be given.

In addition, as examples of the photoacid generator (B) other than the acid generator (B1) and the acid generator (B2) (hereinafter referred to as "the other acid generator"), the other onium compounds such as diphenyliodonium pyrenesulfonate, diphenyliodonium n-dodecylbenzenesulfonate, diphenyliodonium hexafluoroantimonate, bis(4-t-butylphenyl)iodonium n-dodecylbenzenesulfonate, bis(4-t-butylphenyl)iodonium hexafluoroantimonate, bis(4-t-butylphenyl)iodonium naphthalenesulfonate, triphenylsulfonium hexafluoroantimonite, triphenylsulfonium naphthalenesulfonate, triphenylsulfonium 10-camphorsulfonate, 4-hydroxyphenyl.phenyl.methylsulfonium p-toluenesulfonate, and 4-hydroxyphenyl.benzyl.methylsulfonium p-toluenesulfonate; sulfone compounds such as 4-trisphenacylsulfone, mesitylphenacylsulfone, and bis(phenylsulfonyl)methane; sulfonic acid compounds such as benzointosylate and nitrobenzyl-9,10-diethoxyanthracene-2-sulfonate; diazoketone compounds such as 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, and 1,2-naphthoquinonediazido-4-sulfonate or 1,2-naphthoquinonediazido-5-sulfonate of 1,1,1-tris(4-hydroxyphenyl)ethane; and other halogen-containing compounds such as (trichloromethyl)-s-triazine derivatives such as phenylbis(trichloromethyl)-s-triazine, 4-methoxyphenylbis(trichloromethyl)-s-triazine, and 1-naphthylbis(trichloromethyl)-s-triazine, and 1,1-bis(4-chlorophenyl)-2,2,2-trichloroethane can be given.

In the present invention, although the other acid generator can be used alone as the acid generator (B), combined use of the other acid generator with the acid generator (B1) or further with the acid generator (B2) is also preferable.

In the present invention, the acid generator (B) may be used either individually or in combination of two or more.

The amount of the acid generator (B) to be used in the present invention is usually 0.1–10 parts by weight, and preferably 0.5–7 parts by weight for 100 parts by weight of the polysiloxane (A) from the viewpoint of ensuring sensitivity and developability as a resist. If the amount of the acid generator (B) is less than 0.1 part by weight, sensitivity and developability of the resulting resist may be decreased. If the amount exceeds 10 parts by weight, it may be difficult to obtain a rectangular resist pattern due to a decrease in transparency to radiation.

<Dissolution Controller>

The radiation sensitive resin composition of the present invention may further comprise at least one dissolution controller selected from the group consisting of a compound of the following formula (C1) (hereinafter referred to as "dissolution controller (C1)") and a compound of the following formula (C2) (hereinafter referred to as "dissolution controller (C2)").

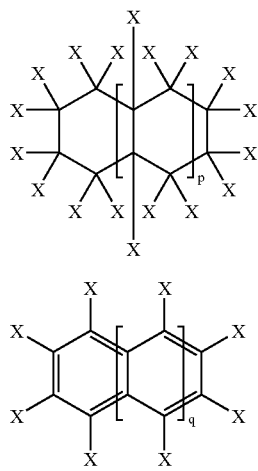

wherein X individually represents a hydrogen atom, fluorine atom, linear or branched alkyl group having 1–10 carbon atoms, or linear or branched fluoroalkyl group having 1–10 carbon atoms, or a group of the following formula (c),

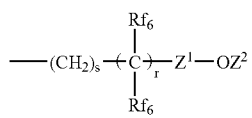

wherein $Rf_6$ individually represents a hydrogen atom, methyl group, or trifluoromethyl group, $Z^1$ is a single bond, methylene group, cyclohexylene group, or phenylene group, $Z^2$ represents a hydrogen atom or a monovalent organic group dissociating with a hydrogen atom or an acid to produce a hydrogen atom, s is an integer of 0 to 3, and r is 0 or 1, provided that at least one of the groups X is the group of the formula (c), and p and q are individually an integer from 0 to 2.

Inclusion of at least one compound selected from the group consisting of the dissolution controllers (C1) and dissolution controllers (C2) ensures that the resist made from the radiation sensitive resin composition of the present invention appropriately controls the dissolution contrast and the rate of dissolution.

As examples of the linear or branched alkyl group having 1–10 carbon atoms represented by X in the formula (C1) and (C2), a methyl group, ethyl group, n-propyl group, i-propyl group, n-butyl group, i-butyl group, sec-butyl group, t-butyl group, n-pentyl group, n-hexyl group, n-heptyl group, n-octyl group, n-nonyl group, and n-decyl group can be given.

As examples of the linear or branched fluoroalkyl group having 1–10 carbon atoms represented by X, a fluoromethyl group, difluoromethyl group, trifluoromethyl group, pentafluoroethyl group, heptafluoro-n-propyl group, heptafluoro-i-propyl group, nonafluoro-n-butyl group, perfluoro-n-pentyl group, perfluoro-n-hexyl group, perfluoro-n-heptyl group, perfluoro-n-octyl group, perfluoro-n-nonyl group, and perfluoro-n-decyl group can be given.

The two bonding sites in the cyclohexylene group and phenylene group represented by $Z^1$ in the group of the above formula (c) (hereinafter referred to as "functional group (c)") showing the group X may be 1,2-, 1,3-, or 1,4- positions.

As examples of the monovalent organic group dissociable with an acid to produce hydrogen atoms represented by $Z^2$, organocarbonyl groups such as a t-butoxycarbonyl group, methoxycarbonyl group, ethoxycarbonyl group, i-propoxycarbonyl group, 9-fluorenylmethylcarbonyl group, 2,2,2-trichloroethylcarbonyl group, 2-(trimethylsilyl)ethylcarbonyl group, i-butylcarbonyl group, vinylcarbonyl group, allylcarbonyl group, benzylcarbonyl group, 4-ethoxy-1-naphthylcarbonyl group, and methyldithiocarbonyl group; organic groups bonding to the oxygen atom in the formula (c) to form an acetal structure such as a methoxymethyl group, methylthiomethyl group, ethoxymethyl group, ethylthiomethyl group, t-butoxymethyl group, t-butylthiomethyl group, (phenyldimethylsilyl)methoxymethyl group, benzyloxymethyl group, t-butoxymethyl group, siloxymethyl group, 2-methoxyethoxymethyl group, 2,2,2-trichloroethoxymethyl group, bis(2-chloroethoxy)methyl group, 2-(trimethylsilyl)ethoxymethyl group, 1-methoxycyclohexyl group, tetrahydropyranyl group, 4-methoxytetrahydropyranyl group, tetrahydrofuranyl group, tetrahydrothiopyranyl group, tetrahydrothiofuranyl group, 1-methoxyethyl group, 1-ethoxyethyl group, 1-(2-chloroethoxy)ethyl group, 1-methyl-1-methoxyethyl group, 1-methyl-1-benzyloxyethyl group, 1-(chloroethoxy)ethyl group, 1-methyl-1-benzyloxy-2-fluoroethyl group, 2,2,2-trichloroethyl group, 2-trimethylsilylethyl group, and 2-(phenylselenyl)ethyl group; alkylsilyl groups such as a trimethylsilyl group, triethylsilyl group, tri-i-propylsilyl group, dimethyl-i-propylsilyl group, dimethylethylsilyl group, t-butyldimethylsilyl group, t-butyldiphenylsilyl group, tribenzylsilyl group, tri-p-xylylsilyl group, triphenylsilyl group, diphenylmethylsilyl group, and t-butylmethoxyphenylsilyl group; and alkyl-substituted alicyclic group such as 2-methyl-2-adamantyl group, 2-ethyl-2-adamantyl group, 2-methyl-2-norbornyl group, 2-ethyl-2-norbornyl group, 1-methylcyclopentyl group, 1-ethylcyclopentyl group, 1-methylcyclohexyl group, and 1-ethylcyclohexyl group can be given.

Of these monovalent organic groups dissociable with an acid to produce hydrogen atoms, t-butoxycarbonyl group, methoxymethyl group, ethoxymethyl group, 1-methoxyethyl group, 1-ethoxyethyl group, and the like are preferable.

As preferable examples of the compound (C1), compounds shown by the following formulas (C1-1) to (C1-4) can be given:

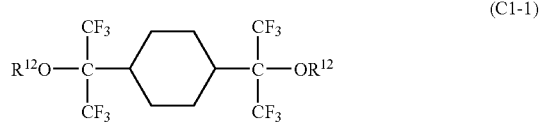

-continued

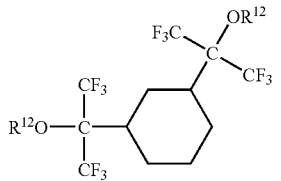 (C1-2)

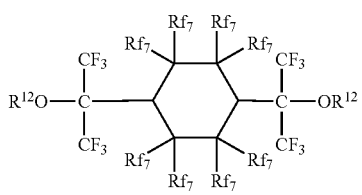 (C1-3)

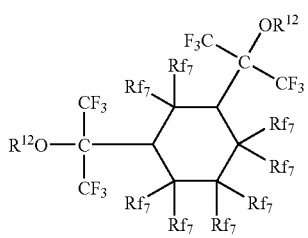 (C1-4)

wherein $R^{12}$ individually represents a hydrogen atom, t-butoxycarbonyl group, methoxymethyl group, ethoxymethyl group, 1-methoxyethyl group, or 1-ethoxyethyl group and $Rf_7$ individually represents a hydrogen atom, fluorine atom, or trifluoromethyl group, provided that eight $Rf_7$ groups in the formula (C1-3) or (C1-4) cannot be a hydrogen atom at the same time.

As preferable examples of the compound (C2), compounds shown by the following formulas (C2-1) to (C2-5) can be given:

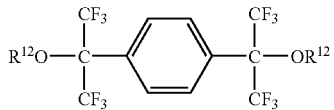 (C2-1)

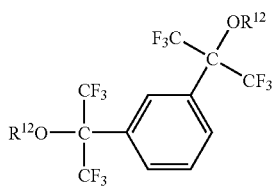 (C2-2)

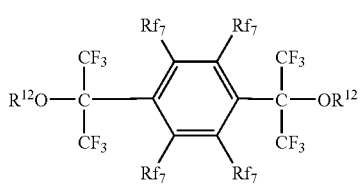 (C2-3)

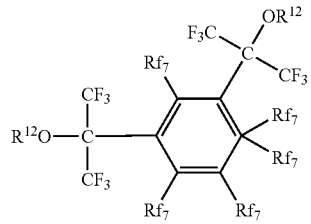 (C2-4)

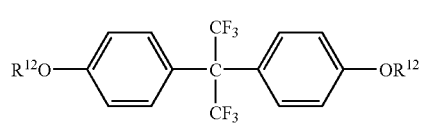 (C2-5)

wherein $R^{12}$ individually represents a hydrogen atom, t-butoxycarbonyl group, methoxymethyl group, ethoxymethyl group, 1-methoxyethyl group, or 1-ethoxyethyl group and $Rf_7$ individually represents a hydrogen atom, fluorine atom, or trifluoromethyl group, provided that four $Rf_7$ groups in the formula (C2-3) or (C2-4) cannot be a hydrogen atom at the same time.

In the dissolution controller (C), as the dissolution controller (C1), the compounds of the following formula (C1-1-1), formula (C1-1-2), formula (C1-2-1), and formula (C1-2-2), for example, are more preferable. As the dissolution controller (C2), the compounds of the following formula (C2-1-1), formula (C2-1-2), formula (C2-2-1), and formula (C2-5-1), for example, are more preferable.

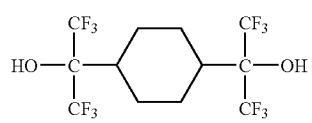 (C1-1-1)

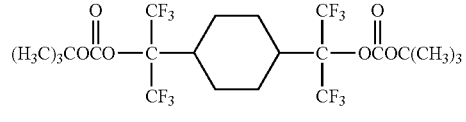 (C1-1-2)

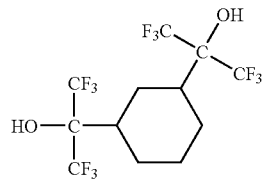 (C1-2-1)

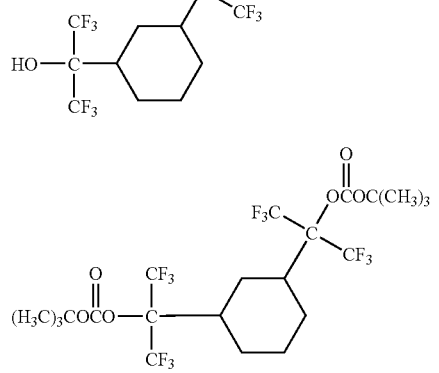 (C1-2-2)

-continued

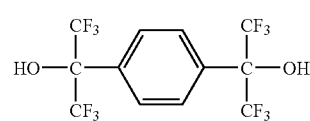
(C2-1-1)

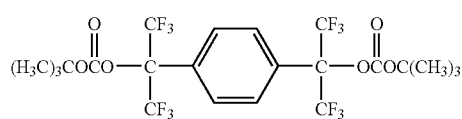
(C2-1-2)

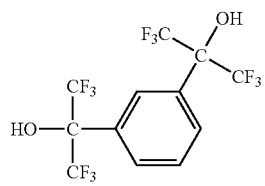
(C2-2-1)

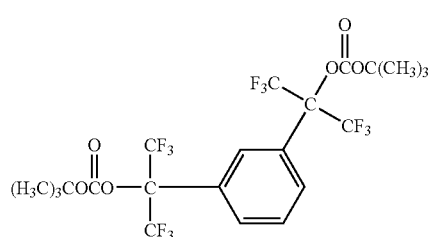
(C2-2-2)

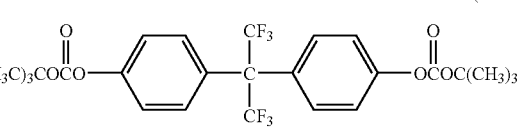
(C2-5-1)

The total amount of the dissolution controllers (C1) and dissolution controllers (C2) used is usually 50 parts by weight or less, and preferably 30 parts by weight or less, for 100 parts by weight of the polysiloxane (A). If this total amount exceeds 50 parts by weight, heat resistance as a resist tends to be impaired.

<Acid Diffusion Controller>

An acid diffusion controller may be incorporated in the radiation curable resin composition of the present invention.

The acid diffusion controller controls the diffusion phenomenon of an acid generated from the acid generator (B) upon exposure in the resist film, thereby hindering undesired chemical reactions in the unexposed area.

The addition of such an acid diffusion controller improves storage stability of the resulting composition and resolution as a resist. Moreover, the addition of the acid diffusion controller controls changes in the line width of the resist pattern due to changes in the post-exposure delay (PED) between exposure and development, whereby a composition with remarkably superior process stability can be obtained.

As the acid diffusion controller, nitrogen-containing organic compounds of which the basicity does not change due to exposure or heat treatment during formation of a resist pattern are preferable.

As examples of such nitrogen-containing organic compounds, compounds shown by the following formula (D1) (hereinafter called "nitrogen-containing compounds (a)"), compounds having two nitrogen atoms in the molecule (hereinafter called "nitrogen-containing compounds (b)"), polymers having at least three nitrogen atoms (hereinafter called "nitrogen-containing compounds (c)"), compounds containing an amide group, urea compounds, heterocyclic compounds containing a nitrogen atom, and the like can be given:

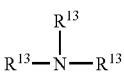
(D1)

wherein $R^{13}$ individually represents a hydrogen atom, a substituted or unsubstituted alkyl group, substituted or unsubstituted aryl group, or substituted or unsubstituted aralkyl group.

Examples of the nitrogen-containing compounds (a) include mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, dicyclohexylmethylamine, and tricyclohexylamine; and aromatic amines such as aniline, N-methylaniline, N,N-dimethylaniline, 2-methylaniline, 3-methylaniline, 4-methylaniline, 4-nitroaniline, diphenylamine, triphenylamine, and naphthylamine.

Examples of the nitrogen-containing compounds (b) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, and the like.

As examples of the nitrogen-containing compound (c), polyethyleneimine, polyallylamine, and a polymer of 2-dimethylaminoethylacrylamide can be given.

As examples of the amide group-containing compound, N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2- phenylbenzimidazole; formamide, N-methylformamide, N,N-dimethylformamide, acetamide, N-methylacetamide, N,N-dimethylacetamide, propionamide, benzamide, pyrrolidone, and N-methylpyrrolidone can be given.

Examples of the amide group-containing compound include formamide, N-methylformamide, N,N-dimethylformamide, acetamide, N-methylacetamide, N,N-dimethylacetamide, propionamide, benzamide, pyrrolidone, and N-methylpyrrolidone.

As examples of the urea compound, urea, methylurea, 1,1-dimethylurea, 1,3-dimethylurea, 1,1,3,3-tetramethylurea, 1,3-diphenylurea, and tri-n-butylthiourea can be given.

Examples of the nitrogen-containing heterocyclic compounds include: imidazoles such as imidazole, benzimidazole, 4-methylimidazole, and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine and 1-(2-hydroxyethyl)piperazine; pyrazine, pyrazole, pyridazine, quinoxaline, purine, pyrrolidine, piperidine, morpholine, 4-methylmorpholine, 1,4-dimethylpiperazine, 1,4-diazabicyclo[2.2.2]octane; and the like.

Of the above nitrogen-containing organic compounds, at least one compound selected from the group consisting of tri(cyclo)alkylamines, N-t-butoxycarbonyl group-containing amino compounds, pyridines, and piperazines is preferable.

The acid diffusion controllers may be used either individually or in combination of two or more.

The amount of the acid diffusion controller to be added is usually 100 mol % or less, preferably 50 mol % or less, and still more preferably 30 mol % or less, of the polysiloxane (B) If the amount of the acid diffusion controller exceeds 100 mol %, sensitivity of the resulting resist and developability of the exposed region may be decreased. If the amount of the acid diffusion controller is less than 0.1 mol %, the pattern shape or dimensional accuracy of the resulting resist may be decreased depending on the process conditions.

<Other Additives>

A surfactant that improves applicability, developability, and the like may be added to the radiation sensitive resin composition of the present invention.

As examples of the surfactant, nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; and commercially available products such as KP341 (manufactured by Shin-Etsu Chemical Co., Ltd.), POLYFLOW No. 75, No. 95 (manufactured by Kyoeisha Chemical Co., Ltd.), FTOP EF301, EF303, EF352 (manufactured by Tohkem Products Corporation), MEGAFAC F171, F173 (manufactured by Dainippon Ink and Chemicals, Inc.), Fluorad FC430, FC431 (manufactured by Sumitomo 3M Ltd.), Asahi Guard AG710, and Surflon S-382, SC-101, SC-102, SC-103, SC-104, SC-105, SC-106 (manufactured by Asahi Glass Co., Ltd.) can be given.

The surfactants may be used either individually or in combination of two or more.

The amount of surfactant to be added is usually 2 parts by weight or less for 100 parts by weight of the polysiloxane (A) and the acid generator (B) in total.

As other additives, halation inhibitors, adhesion promoters, storage stabilizers, anti-foaming agents, and the like can be given.

<Preparation of Composition Solution>

The radiation sensitive resin composition of the present invention is made into a composition solution by dissolving the composition in a solvent so that the total solid content is usually 1–25 wt %, and preferably 2–15 wt %, and filtering the solution using a filter with a pore diameter of about 0.2 µm, for example.

As examples of solvents used for preparation of the composition solution, linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; as well as other solvents such as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methylpropionate, ethyl ethoxyacetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butyl acetate, methyl acetoacetate, ethyl acetoacetate, methyl pyruvate, ethyl pyruvate, N-methyl pyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, and propylene carbonate can be given.

These solvents may be used either individually or in combination of two or more. Among these solvents, linear or branched ketones, cyclic ketones, propylene glycol monoalkyl ether acetates, alkyl 2-hydroxypropionates, and alkyl 3-alkoxypropionates are preferable.

<Under Layer Film>

The radiation sensitive resin composition of the present invention is particularly useful as a chemically amplified resist. When forming a resist pattern using the radiation sensitive resin composition, an organic-type or inorganic-type under layer film may be previously formed on the substrate to suppress the effect of stationary waves due to radiation.

As the polymer forming under layer film (hereinafter referred to as "under layer film polymer"), a polymer capable of efficiently suppressing the effect of stationary waves and possessing sufficient dry etching resistance is preferable. In particular, polymers having a carbon content of preferably 85 wt % or more, and more preferably 90 wt % or more, and containing an aromatic hydrocarbon structure in the molecule is preferable (such a polymer is hereinafter referred to as "under layer film polymer (β)").

As the under layer film polymer (β), polymers having the structural unit of the following formula (β1), polymers having the structural unit of the following formula (β2), polymers having the structural unit of the following formula (β3), polymers having the structural unit of the following formula (β4), and the like can be given. These polymers may be used either individually or in combinations of two or more.

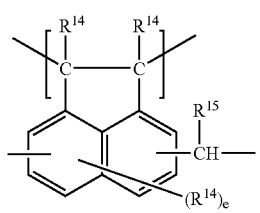

(β1)

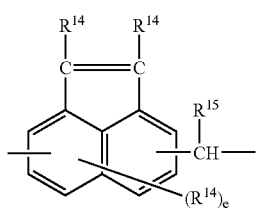

(β2)

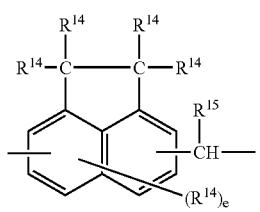

(β3)

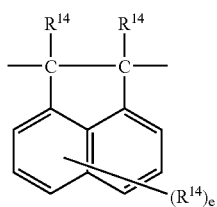

(β4)

wherein $R^{14}$ individually represents a monovalent atom or a monovalent group, e is an integer of 0 to 4, and $R^{15}$ is a hydrogen atom or a monovalent organic group.

As examples of the monovalent atom or monovalent group represented by $R^{14}$ in the formulas (β1) to (β4), a halogen atom, hydroxyl group, mercapto group, carboxyl group, nitro group, sulfonic acid group, phenyl group, alkyl group, alkenyl group, amino group, and acyl group can be given, wherein one or more hydrogen atoms on the phenyl group, alkyl group, and alkenyl group may be replaced by one or more, same or different, substituents such as a halogen atom, hydroxyl group, mercapto group, carboxyl group, nitro group, and sulfonic acid group.

As examples of the halogen atom, a fluorine atom, chlorine atom, and bromine atom can be given.

As the alkyl group, alkyl groups having 1–10 carbon atoms are preferable. Particularly preferable examples are linear or branched alkyl groups having 1–6 carbon atoms, such as a methyl group, ethyl group, n-propyl group, i-propyl group, n-butyl group, i-butyl group, sec-butyl group, and t-butyl group.

As the alkenyl group, alkenyl groups having 2–10 carbon atoms are preferable. Particularly preferable examples are linear or branched alkenyl groups having 2–6 carbon atoms, such as a vinyl group, propenyl group, 1-butenyl group, and 2-butenyl group.

As the amino group, primary amino groups are preferable. Particularly preferable examples are linear or branched primary amino groups having 1–6 carbon atoms, such as an aminomethyl group, 2-aminoethyl group, 3-aminopropyl group, and 4-aminobutyl group.

As the acyl group, acyl groups having 2–10 carbon atoms are preferable. Particularly preferable examples are aliphatic or aromatic acyl groups having 2–6 carbon atoms, such as an acetyl group, propionyl group, butyryl group, and benzoyl group.

As examples of the monovalent organic group represented by $R^{15}$, alkyl groups, alkenyl groups, alicyclic groups, aromatic hydrocarbon groups, and heterocyclic groups can be given.

As the alkyl groups, linear or branched alkyl groups having 1–6 carbon atoms, such as a methyl group, ethyl group, n-propyl group, i-propyl group, n-butyl group, i-butyl group, sec-butyl group, and t-butyl group are preferable.

As the alkenyl groups, linear or branched alkenyl groups having 2–6 carbon atoms such as a vinyl group, propenyl group, 1-butenyl group, and 2-butenyl group are preferable.

As the alicyclic groups, alicyclic groups having 4–10 carbon atoms such as a cyclopentyl group and cyclohexyl group are preferable.

As the aromatic hydrocarbon groups, aromatic hydrocarbon groups having 6–12 carbon atoms such as a phenyl group, 1-naphthyl group, and 2-naphthyl group are preferable.

As the heterocyclic groups, 4–10 member heterocyclic groups such as a 2-furanyl group, tetrahydro-2-furanyl group, furfuryl group, tetrahydrofurfuryl group, thiofurfuryl group, 2-pyranyl group, tetrahydro-2-pyranyl group, 2-pyranylmethyl group, and tetrahydro-2-pyranylmethyl group are preferable.

Mw of the under layer film polymer (β) is usually 500–100,000, and preferably 5,000–50,000.

The under layer film polymers (β) may be used either individually or in combination of two or more.

When forming the under layer films using the under layer film polymer, a solution in which the under layer film polymer is dissolved in a solvent, optionally together with additives that are described later, is used. Such a solution is hereinafter referred to as "composition solution for forming under layer films."

Any solvent capable of dissolving the under layer film polymers and additives can be used without any specific limitation for the composition solution for forming under layer films. Examples of the solvents that can be used include: ethylene glycol monoalkyl ethers such as ethylene glycol monomethyl ether, ethylene glycol monoethyl ether, ethylene glycol mono-n-propyl ether, and ethylene glycol mono-n-butyl ether; ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; diethylene glycol dialkyl ethers such as diethylene glycol dimethyl ether, diethylene glycol diethyl ether, diethylene glycol di-n-propyl ether, diethylene glycol di-n-butyl ether; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; lactic acid esters such as methyl lactate, ethyl lactate, n-propyl lactate, i-propyl lactate, n-butyl lactate, and i-butyl lactate; aliphatic carboxylic acid esters such as methyl formate, ethyl formate, n-propyl formate, i-propyl formate, n-butyl formate, i-butyl formate, n-amyl formate, i-amyl formate, methyl acetate, ethyl acetate, n-propyl acetate, i-propyl acetate, n-butyl acetate, i-butyl acetate, n-amyl acetate, i-amyl acetate, n-hexyl acetate, methyl propionate, ethyl propionate, n-propyl propionate, i-propyl propionate, n-butyl propionate, i-butyl propionate, methyl butyrate, ethyl butyrate, n-propyl butyrate, i-propyl butyrate, n-butyl butyrate, and i-butyl butyrate; other esters such as ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, butyl 3-methoxyacetate, butyl 3-methyl-3-methoxyacetate, butyl 3-methyl-3-methoxypropionate, butyl 3-methyl-3-methoxybutyrate, methyl acetoacetate, methyl pyruvate, and ethyl pyruvate; aromatic hydrocarbons such as toluene and xylene; ketones such as methyl ethyl ketone, 2-pentanone, 2-hexanone, 2-heptanone, 3-heptanone, 4-heptanone, and cyclohexanone; amides such as N-methylformamide, N,N-dimethylformamide, N-methylacetamide, N,N-dimethyl acetamide, and N-methylpyrrolidone; and lactones such as γ-butyrolactone.

Of these solvents, ethylene glycol monoethyl ether acetates, ethyl lactate, methyl 3-methoxypropionate, ethyl 3-ethoxypropionate, 2-heptanone, cyclohexanone, and the like are preferable.

These solvents may be used either individually or in combination of two or more.

The solvent is used in the composition solution for forming the under layer films in an amount to make the total solid content in the solution usually 0.01–70 wt %, preferably 0.05–60 wt %, and more preferably 0.1–50 wt %.

Various additives such as crosslinking agents, polymers other than the under layer film polymers, radiation absorbents, surfactants, acid generators, preservatives, anti-foaming agents, and adhesion adjuvants can be added to the composition solution for forming under layer films as required.

The composition solution for forming under layer films is usually filtered through a filter with a pore size of about 0.1 µm before using for forming under layer films.

<Formation of Resist Pattern>

As the method for forming a resist pattern using the radiation sensitive resin composition of the present invention, a method comprising: 1) a step of optionally forming an under layer film by applying the composition solution for forming an under layer film to a substrate and heating the applied composition, 2) a step of forming a resist film by applying the radiation sensitive resin composition to a substrate or to the under layer film, and prebaking the resulting coating, 3) a step of selectively exposing the resist film with radiation through a mask, 4) a step of forming a resist pattern by developing the exposed resist film, and optionally 5) a step of etching the under layer film by masking the resist pattern can be given.

In the method of forming a resist pattern using the radiation sensitive resin composition of the present invention, an acid-dissociable group in the polysiloxane (A) dissociates by the action of an acid generated from the acid generator (B) upon exposure, whereby the exposed area of the resist film becomes soluble in alkali. As a result, the exposed area is dissolved in an alkaline developer and removed to obtain a positive-tone resist pattern.

There is no specific limitation to the substrate used for forming a resist pattern. Inorganic substrates such as a silicon-type oxide film and interlayer dielectric film can be given as examples.

When forming an under layer film on the substrate, after applying the composition solution for forming under layer films onto the substrate by an appropriate means such as rotation coating, cast coating, or roll coating, for example, the resulting coating is baked to volatilize the solvent, thereby forming the under layer film.

The baking temperature is usually from 90 to 500° C., and preferably from 200 to 450° C.

The thickness of the under layer film is usually 10–10,000 nm, and preferably 50–1,000 nm.

Next, the solution of the radiation sensitive resin composition is applied onto the substrate or the under layer film using an appropriate means such as rotation coating, cast coating, or roll coating, for example, to a thickness that may produce a resist film with a prescribed thickness, and the resulting coating is prebaked (hereinafter referred to as "PB") and the solvent is volatilized to obtaining the target resist film.

In this instance, a PB temperature is appropriately adjusted according to the radiation sensitive resin composition used and the like usually in the range of 30–200° C., and preferably of 50–160° C.

The thickness of the resist film is usually 10–10,000 nm, preferably 50–1,000 nm, and particularly preferably 70–300 nm.

Then, the resist film is selectively exposed to radiation through a mask.

As radiation used for exposure, visible rays, ultraviolet rays, deep ultraviolet rays, X-rays, electron beams, γ-rays, molecular beams, ion beams, or the like are appropriately selected depending on the radiation sensitive resin composition used. It is particularly preferable to use deep ultraviolet rays such as a KrF excimer laser (wavelength: 248 nm), ArF excimer laser (wavelength: 193 nm), $F_2$ excimer laser (wavelength: 157 nm), and extreme ultraviolet rays (EUV) or electron beams. The ArF excimer laser and $F_2$ excimer laser are ideal deep ultraviolet rays.

In this step, the resist film is preferably heated after exposure (hereinafter referred to as "PEB") to ensure a smooth dissociation reaction of the acid-dissociable protective groups. The PEB temperature is usually 30–200° C., and preferably 50–170° C., although the heating conditions are changed depending on the composition of the radiation sensitive resin composition.

A protective film may be provided on the resist film in order to prevent an adverse effect of basic impurities and the like that are present in the environmental atmosphere using a method described in, for example, Japanese Patent Application Laid-open No. 188598/1993.

Next, the resist film after exposure is developed to form a resist pattern.

As examples of the developer used for development, alkaline aqueous solutions prepared by dissolving alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-[5.4.0]-7-undecene, and 1,5-diazabicyclo-[4.3.0]-5-nonene can given.

The concentration of the alkaline aqueous solution is usually 10 wt % or less. If the concentration of the alkaline aqueous solution exceeds 10 wt %, an unexposed part may be dissolved in the developer.

An appropriate amount of a water-soluble organic solvent such as alcohols including methanol and ethanol or a surfactant can be added to these alkaline aqueous solutions.

The resist film is then washed with water and dried to obtain a desired resist pattern.

Organic solvents or the like may be added to the developer containing an alkaline aqueous solution.

As examples of organic solvents, ketones such as acetone, 2-butanone, 4-methyl-2-pentanone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like can be given.

These organic solvents may be used either individually or in combination of two or more.

The amount of the organic solvent to be used is preferably 100 vol % or less of the alkaline aqueous solution. The amount of the organic solvent exceeding 100 vol % may decrease developability, giving rise to a larger undeveloped portion in the exposed area.

In addition, surfactants or the like may be added to the developer containing the alkaline aqueous solution in an appropriate amount.

After development using the alkaline aqueous solution developer, the resist film is generally washed with water and dried.

Thereafter, if required, the under layer film is etched using the obtained resist pattern as a mask and gas plasma such as fluorine plasma, chlorine plasma, or bromine plasma to obtain a desired pattern.

BEST MODE FOR CARRYING OUT THE INVENTION

Figure 1:
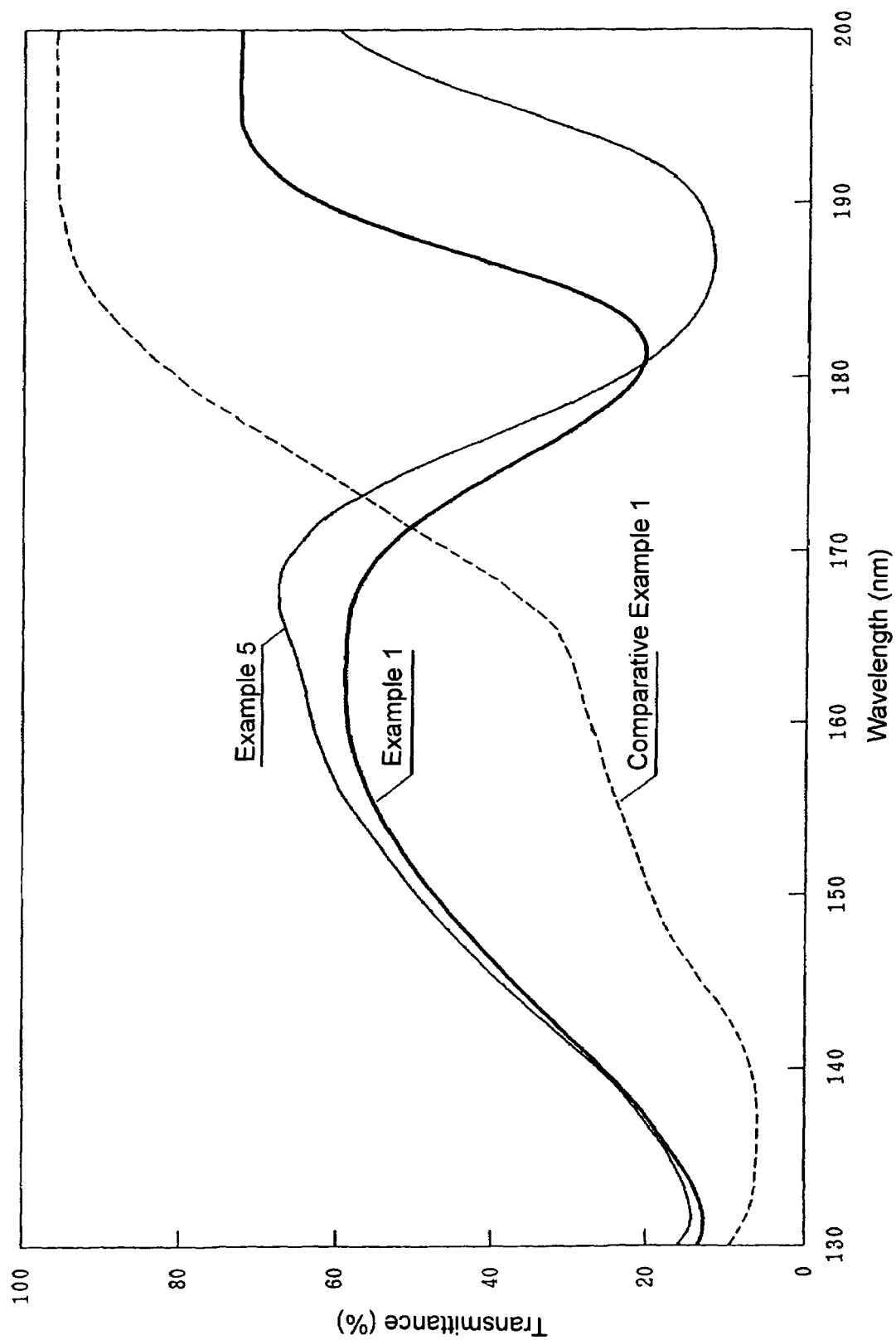
FIG. 1 is a drawing showing an example of a polysiloxane transmittance curve in a wavelength range of 200–130 nm.

The present invention is described below in more detail by examples. However, these examples should not be construed as limiting the present invention.

Measurement and evaluation in the examples and comparative examples were carried out according to the following procedures.

Mw:

Mw was measured by gel permeation chromatography (GPC) using GPC columns (manufactured by Tosoh Corp., G2000HXL×2, G3000HXL×1, G4000HXL×1) under the following conditions. Flow rate: 1.0 ml/minute, eluate: tetrahydrofuran, column temperature: 40° C., standard reference material: monodispersed polystyrene Radiation Transmittance:

Polysiloxane was dissolved in 2-heptanone to prepare a resin solution with a solid content of 5%. The resin solution was applied onto a magnesium fluoride substrate by spin coating and heated for 90 seconds on a hot plate maintained at 110° C. or 140° C. to form a film with a thickness of 1,000 Å. The radiation transmittance of the film calculated from the absorbance at a wavelength of 157 nm was used as a standard of transparency in a deep ultraviolet region.

SYNTHESIS EXAMPLE 1

A four-necked flask equipped with a stirrer, a reflux condenser, a dropping funnel, and a thermometer was charged with 23.6 g of metal magnesium and 500 ml of tetrahydrofuran. 10 g of pentafluorobenzene was added dropwise over five minutes while stirring the mixture in a dry nitrogen stream. When the temperature of the reaction solution reached 40° C., dropwise addition of a mixture of 190 g of pentafluorobenzene and 506 g of tetraethoxysilane was started. The addition was continued while maintaining the temperature of the reaction solution at 50–60° C. After the addition, the reaction solution was allowed to cool to room temperature and stirred over night at room temperature. The reaction mixture containing a deposited salt was diluted with n-hexane and filtered through celite by suction. The solvent was removed from the filtrate by evaporation under reduced pressure to obtain a crude product. The crude product was purified by distillation under reduced pressure at 3 mmHg and 92° C. to obtain 68 g of a compound.

NMR spectrum (chemical shift σ) and IR spectrum were measured to identify the compound to be pentafluorophenyltriethoxysilane.

σ: 3.8 ppm (ethoxy group), 1.2 ppm (ethoxy group)

IR: 2980 cm$^{-1}$ (ethoxy group), 2898 cm$^{-1}$ (ethoxy group), 1643 cm$^{-1}$ (pentafluorophenyl group), 1518 cm$^{-1}$ (C—F bond), 1467 cm$^{-1}$ (C—F bond), 1168 cm$^{-1}$ (siloxane group), 1093 cm$^{-1}$ (siloxane group)

SYNTHESIS EXAMPLE 2

A four-necked flask equipped with a stirrer, a reflux condenser, a dropping funnel, and a thermometer was charged with 7.5 g of metal magnesium and 100 ml of tetrahydrofuran. A mixture of 50 g of 1-bromo-3,5-difluorobenzene and 77.2 g of chlorotriethoxysilane was added dropwise while stirring the reaction solution in a dry nitrogen stream and maintaining the temperature at 50–60° C. After the addition, the reaction solution was allowed to cool to room temperature and stirred over night at room temperature. The reaction mixture containing a deposited salt was diluted with n-hexane and filtered through celite by suction. The solvent was removed from the filtrate by evaporation under reduced pressure to obtain a crude product. The crude product was purified by distillation under reduced pressure at 20 mmHg and 125° C. to obtain 21 g of a compound.

NMR spectrum (chemical shift σ) and IR spectrum were measured to identify the compound to be 3,5-difluorophenyltriethoxysilane.

σ: 7.1 ppm (o-position of phenyl group), 6.8 ppm (p-position of phenyl group), 3.8 ppm (ethoxy group), 1.2 ppm (ethoxy group)

IR: 2978 $cm^{-1}$ (ethoxy group), 2897 $cm^{-1}$ (ethoxy group), 1614 $cm^{-1}$ (aromatic group), 1585 $cm^{-1}$ (C—F bond), 1412 $cm^{-1}$ (C—F bond), 1168 $cm^{-1}$ (Si—O bond), 1084 $cm^{-1}$ (Si—O bond)

SYNTHESIS EXAMPLE 3

A four-necked flask equipped with a stirrer, a reflux condenser, a dropping funnel, and a thermometer was charged with 3.0 g of metal magnesium and 100 ml of tetrahydrofuran. A mixture of 20 g of 1-bromo-2,6-difluorobenzene and 31.0 g of chlorotriethoxyethoxysilane was added dropwise while stirring the reaction solution in a dry nitrogen stream and maintaining the temperature at 50–60° C. After the addition, the reaction solution was allowed to cool to room temperature and stirred over night at room temperature. The reaction mixture containing a deposited salt was diluted with n-hexane and filtered through celite by suction. The solvent was removed from the filtrate by evaporation under reduced pressure to obtain a crude product. The crude product was purified by distillation under reduced pressure at 17 mmHg and 127° C. to obtain 14.6 g of a compound.

NMR spectrum (chemical shift σ) and IR spectrum were measured to identify the compound to be 2,6-difluorophenyltriethoxysilane.

σ: 7.1 ppm (p-position of phenyl group), 6.8 ppm (m-position of phenyl group), 3.8 ppm (ethoxy group), 1.2 ppm (ethoxy group)

IR: 2978 $cm^{-1}$ (ethoxy group), 2895 $cm^{-1}$ (ethoxy group), 1614 $cm^{-1}$ (aromatic group), 1579 $cm^{-1}$ (C—F bond), 1448 $cm^{-1}$ (C—F bond), 1168 $cm^{-1}$ (Si—O bond), 1103 $cm^{-1}$ (Si—O bond)

SYNTHESIS EXAMPLE 4

A four-necked flask equipped with a stirrer, a reflux condenser, a dropping funnel, and a thermometer was charged with 2.1 g of metal magnesium and 70 ml of tetrahydrofuran. A mixture of 15 g of 1-bromo-2,4,6-trifluorobenzene and 21.1 g of chlorotriethoxyethoxysilane was added dropwise while stirring the reaction solution in a dry nitrogen stream and maintaining the temperature at 50–60° C. After the addition, the reaction solution was allowed to cool to room temperature and stirred over night at room temperature. The reaction mixture containing a deposited salt was diluted with n-hexane and filtered through celite by suction. The solvent was removed from the filtrate by evaporation under reduced pressure to obtain a crude product. The crude product was purified by distillation under reduced pressure at 15 mmHg and 117° C. to obtain 12.7 g of a compound.

NMR spectrum (chemical shift σ) and IR spectrum were measured to identify the compound to be 2,4,6-trifluorophenyltriethoxysilane.

σ: 6.6 ppm (m-position of phenyl group), 3.8 ppm (ethoxy group), 1.2 ppm (ethoxy group)

IR: 2980 $cm^{-1}$ (ethoxy group), 2897 $cm^{-1}$ (ethoxy group), 1631 $cm^{-1}$ (aromatic group), 1604 $cm^{-1}$ (aromatic group), 1589 $cm^{-1}$ (aromatic group), 1417 $cm^{-1}$ (C—F bond), 1167 $cm^{-1}$ (Si—O bond), 1103 $cm^{-1}$ (Si—O bond)

SYNTHESIS EXAMPLE 5

A four-necked flask equipped with a stirrer, a reflux condenser, a dropping funnel, and a thermometer was charged with 4.9 g of metal magnesium and 200 ml of tetrahydrofuran. A mixture of 50 g of 1-bromo-3,5-bis (trifluoromethyl)benzene and 51.0 g of chlorotriethoxyethoxysilane was added dropwise while stirring the reaction solution in a dry nitrogen stream and maintaining the temperature at 50–60° C. After the addition, the reaction solution was allowed to cool to room temperature and stirred over night at room temperature. The reaction mixture containing a deposited salt was diluted with n-hexane and filtered through celite by suction. The solvent was removed from the filtrate by evaporation under reduced pressure to obtain a crude product. The crude product was purified by distillation under reduced pressure at 15 mmHg and 106° C. to obtain 38.0 g of a compound.

NMR spectrum (chemical shift σ) and IR spectrum were measured to identify the compound to be 3,5-bis(trifluoromethyl)phenyltriethoxysilane.

σ: 8.1 ppm (o-position of phenyl group), 7.8 ppm (p-position of phenyl group), 3.8 ppm (ethoxy group), 1.2 ppm (ethoxy group)

IR: 2982 $cm^{-1}$ (ethoxy group), 2897 $cm^{-1}$ (ethoxy group), 1601 $cm^{-1}$ (aromatic group), 1280 $cm^{-1}$ (C—F bond), 1169 $cm^{-1}$ (Si—O bond), 1099 $cm^{-1}$ (Si—O bond)

SYNTHESIS EXAMPLE 6

A four-necked flask equipped with a stirrer, a reflux condenser, a dropping funnel, and a thermometer was charged with 6.4 g of metal magnesium and 200 ml of tetrahydrofuran. A mixture of 50 g of 1-bromo-4-(trifluoromethyl)benzene and 66.1 g of chlorotriethoxyethoxysilane was added dropwise while stirring the reaction solution in a dry nitrogen stream and maintaining the temperature at 50–60° C. After the addition, the reaction solution was allowed to cool to room temperature and stirred over night at room temperature. The reaction mixture containing a deposited salt was diluted with n-hexane and filtered through celite by suction. The solvent was removed from the filtrate by evaporation under reduced pressure to obtain a crude product. The crude product was purified by distillation under reduced pressure at 17 mmHg and 114° C. to obtain 47.4 g of a compound.

NMR spectrum (chemical shift σ) and IR spectrum were measured to identify the compound to be 4-(trifluoromethyl) phenyltriethoxysilane.

σ: 7.7 ppm (o- and m-position of phenyl group), 3.8 ppm (ethoxy group), 1.2 ppm (ethoxy group)

IR: 2978 $cm^{-1}$ (ethoxy group), 2893 $cm^{-1}$ (ethoxy group), 1392 $cm^{-1}$ (C—F bond), 1327 $cm^{-1}$ (C—F bond), 1168 $cm^{-1}$ (Si—O bond), 1082 $cm^{-1}$ (Si—O bond)

SYNTHESIS EXAMPLE 7

A three-necked flask equipped with a stirrer, a reflux condenser, and a thermometer was charged with 76.0 g of triethoxysilane and 100 g of 8-t-butoxycarbonyltetracyclo[4.4.0.1$^{2,5}$.1$^{7,10}$]dodec-3-ene. The mixture was stirred at room temperature and 5.0 ml of a 0.2 mol chloroplatinic acid (H$_2$PtCl$_6$) solution in i-propyl alcohol was added to initiate the reaction. The reaction was continued for 75 hours at 150° C. while refluxing. The reaction mixture was allowed to cool to room temperature, diluted with n-hexane, and filtered through celite by suction. The solvent was removed from the filtrate by evaporation under reduced pressure to obtain a crude product. The residue was purified by silica gel column chromatography to obtain 53 g of a reaction product as a n-hexane fraction.

As shown by the following results of NMR spectrum (chemical shift σ) and IR spectrum measurement, this reaction product was identified to be a compound (A) shown by the following formula (A).

σ: 3.8 ppm (ethoxy group), 1.2 ppm (ethoxy group), 1.4 ppm (t-butyl group)

IR: 2885 cm$^{-1}$ (ethoxy group), 1726 cm$^{-1}$ (ester group), 1153 cm$^{-1}$ (siloxane group), 1080 cm$^{-1}$ (siloxane group)

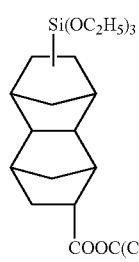

(A)

wherein the silicon atom bonds to the 3-position or 4-position of the tetracyclo[4.4.0.1$^{2,5}$.1$^{7,10}$]dodecane ring.

SYNTHESIS EXAMPLE 8

A three-necked flask equipped with a stirrer, a reflux condenser, and a thermometer was charged with 38.8 g of triethoxysilane and 43.2 g of 5-[2-hydroxy-2,2-bis(trifluoromethyl)ethyl]bicyclo[2.2.1]-hept-2-ene. The mixture was stirred at room temperature and 0.1 ml of a 0.2 mol chloroplatinic acid (H$_2$PtCl$_6$) solution in i-propyl alcohol was added to initiate the reaction. The reaction was continued for 30 hours at 100° C. while refluxing. The reaction mixture was allowed to cool to room temperature, diluted with n-hexane, and filtered through celite by suction. The solvent was removed from the filtrate by evaporation under reduced pressure to obtain a crude product. The crude product was purified by distillation under reduced pressure at 3 mmHg and a temperature of 105° C. to obtain 59.8 g of a reaction product.

As shown by the following results of NMR spectrum (chemical shift σ) and IR spectrum measurement, this reaction product was identified to be a compound (B) shown by the following formula (B).

σ: 3.8 ppm (ethoxy group), 1.2 ppm (ethoxy group)

IR: 3400 cm$^{-1}$ (hydroxyl group), 2878 cm$^{-1}$ (methoxy group), 1215 cm$^{-1}$ (C—F bond), 1082 cm$^{-1}$ (siloxane group)

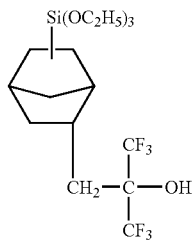

(B)

wherein the silicon atom bonds to the 2-position or 3-position of the bicyclo[2.2.1]heptane ring.

EXAMPLE 1

Synthesis of Polysiloxane (1)

A three-necked flask equipped with a stirrer, a reflux condenser, and a thermometer was charged with 0.87 g of the compound (A), 1.79 g of the compound (B), 1.35 g of pentafluorophenyltriethoxysilane obtained in Synthesis Example 1, 2 g of 4-methyl-2-pentanone, and 0.75 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was repeatedly washed with ion-exchanged water until the reaction solution became neutral. The solvent was evaporated under reduced pressure from the organic layer to obtain 2.6 g of a polymer.

NMR spectrum (chemical shift σ), IR spectrum, and Mw of the polymer were measured. The results were as follows.

σ: 2.3 ppm (CH$_2$C(CF$_3$)$_2$ group), 1.4 ppm (t-butyl group)

IR: 1703 cm$^{-1}$ (ester group), 1641 cm$^{-1}$ (phenyl group), 1473 cm$^{-1}$ (C—F bond), 1296 cm$^{-1}$ (C—F bond), 1215 cm$^{-1}$ (C—F bond), 1095 cm$^{-1}$ (siloxane group)

Mw: 2,300

EXAMPLE 2

Synthesis of Polysiloxane (1)

A three-necked flask equipped with a stirrer, a reflux condenser, and a thermometer was charged with 0.92 g of the compound (A), 1.89 g of the compound (B), 1.19 g of 3,5-difluorophenyltriethoxysilane obtained in Synthesis Example 2, 2 g of 4-methyl-2-pentanone, and 0.79 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution became neutral. The solvent was evaporated under reduced pressure from the organic layer to obtain 2.4 g of a polymer.

NMR spectrum (chemical shift σ), IR spectrum, and Mw of the polymer were measured. The results were as follows.

σ: 7.2–6.8 ppm (aromatic group), 2.3 ppm (CH$_2$C(CF$_3$)$_2$ group), 1.4 ppm (t-butyl group)

IR: 1699 cm$^{-1}$ (ester group), 1587 cm$^{-1}$ (phenyl group), 1413 cm$^{-1}$ (C—F bond), 1294 cm$^{-1}$ (C—F bond), 1215 cm$^{-1}$ (C—F bond), 1122 cm$^{-1}$ (siloxane group)

Mw: 2,700

EXAMPLE 3

Synthesis of Polysiloxane (1)

A three-necked flask equipped with a stirrer, a reflux condenser, and a thermometer was charged with 0.92 g of the compound (A), 1.89 g of the compound (B), 1.19 g of 2,6-difluorophenyl triethoxysilane obtained in Synthesis Example 3, 2 g of 4-methyl-2-pentanone, and 0.79 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution became neutral. The solvent was evaporated under reduced pressure from the organic layer to obtain 2.6 g of a polymer.

NMR spectrum (chemical shift σ), IR spectrum, and Mw of the polymer were measured. The results were as follows.

σ: 7.5–6.7 ppm (aromatic group), 2.3 ppm $(CH_2C(CF_3)_2$ group), 1.4 ppm (t-butyl group)

IR: 1699 $cm^{-1}$ (ester group), 1618 $cm^{-1}$ (phenyl group), 1452 $cm^{-1}$ (C—F bond), 1263 $cm^{-1}$ (C—F bond), 1215 $cm^{-1}$ (C—F bond), 1126 $cm^{-1}$ (siloxane group)

Mw: 2,300

EXAMPLE 4

Synthesis of Polysiloxane Copolymer (1)

A three-necked flask equipped with a stirrer, a reflux condenser, and a thermometer was charged with 0.90 g of the compound (A), 1.86 g of the compound (B), 1.19 g of 2,4,6-trifluorophenyl triethoxysilane obtained in Synthesis Example 4, 2 g of 4-methyl-2-pentanone, and 0.78 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution became neutral. The solvent was evaporated under reduced pressure from the organic layer to obtain 2.5 g of a polymer.

NMR spectrum (chemical shift σ), IR spectrum, and Mw of the polymer were measured. The results were as follows.

σ: 8.2–7.8 ppm (aromatic group), 2.3 ppm $(CH_2C(CF_3)_2$ group), 1.4 ppm (t-butyl group)

IR: 1701 $cm^{-1}$ (ester group), 1633 $cm^{-1}$ (phenyl group), 1589 $cm^{-1}$ (phenyl group), 1421 $cm^{-1}$ (C—F bond), 1215 $cm^{-1}$ (C—F bond), 1113 $cm^{-1}$ (siloxane group)

Mw: 2,600

EXAMPLE 5

Synthesis of Polysiloxane Copolymer (1)

A three-necked flask equipped with a stirrer, a reflux condenser, and a thermometer was charged with 0.83 g of the compound (A), 1.71 g of the compound (B), 1.47 g of 3,5-bis(trifluoromethyl)phenyl triethoxysilane obtained in Synthesis Example 3, 2 g of 4-methyl-2-pentanone, and 0.71 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution became neutral. The solvent was evaporated under reduced pressure from the organic layer to obtain 2.3 g of a polymer.

NMR spectrum (chemical shift σ), IR spectrum, and Mw of the polymer were measured. The results were as follows.

σ: 8.2–7.8 ppm (aromatic group), 2.3 ppm $(CH_2C(CF_3)_2$ group), 1.4 ppm (t-butyl group)

IR: 1703 $cm^{-1}$ (ester group), 1614 $cm^{-1}$ (phenyl group), 1369 $cm^{-1}$ (C—F bond), 1282 $cm^{-1}$ (C—F bond), 1215 $cm^{-1}$ (C—F bond), 1138 $cm^{-1}$ (siloxane group)

Mw: 2,400

EXAMPLE 6

Synthesis of Polysiloxane (1)

A three-necked flask equipped with a stirrer, a reflux condenser, and a thermometer was charged with 0.89 g of the compound (A), 1.83 g of the compound (B), 1.47 g of 4-(trifluoromethyl)phenyltriethoxysilane obtained in Synthesis Example 2, 2 g of 4-methyl-2-pentanone, and 0.76 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution became neutral. The solvent was evaporated under reduced pressure from the organic layer to obtain 2.5 g of a polymer.

NMR spectrum (chemical shift σ), IR spectrum, and Mw of the polymer were measured. The results were as follows.

σ: 8.0–7.6 ppm (aromatic group), 2.3 ppm $(CH_2C(CF_3)_2$ group), 1.4 ppm (t-butyl group)

IR: 1701 $cm^{-1}$ (ester group), 1327 $cm^{-1}$ (C—F bond), 1215 $cm^{-1}$ (C—F bond), 1134 $cm^{-1}$ (siloxane group)

Mw: 2,400

COMPARATIVE EXAMPLE 1

Synthesis of Comparative Polysiloxane

A three-necked flask equipped with a stirrer, a reflux condenser, and a thermometer was charged with 40 g of 2-t-butoxycarbonylethyltrimethoxysilane, 120 g of 4-methyl-2-pentanone, 8.6 g of distilled water, and 4 g of triethylamine. The mixture was reacted for two hours at 62° C. while stirring. The flask was cooled with ice and a solution of 3.5 g of oxalic acid in 50 ml of ion-exchanged water was added, followed by continued stirring. The reaction mixture was poured into a separating funnel to remove the water layer. The organic layer was washed with 100 ml ion-exchanged water. Washing was repeated until the reaction solution became neutral. The solvent was evaporated under reduced pressure from the organic layer to obtain 21.2 g of a polymer.

NMR spectrum (chemical shift σ), IR spectrum, and Mw of the polymer were measured. The results were as follows.

σ: 2.4–2.0 ppm (α-methylene group), 1.4 ppm (t-butyl group), 1.3–0.9 ppm (β-methylene group)

IR: 1730 $cm^{-1}$ (ester group), 1149 $cm^{-1}$ (siloxane group)

Mw: 19,500

EVALUATION EXAMPLE 1

Evaluation of Radiation Transmittance

The transmittance of the polysiloxanes obtained in Examples 1–6 and Comparative Example 1 at wavelengths of 200–130 nm was measured using a film with a thickness of 1,000 Å. The transmittances at 157 nm, 147 nm, and 134 nm are shown in Table 1.

TABLE 1

| Polysiloxane | Radiation transmittance (%) | | |
|---|---|---|---|
| | 157 nm | 147 nm | 134 nm |
| Example 1 | 57.0 | 41.4 | 14.9 |
| Example 2 | 45.7 | 31.3 | 8.9 |
| Example 3 | 36.5 | 24.3 | 6.4 |
| Example 4 | 41.6 | 31.4 | 9.6 |
| Example 5 | 60.8 | 43.2 | 16.0 |
| Example 6 | 47.2 | 31.4 | 9.9 |
| Comparative Example 1 | 24.4 | 15.3 | 6.1 |

As clear from Table 1, the polysiloxanes (1) of the present invention exhibit higher transparency than the comparative polysiloxane at a wavelength of 157 nm. The superior feature is particularly outstanding in the polysiloxanes (1) obtained in Example 1 and Example 5. As clear from Table 1, the polysiloxanes (1) of the present invention exhibit higher transparency than the comparative polysiloxane at wavelengths of 147 nm and 134 nm. This superior feature is outstanding particularly in the polysiloxanes (1) obtained in Example 1 and Example 5.

More interestingly, the polysiloxanes (1) of the present invention exhibit higher transparency than the comparative polysiloxane not only at a wavelength of 157 nm, but also in the entire wavelength region of 160–130 nm. This indicates that the polysiloxane (1) of the present invention is promising as a lithographic material using radiation with a short wavelength. Transmittance curves in a wavelength region of 200–130 nm for polysiloxanes obtained in Example 1, Example 5, and Comparative Example 1 are shown in FIG. 1.

EXAMPLE 7

Synthesis of Polysiloxane (1)

A three-necked flask equipped with a stirrer, a reflux condenser, and a thermometer was charged with 0.82 g of the compound (A), 2.54 g of the compound (B), 0.64 g of pentafluorophenyltriethoxysilane obtained in Synthesis Example 1, 4 g of 4-methyl-2-pentanone, and 0.71 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution becomes neutral. The solvent was evaporated under reduced pressure from the organic layer to obtain 2.6 g of a polymer.

Mw of the polymer was measured and found to be 1,400.

EXAMPLE 8

Synthesis of Polysiloxane (1)

A three-necked flask equipped with a stirrer, a reflux condenser, and a thermometer was charged with 0.84 g of the compound (A), 2.17 g of the compound (B), 0.98 g of pentafluorophenyltriethoxysilane obtained in Synthesis Example 1, 4 g of 4-methyl-2-pentanone, and 0.73 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution becomes neutral. The solvent was evaporated under reduced pressure from the organic layer to obtain 2.6 g of a polymer.

Mw of the polymer was measured and found to be 1,600.

EXAMPLE 9

Synthesis of Polysiloxane (1)

A three-necked flask equipped with a stirrer, a reflux condenser, and a thermometer was charged with 0.89 g of the compound (A), 1.38 g of the compound (B), 1.73 g of pentafluorophenyltriethoxysilane obtained in Synthesis Example 1, 4 g of 4-methyl-2-pentanone, and 0.77 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution becomes neutral. The solvent was evaporated under reduced pressure from the organic layer to obtain 2.4 g of a polymer.

Mw of the polymer was measured and found to be 2,500.

EXAMPLE 10

Synthesis of Polysiloxane (1)

A three-necked flask equipped with a stirrer, a reflux condenser, and a thermometer was charged with 2.05 g of the compound (A), 6.35 g of the compound (B), 1.60 g of pentafluorophenyltriethoxysilane obtained in Synthesis Example 1, 10 g of 4-methyl-2-pentanone, and 1.77 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution becomes neutral. The solvent was evaporated under reduced pressure from the organic layer to obtain about 7.2 g of a polymer. Mw of the polymer was measured and found to be 1,600.

The polymer was dissolved in 18 g of 4-methyl-2-pentanone. After the addition of 2.61 g of distilled water and 3.66 g of triethylamine, the mixture was heated to 40° C. in a nitrogen stream. After two hours, the mixture was cooled with ice and stirred, then a solution of 3.0 g of oxalic acid in 100 g of distilled water was added, and stirring was continued. The reaction mixture was poured into a separating funnel to remove the water layer. The organic layer was repeatedly washed with ion-exchanged water until the reaction solution becomes neutral. The solvent was evaporated under reduced pressure from the organic layer to obtain 5.8 g of a polymer.

Mw of the polymer was measured and found to be 2,300.

EXAMPLE 11

Synthesis of Polysiloxane (1)

A three-necked flask equipped with a stirrer, a reflux condenser, and a thermometer was charged with 2.11 g of the compound (A), 5.44 g of the compound (B), 2.46 g of pentafluorophenyltriethoxysilane obtained in Synthesis Example 1, 10 g of 4-methyl-2-pentanone, and 1.82 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution becomes neutral. The solvent was evaporated under reduced pressure from the organic layer to obtain about 7.0 g of a polymer. Mw of the polymer was measured and found to be 1,800.

The polymer was dissolved in 19 g of 4-methyl-2-pentanone. After the addition of 2.68 g of distilled water and 3.76 g of triethylamine, the mixture was heated to 40° C. in a nitrogen stream. After two hours, the mixture was cooled with ice and stirred, then a solution of 3.1 g of oxalic acid in 100 g of distilled water was added, and stirring was continued. The reaction mixture was poured into a separating funnel to remove the water layer. The organic layer was repeatedly washed with ion-exchanged water until the reaction solution becomes neutral. The solvent was evaporated under reduced pressure from the organic layer to obtain 5.9 g of a polymer.

Mw of the polymer was measured and found to be 3,400.

EXAMPLE 12

Synthesis of Polysiloxane (1)

A three-necked flask equipped with a stirrer, a reflux condenser, and a thermometer was charged with 1.03 g of the compound (A), 2.13 g of the compound (B), 1.83 g of 3,5-bis(trifluoromethyl)phenyl triethoxysilane obtained in Synthesis Example 2, 2.5 g of 4-methyl-2-pentanone, and 0.89 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution becomes neutral. The solvent was evaporated under reduced pressure from the organic layer to obtain about 3.2 g of a polymer. Mw of the polymer was measured and found to be 1,800.

The polymer was dissolved in 11 g of 4-methyl-2-pentanone. After the addition of 1.32 g of distilled water and 1.85 g of triethylamine, the mixture was heated to 40° C. in a nitrogen stream. After two hours, the mixture was cooled with ice and stirred, then a solution of 1.5 g of oxalic acid in 50 g of distilled water was added, and stirring was continued. The reaction mixture was poured into a separating funnel to remove the water layer. The organic layer was repeatedly washed with ion-exchanged water until the reaction solution becomes neutral. The solvent was evaporated under reduced pressure from the organic layer to obtain 2.9 g of a polymer.

Mw of the polymer was measured and found to be 2,200.

EXAMPLE 13

Synthesis of Polysiloxane (1)

A three-necked flask equipped with a stirrer, a reflux condenser, and a thermometer was charged with 1.21 g of the compound (A), 2.95 g of the compound (B), 0.84 g of 3,5-bis(trifluoromethyl)phenyl triethoxysilane obtained in Synthesis Example 2, 2.5 g of 4-methyl-2-pentanone, and 0.82 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution becomes neutral. The solvent was evaporated under reduced pressure from the organic layer to obtain about 3.6 g of a polymer. Mw of the polymer was measured and found to be 1,800.

The polymer was dissolved in 9 g of 4-methyl-2-pentanone. After the addition of 1.21 g of distilled water and 1.70 g of triethylamine, the mixture was heated to 80° C. in a nitrogen stream. After six hours, the mixture was cooled with ice and stirred, then a solution of 1.4 g of oxalic acid in 50 g of distilled water was added, and stirring was continued. The reaction mixture was poured into a separating funnel to remove the water layer. The organic layer was repeatedly washed with ion-exchanged water until the reaction solution becomes neutral. The solvent was evaporated under reduced pressure from the organic layer to obtain 2.6 g of a polymer.

Mw of the polymer was measured and found to be 2,900.

EVALUATION EXAMPLE 2

Evaluation of Radiation Transmittance

The transmittance of the polysiloxanes obtained in Examples 7–13 at wavelengths of 200–130 nm was measured using a film with a thickness of 1,000 Å. The results at a wavelength of 157 nm are shown in Table 2.

TABLE 2

| Polysiloxane (1) | Radiation transmittance (%) (157 nm) |
|---|---|
| Example 7 | 54.2 |
| Example 8 | 53.6 |
| Example 9 | 50.2 |
| Example 10 | 54.0 |
| Example 11 | 53.3 |
| Example 12 | 55.3 |
| Example 13 | 64.3 |

Examples 7–13 are experiments similar to Examples 1 and 5, except that the ratio of the components for polymerization and the polymerization method were changed. The resulting polysiloxanes (1) have high transmittance at 157 nm as shown in Table 2.

EVALUATION EXAMPLE 3

Measurement of Glass Transition Temperature

The glass transition temperature (Tg) of the polysiloxanes (1) obtained in Example 1, Example 5, and Examples 7–12 was measured. The results are shown in Table 3.

TABLE 3

| Polysiloxane (1) | Tg (° C.) | Remarks |
|---|---|---|
| Example 1 | 103 | Content of structural unit (II): 40 mol % |
| Example 5 | 93 | Content of structural unit (II): 40 mol % |
| Example 7 | 92 | Content of structural unit (II): 20 mol % |
| Example 8 | 94 | Content of structural unit (II): 30 mol % |
| Example 9 | 122 | Content of structural unit (II): 50 mol % |
| Example 10 | 141 | The same composition as in Example 7 |

TABLE 3-continued

| Polysiloxane (1) | Tg (° C.) | Remarks |
| --- | --- | --- |
| Example 11 | 142 | The same composition as in Example 8 |
| Example 12 | 137 | The same composition as in Example 5 |

As can be seen from the Table 3, the glass transition temperature of polysiloxane (1) increases as the content of the structural unit (II) increases, indicating that introduction of the structural unit (II) is also effective as a means for increasing the glass transition temperature that is a characteristic to be regarded in polysiloxane used as a resist material.

Furthermore, as indicated by the results of Examples 10–12, the glass transition temperature of polysiloxane (1) can be increased by polycondensation in the presence of an acid catalyst, followed by a further condensation reaction in the presence of a basic catalyst.

EVALUATION EXAMPLES 4

Evaluation of Dry Etching Resistivity

Radiation sensitive resin compositions were prepared by homogeneously mixing 100 parts by weight of the polysiloxane (1) obtained in Example 1 or polystyrene (Mw=16,000), 1 part by weight of triphenylsulfonium nonafluoro-n-butane sulfonate, 0.04 part by weight of tri-n-octylamine, and 900 parts by weight of 2-heptanone.

Each radiation sensitive resin composition was applied onto a silicon wafer by spin coating and prebaked for 90 seconds on a hot plate maintained at 140° C. to form a resist film with a thickness of 100 nm. The resist films thus obtained were tested for etching under various conditions at a substrate temperature of 15° C. using a 200 nm eMAX Dielectric Etch Tool manufactured by Applied Materials, Inc.

Etching gases, etching conditions (cathode power, etching time, and etching speed), and the etching speed ratio of polysiloxane (1) and polystyrene are shown in Table 4.

TABLE 4

| | Etching conditions | | | | |
| --- | --- | --- | --- | --- | --- |
| | | Etching | Etching rate (nm/min) | | |
| Etching gas | Cathode Power (W) | time (sec) | A Polystyrene | B Polysiloxane (1) * | B/A |
| CHF$_3$/CF$_4$/N$_2$/C$_4$F$_6$/Ar | 1600 | 15 | 161 | 223 | 1.4 |
| CF$_4$ | 1000 | 20 | 194 | 224 | 1.2 |
| CHF$_3$/CF$_4$/Ar | 1000 | 30 | 118 | 144 | 1.2 |
| C$_4$F$_6$/O$_2$/Ar | 1800 | 30 | 19 | 23 | 1.2 |

* Polysiloxane of Example 1

EVALUATION EXAMPLE 5

Resolution by Exposure to KrF Excimer Laser

Radiation sensitive resin compositions were prepared by homogeneously mixing 100 parts by weight of the polysiloxanes (1) obtained in Examples 5–10, 12, and 13, 1 part by weight of triphenylsulfoniumtrifluoromethane sulfonate, 0.04 part by weight of tri-n-octylamine, and 900 parts by weight of 2-heptanone.

Each radiation sensitive resin composition was applied onto a silicon wafer by spin coating and prebaked for 90 seconds on a hot plate maintained at 140° C. to form a resist film with a thickness of 100 nm. The resist film was exposed to a KrF excimer laser (wavelength: 248 nm) while changing the irradiation dose, subjected to PEB for 90 seconds on a hot plate maintained at 100° C., and developed in a 1.19 wt % aqueous solution of tetramethylammonium hydroxide (TMAH) or a 2.38 wt % aqueous solution of tetramethylammonium hydroxide (TMAH), thereby forming a resist pattern.

The results of the evaluation of each resist are shown in Table 5.

TABLE 5

(Exposure to KrF excimer laser)

| Polysiloxane (1) used for the radiation-sensitive resin composition | Concentration of TMAH solution (wt %) | Resolution (μm) |
| --- | --- | --- |
| Example 7 | 1.19 | 0.16 |
| Example 8 | 1.19 | 0.16 |
| Example 9 | 1.19 | 0.16 |
| Example 10 | 1.19 | 0.15 |
| Example 5 | 2.38 | 0.15 |
| Example 6 | 2.38 | 0.15 |
| Example 12 | 2.38 | 0.14 |
| Example 13 | 2.38 | 0.14 |

EVALUATION EXAMPLE 6

Resolution by Exposure to F$_2$ Excimer Laser

Radiation sensitive resin compositions were prepared by homogeneously mixing 100 parts by weight of the polysiloxanes (1) obtained in Examples 12 and 13, 1 part by weight of triphenylsulfoniumtrifluoromethane sulfonate, 0.04 part by weight of tri-n-octylamine, and 900 parts by weight of 2-heptanone.

Each radiation sensitive resin composition was applied onto a silicon wafer by spin coating and prebaked for 90 seconds on a hot plate maintained at 140° C. to form a resist film with a thickness of 100 nm.

The resist film was exposed to an F$_2$ excimer laser (wavelength: 157 nm) while changing the irradiation dose, post-baked for 90 seconds on a hot plate at 100° C., and then developed in a 2.38 wt % aqueous solution of tetramethylammonium hydroxide for 20 seconds, thereby forming a resist pattern.

The resist pattern thus obtained was inspected by a scanning-type electron microscope to confirm that the pattern on either resist film was resolved to a line size as fine as 0.08 μm.

SYNTHESIS EXAMPLE 9

A three-necked flask equipped with a stirrer, a reflux condenser, and a thermometer was charged with 20.6 g of triethoxysilane and 25 g of 5-trifluoromethyl-5-t-butoxycarbonyl bicyclo[2.2.1]hept-2-ene. The mixture was stirred at room temperature and 1.0 ml of a 0.2 mol chloroplatinic acid ($H_2PtCl_6$) solution in i-propyl alcohol was added to initiate the reaction. After refluxing while heating at 140° C. for 24 hours, the reaction mixture was allowed to cool to room temperature, diluted with n-hexane, and filtered through celite by suction. The solvent was removed from the filtrate by evaporation under reduced pressure to obtain a crude product. The crude product was purified by distillation under reduced pressure at 0.5 mmHg and a temperature of 140° C. to obtain 21 g of a compound.

As shown by the following results of NMR spectrum (chemical shift σ) and IR spectrum measurement, this product was identified to be a compound (C) shown by the following formula (C).

σ: 3.8 ppm (ethoxy group), 1.4 ppm (t-butyl group), 1.2 ppm (ethoxy group)

IR: 1730 cm$^{-1}$ (ester group), 1270 cm$^{-1}$ (C—F bond), 1155 cm$^{-1}$ (Si—O bond), 1080 cm$^{-1}$ (Si—O bond)

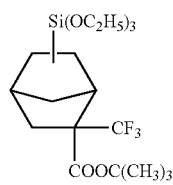

(C)

wherein the silicon atom bonds to the 2-position or 3-position of the bicyclo[2.2.1]heptane ring.

SYNTHESIS EXAMPLE 10

A three-necked flask equipped with a stirrer, a reflux condenser, and a thermometer was charged with 411.2 g of triethoxysilane and 50 g of 5-trifluoromethyl-6-t-butoxycarbonyl bicyclo[2.2.1]hept-2-ene. The mixture was stirred at room temperature and 2.0 ml of a 0.2 mol chloroplatinic acid ($H_2PtCl_6$) solution in i-propyl alcohol was added to initiate the reaction. After refluxing while heating at 140° C. for 24 hours, the reaction mixture was allowed to cool to room temperature, diluted with n-hexane, and filtered through celite by suction. The solvent was removed from the filtrate by evaporation under reduced pressure to obtain a crude product. The crude product was purified by distillation under reduced pressure at 0.5 mmHg and a temperature of 145° C. to obtain 47 g of a compound. As shown by the following results of NMR spectrum (chemical shift σ) and IR spectrum measurement, this product was identified to be a compound (D) shown by the following formula (D).

σ: 3.8 ppm (ethoxy group), 1.4 ppm (t-butyl group), 1.2 ppm (ethoxy group)

IR: 1730 cm$^{-1}$ (ester group), 1271 cm$^{-1}$ (C—F bond), 1155 cm$^{-1}$ (Si—O bond), 1080 cm$^{-1}$ (Si—O bond)

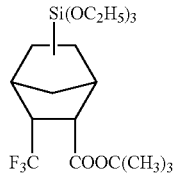

(D)

wherein the silicon atom bonds to the 2-position or 3-position of the bicyclo[2.2.1]heptane ring.

SYNTHESIS EXAMPLE 11

A three-necked flask equipped with a stirrer, a reflux condenser, and a thermometer was charged with 24.5 g of triethoxysilane and 25 g of 5-acetoxy-5-trifluoromethylbicyclo[2.2.1]hept-2-ene. The mixture was stirred at room temperature and 1.0 ml of a 0.2 mol chloroplatinic acid ($H_2PtCl_6$) solution in i-propyl alcohol was added to initiate the reaction. After refluxing while heating at 140° C. for 24 hours, the reaction mixture was allowed to cool to room temperature, diluted with n-hexane, and filtered through celite by suction. The solvent was removed from the filtrate by evaporation under reduced pressure to obtain a crude product. The crude product was purified by distillation under reduced pressure at 0.5 mmHg and a temperature of 136° C. to obtain 19 g of a compound.

As shown by the following results of NMR spectrum (chemical shift σ) and IR spectrum measurement, this product was identified to be a compound (E) shown by the following formula (E).

σ: 3.8 ppm (ethoxy group), 2.1 ppm (acetyl group), 1.2 ppm (ethoxy group)

IR: 1732 cm$^{-1}$ (ester group), 1222 cm$^{-1}$ (C—F bond), 1157 cm$^{-1}$ (Si—O bond), 1081 cm$^{-1}$ (Si—O bond)

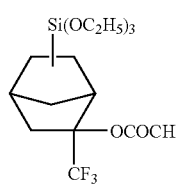

(E)

wherein the silicon atom bonds to the 2-position or 3-position of the bicyclo[2.2.1]heptane ring.

SYNTHESIS EXAMPLE 12

A 50 ml pressure vessel was charged with 6.2 g of triethoxysilane and 10 g of octafluorocyclopentene. After the addition of 0.1 ml of a 0.2 mol chloroplatinic acid ($H_2PtCl_6$) solution in i-propyl alcohol, the vessel was sealed and heated at 140° C. for 24 hours. The crude product was purified by distillation under reduced pressure at 30 mmHg and 65° C. to obtain 3.5 g of a compound.

NMR spectrum (chemical shift σ) and IR spectrum were measured to identify the compound to be octafluorocyclopentyltriethoxysilane.

σ: 5.9 ppm (CF—H bond), 3.8 ppm (ethoxy group), 1.2 ppm (ethoxy group)

IR: 1230 cm$^{-1}$ (C—F bond), 1167 cm$^{-1}$ (Si—O bond), 1091 cm$^{-1}$ (Si—O bond)

SYNTHESIS EXAMPLE 13

A four-necked flask equipped with a stirrer, a reflux condenser, a dropping funnel, and a thermometer was charged with 23.6 g of metal magnesium and 500 ml of tetrahydrofuran. 10 g of pentafluorobenzene was added dropwise over five minutes while stirring the mixture in a dry nitrogen stream. When the temperature of the reaction solution reached 40° C., dropwise addition of a mixture of 190 g of pentafluorobenzene and 433 g of triethoxymethylsilane was started. The addition was continued while maintaining the temperature of the reaction solution at 50–60° C. After the addition, the reaction solution was allowed to cool to room temperature and stirred over night at room temperature. The reaction mixture containing a deposited salt was diluted with n-hexane and filtered through celite by suction. The solvent was removed from the filtrate by evaporation under reduced pressure to obtain a crude product. The crude product was purified by distillation under reduced pressure at 3 mmHg and 96° C. to obtain 82 g of a compound.

NMR spectrum (chemical shift σ) and IR spectrum were measured to identify the compound to be pentafluorophenyldiethoxymethylsilane.

σ: 3.8 ppm (ethoxy group), 1.2 ppm (ethoxy group), 0.2 ppm (Si—CH$_3$ group)

IR: 2980 cm$^{-1}$ (ethoxy group), 2896 cm$^{-1}$ (ethoxy group), 1643 cm$^{-1}$ (pentafluorophenyl group), 1520 cm$^{-1}$ (C—F bond), 1466 cm$^{-1}$ (C—F bond), 1168 cm$^{-1}$ (Si—O bond), 1090 cm$^{-1}$ (Si—O bond)

SYNTHESIS EXAMPLE 14

A four-necked flask equipped with a stirrer, a reflux condenser, a dropping funnel, and a thermometer was charged with 4.9 g of metal magnesium and 200 ml of tetrahydrofuran. A mixture of 50 g of 1-bromo-3,5-bis(trifluoromethyl)benzene and 43.3 g of chlorotriethoxyethoxysilane was added dropwise while stirring the reaction solution in a dry nitrogen stream and maintaining the temperature at 50–60° C. After the addition, the reaction solution was allowed to cool to room temperature and stirred over night at room temperature. The reaction mixture containing a deposited salt was diluted with n-hexane and filtered through celite by suction. The solvent was removed from the filtrate by evaporation under reduced pressure to obtain a crude product. The crude product was purified by distillation under reduced pressure at 15 mmHg and 101° C. to obtain 43.2 g of a compound.

NMR spectrum (chemical shift σ) and IR spectrum were measured to identify the compound to be 3,5-bis(trifluoromethyl)phenyldiethoxymethylsilane.

σ: 8.1 ppm (o-position of phenyl group), 7.8 ppm (p-position of phenyl group), 3.8 ppm (ethoxy group), 1.2 ppm (ethoxy group), 0.2 ppm (Si—CH$_3$ group)

IR: 2980 cm$^{-1}$ (ethoxy group), 2897 cm$^{-1}$ (ethoxy group), 1600 cm$^{-1}$ (aromatic group), 1281 cm$^{-1}$ (C—F bond), 1167 cm$^{-1}$ (Si—O bond), 1100 cm$^{-1}$ (Si—O bond)

EXAMPLE 14

Synthesis of Polysiloxane (1)

A three-necked flask equipped with a stirrer, a reflux condenser, and a thermometer was charged with 1.24 g of the compound (C), 2.67 g of the compound (B), 1.09 g of methyltriethoxysilane, 2.5 g of 4-methyl-2-pentanone, and 1.12 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution becomes neutral. The solvent was evaporated under reduced pressure from the organic layer to obtain 2.7 g of a polymer.

NMR spectrum (chemical shift σ), IR spectrum, and Mw of the polymer were measured. The results were as follows.

σ: 2.3 ppm (CH$_2$C(CF$_3$)$_2$ group), 1.4 ppm (t-butyl group), 0.2 ppm (SiCH$_3$ group)

IR: 1730 cm$^{-1}$ (ester group), 1270 cm$^{-1}$ (C—F bond), 1213 cm$^{-1}$ (C—F bond), 1136 cm$^{-1}$ (siloxane group)

Mw: 2,500

EXAMPLE 15

Synthesis of Polysiloxane (1)

A three-necked flask equipped with a stirrer, a reflux condenser, and a thermometer was charged with 1.24 g of the compound (D), 2.67 g of the compound (B), 1.09 g of methyltriethoxysilane, 2.5 g of 4-methyl-2-pentanone, and 1.12 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution becomes neutral. The solvent was evaporated under reduced pressure from the organic layer to obtain 2.6 g of a polymer.

NMR spectrum (chemical shift σ), IR spectrum, and Mw of the polymer were measured. The results were as follows.

σ: 2.3 ppm (CH$_2$C(CF$_3$)$_2$ group), 1.4 ppm (t-butyl group), 0.2 ppm (SiCH$_3$ group)

IR: 1731 cm$^{-1}$ (ester group), 1270 cm$^{-1}$ (C—F bond), 1215 cm$^{-1}$ (C—F bond), 1130 cm$^{-1}$ (siloxane group)

Mw: 2,600

EXAMPLE 16

Synthesis of Polysiloxane (1)

A three-necked flask equipped with a stirrer, a reflux condenser, and a thermometer was charged with 1.05 g of the compound (A), 2.16 g of the compound (B), 1.79 g of the compound (E), 2.5 g of 4-methyl-2-pentanone, and 0.90 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution becomes neutral. The solvent was evaporated under reduced pressure from the organic layer to obtain 3.0 g of a polymer.

NMR spectrum (chemical shift σ), IR spectrum, and Mw of the polymer were measured. The results were as follows.

σ: 2.3 ppm ($CH_2C(CF_3)_2$ group), 2.1 ppm (acetyl group), 1.4 ppm (t-butyl group)

IR: 1730 $cm^{-1}$ (ester group), 1265 $cm^{-1}$ (C—F bond), 1215 $cm^{-1}$ (C—F bond), 1130 $cm^{-1}$ (siloxane group)

Mw: 2,600

EXAMPLE 17

Synthesis of Polysiloxane (1)

A three-necked flask equipped with a stirrer, a reflux condenser, and a thermometer was charged with 0.84 g of the compound (A), 1.74 g of the compound (B), 1.42 g of octafluorocyclopentyltriethoxysilane obtained in Synthesis Example 10, 2.0 g of 4-methyl-2-pentanone, and 0.73 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution becomes neutral. The solvent was evaporated under reduced pressure from the organic layer to obtain 2.4 g of a polymer.

NMR spectrum (chemical shift σ), IR spectrum, and Mw of the polymer were measured. The results were as follows.

σ: 5.9 ppm (CF—H bond), 2.3 ppm ($CH_2C(CF_3)_2$ group), 1.4 ppm (t-butyl group)

IR: 1730 $cm^{-1}$ (ester group), 1290 $cm^{-1}$ (C—F bond), 1230 $cm^{-1}$ (C—F bond), 1133 $cm^{-1}$ (siloxane group)

Mw: 2,200

EXAMPLE 18

Synthesis of Polysiloxane (1)

A three-necked flask equipped with a stirrer, a reflux condenser, and a thermometer was charged with 0.89 g of the compound (A), 1.84 g of the compound (B), 1.26 g of pentafluorophenyldiethoxymethylsilane obtained in Synthesis Example 11, 2 g of 4-methyl-2-pentanone, and 0.77 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution becomes neutral. The solvent was evaporated under reduced pressure from the organic layer to obtain 2.5 g of a polymer.

NMR spectrum (chemical shift σ), IR spectrum, and Mw of the polymer were measured. The results were as follows.

σ: 2.3 ppm ($CH_2C(CF_3)_2$ group), 1.4 ppm (t-butyl group), 0.2 ppm ($SiCH_3$ group)

IR: 1700 $cm^{-1}$ (ester group), 1643 $cm^{-1}$ (phenyl group), 1475 $cm^{-1}$ (C—F bond), 1296 $cm^{-1}$ (C—F bond), 1213 $cm^{-1}$ (C—F bond), 1095 $cm^{-1}$ (siloxane group)

Mw: 2,100

EXAMPLE 19

Synthesis of Polysiloxane (1)

A three-necked flask equipped with a stirrer, a reflux condenser, and a thermometer was charged with 0.85 g of the compound (A), 1.76 g of the compound (B), 1.39 g of 3,5-bis(trifluoromethyl)phenyldiethoxymethylsilane obtained in Synthesis Example 12, 2 g of 4-methyl-2-pentanone, and 0.74 g of a 1.75 wt % aqueous solution of oxalic acid. The mixture was reacted for six hours at 80° C. while stirring. The reaction was terminated by cooling the flask with ice. The reaction mixture was poured into a separating funnel to remove the water layer. The organic layer was washed with ion-exchanged water until the reaction solution becomes neutral. The solvent was evaporated under reduced pressure from the organic layer to obtain 2.3 g of a polymer.

NMR spectrum (chemical shift σ), IR spectrum, and Mw of the polymer were measured. The results were as follows.

σ: 8.2–7.8 ppm (aromatic group), 2.3 ppm ($CH_2C(CF_3)_2$ group), 1.4 ppm (t-butyl group), 0.2 ppm (Si—$CH_3$ group)

IR: 1703 $cm^{-1}$ (ester group), 1612 $cm^{-1}$ (phenyl group), 1366 $cm^{-1}$ (C—F bond), 1282 $cm^{-1}$ (C—F bond), 1215 $cm^{-1}$ (C—F bond), 1140 $cm^{-1}$ (siloxane group)

Mw: 2,200

EVALUATION EXAMPLE 7

Evaluation of Radiation Transmittance

The transmittance of the polysiloxanes obtained in Examples 14–19 at wavelength of 157 nm was measured using a film with a thickness of 1,000 Å. The results are shown in Table 6.

TABLE 6

| Polysiloxane (1) | Radiation transmittance (%) (157 nm) |
| --- | --- |
| Example 14 | 56.1 |
| Example 15 | 55.9 |
| Example 16 | 53.3 |
| Example 17 | 59.8 |
| Example 18 | 56.3 |
| Example 19 | 60.1 |

SYNTHESIS EXAMPLE 15

A three-necked flask equipped with a stirrer, a reflux condenser, and a thermometer was charged with 3.0 g of the compound (B) and 10 ml of tetrahydrofuran. The mixture was stirred in a nitrogen stream while cooling with ice. When the mixture was cooled to 5° C., 16.7 mg of 4-dimethylaminopyridine was added and a solution of 1.64 g of di-t-butyldicarbonate in 5 ml of tetrahydrofuran was added dropwise over 15 minutes. After the addition, the mixture was stirred for one hour, allowed to cool to room temperature, and stirred for a further five hours. After the addition of 50 ml of n-hexane, the reaction mixture was poured into a separating funnel. The organic layer was washed three times with ice-cooled water. The organic layer was charged into a beaker, and dried over anhydrous magnesium sulfate. The solvent was evaporated under reduced pressure to obtain a crude product. The crude product was purified by silica gel chromatography to obtain 3.5 g of the compound from the n-hexane fraction.

As a result of NMR spectrum (chemical shift σ) measurement, this compound was identified to be a compound (F) shown by the following formula (F).

σ: 3.8 ppm (ethoxy group), 1.2 ppm (ethoxy group), 1.5 ppm (t-butyl group)

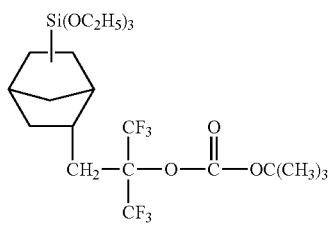

(F)

wherein the silicon atom bonds to the 2-position or 3-position of the bicyclo[2.2.1]heptane ring.

SYNTHESIS EXAMPLE 16

A three-necked flask equipped with a stirrer, a reflux condenser, and a thermometer was charged with 18.1 g of triethoxysilane and 25.0 g of 8-[2-hydroxy-2,2-bis(trifluoromethyl)ethyl]tetracyclo-[4.4.0.1$^{2,5}$.1$^{7,10}$]dodec-3-ene. The mixture was stirred at room temperature and 0.2 ml of a 0.2 mol chloroplatinic acid solution in i-propyl alcohol was added to initiate the reaction. The reaction was continued for 70 hours at 150° C. while refluxing. The reaction mixture was allowed to cool to room temperature, diluted with n-hexane, and filtered through celite by suction. The solvent was removed from the filtrate by evaporation under reduced pressure to obtain a crude product. The crude product was purified by silica gel column chromatography to obtain 19.4 g of the compound from the n-hexane fraction.

As a result of NMR spectrum (chemical shift σ) measurement, this compound was identified to be a compound (G) shown by the following formula (G).

σ: 3.8 ppm (ethoxy group), 1.2 ppm (ethoxy group)

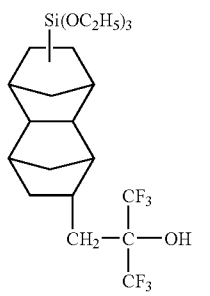

(G)

wherein the silicon atom bonds to the 3-position or 4-position of the tetracyclo[4.4.0.1$^{2,5}$.1$^{7,10}$]dodecane ring.

SYNTHESIS EXAMPLE 17

A three-necked flask equipped with a stirrer, a reflux condenser, and a thermometer was charged with 64.6 g of triethoxysilane and 100 g of 8-trifluoromethyl-8-t-butoxycarbonyltetracyclo[4.4.0.1$^{2,5}$.1$^{7,10}$]dodec-3-ene. The mixture was stirred at room temperature and 5.0 ml of a 0.2 mol chloroplatinic acid solution in i-propyl alcohol was added to initiate the reaction. The reaction was continued for 75 hours at 150° C. while refluxing. The reaction mixture was allowed to cool to room temperature, diluted with n-hexane, and filtered through celite by suction. The solvent was removed from the filtrate by evaporation under reduced pressure to obtain a crude product. The crude product was purified by distillation under reduced pressure at 0.2 mmHg and a temperature of 145° C. to obtain 50 g of a compound.

As a result of NMR spectrum (chemical shift σ) measurement, this compound was identified to be a compound (H) shown by the following formula (H).

σ: 3.8 ppm (ethoxy group), 1.2 ppm (ethoxy group), 1.4 ppm (t-butyl group)

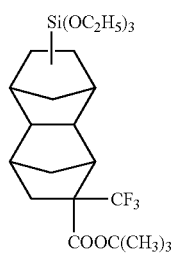

(H)

wherein the silicon atom bonds to the 3-position or 4-position of the tetracyclo[4.4.0.1$^{2,5}$.1$^{7,10}$]dodecane ring.

SYNTHESIS EXAMPLE 18

A three-necked flask equipped with a stirrer, a reflux condenser, and a thermometer was charged with 23.0 g of triethoxysilane and 30 g of 5-fluoro-5-[hydroxybis(trifluoromethyl)methyl]bicyclo-[2.2.1]hept-2-ene. The mixture was stirred at room temperature and 0.1 ml of a 0.2 mol chloroplatinic acid solution in i-propyl alcohol was added to initiate the reaction. The reaction was continued for 30 hours at 100° C. while refluxing. The reaction mixture was allowed to cool to room temperature, diluted with n-hexane, and filtered through celite by suction. The solvent was removed from the filtrate by evaporation under reduced pressure to obtain a crude product. The crude product was purified by distillation under reduced pressure at 3 mmHg and a temperature of 100° C. to obtain 45.3 g of a compound.

As a result of NMR spectrum (chemical shift σ) measurement, this compound was identified to be a compound (I) shown by the following formula (I).

σ: 3.8 ppm (ethoxy group), 1.2 ppm (ethoxy group)

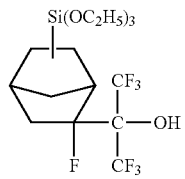

(I)

wherein the silicon atom bonds to the 2-position or 3-position of the bicyclo[2.2.1]heptane ring.

SYNTHESIS EXAMPLE 19

A three-necked flask equipped with a stirrer, a reflux condenser, and a thermometer was charged with 20.3 g of triethoxysilane and 30 g of 5-[hydroxybis(trifluoromethyl)

methyl]-6,6-difluorobicyclo-[2.2.1]hept-2-ene. The mixture was stirred at room temperature and 0.1 ml of a 0.2 mol chloroplatinic acid solution in i-propyl alcohol was added to initiate the reaction. The reaction was continued for 30 hours at 100° C. while refluxing. The reaction mixture was allowed to cool to room temperature, diluted with n-hexane, and filtered through celite by suction. The solvent was removed from the filtrate by evaporation under reduced pressure to obtain a crude product. The crude product was purified by distillation under reduced pressure at 3 mmHg and a temperature of 93° C. to obtain 40.7 g of a compound.

As a result of NMR spectrum (chemical shift σ) measurement, this compound was identified to be a compound (J) shown by the following formula (J)

σ: 3.8 ppm (ethoxy group), 1.2 ppm (ethoxy group)

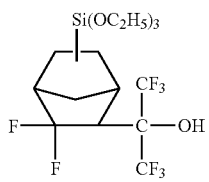

(J)

wherein the silicon atom bonds to the 2-position or 3-position of the bicyclo[2.2.1]heptane ring.

SYNTHESIS EXAMPLE 20

A three-necked flask equipped with a stirrer, a reflux condenser, and a thermometer was charged with 10 g of the compound (I) and 20 ml of tetrahydrofuran. The mixture was stirred in a nitrogen stream while cooling with ice. When the mixture was cooled to 5° C., 55 mg of 4-dimethylaminopyridine was added and a solution of 6.4 g of di-t-butyldicarbonate in 10 ml of tetrahydrofuran was added dropwise over 15 minutes. After the addition, the mixture was stirred for one hour, allowed to cool to room temperature, and stirred for a further five hours. After the addition of 100 ml of n-hexane, the reaction mixture was poured into a separating funnel. The organic layer was washed three times with ice-cooled water. The organic layer was charged into a beaker, and dried over anhydrous magnesium sulfate. The solvent was evaporated under reduced pressure to obtain a crude product. The crude product was purified by silica gel column chromatography to obtain 6.8 g of the compound from the n-hexane fraction.

As a result of NMR spectrum (chemical shift σ) measurement, this compound was identified to be a compound (K) shown by the following formula (K).

σ: 3.8 ppm (ethoxy group), 1.2 ppm (ethoxy group), 1.5 ppm (t-butyl group)

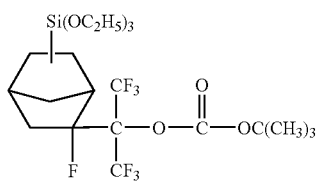

(K)

wherein the silicon atom bonds to the 2-position or 3-position of the bicyclo[2.2.1]heptane ring.

SYNTHESIS EXAMPLE 21

A three-necked flask equipped with a stirrer, a reflux condenser, and a thermometer was charged with 10 g of the compound (J) and 20 ml of tetrahydrofuran. The mixture was stirred in a nitrogen stream while cooling with ice. When the mixture was cooled to 5° C., 51 mg of 4-dimethylaminopyridine was added and a solution of 5.92 g of di-t-butyldicarbonate in 10 ml of tetrahydrofuran was added dropwise over 15 minutes. After the addition, the mixture was stirred for one hour, allowed to cool to room temperature, and stirred for a further five hours. After the addition of 100 ml of n-hexane, the reaction mixture was poured into a separating funnel. The organic layer was washed three times with ice-cooled water. The organic layer was charged into a beaker, and dried over anhydrous magnesium sulfate. The solvent was evaporated under reduced pressure to obtain a crude product. The crude product was purified by silica gel chromatography to obtain 6.5 g of a compound from the n-hexane fraction.

As a result of NMR spectrum (chemical shift σ) measurement, this compound was identified to be a compound (L) shown by the following formula (L).

σ: 3.8 ppm (ethoxy group), 1.2 ppm (ethoxy group), 1.5 ppm (t-butyl group)

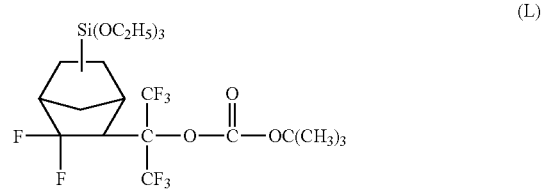

(L)

wherein the silicon atom bonds to the 2-position or 3-position of the bicyclo[2.2.1]heptane ring.

SYNTHESIS EXAMPLE 22

A three-necked flask equipped with a stirrer, a reflux condenser, and a thermometer was charged with 20.8 g of triethoxysilane and 25 g of 5-trifluoromethyl-5-acetoxy-6,6-difluorobicyclo[2.2.1]hept-2-ene. The mixture was stirred at room temperature and 0.1 ml of a 0.2 mol chloroplatinic acid solution in i-propyl alcohol was added to initiate the reaction. The reaction was continued for 30 hours at 100° C. while refluxing. The reaction mixture was allowed to cool to room temperature, diluted with n-hexane, and filtered through celite by suction. The solvent was removed from the filtrate by evaporation under reduced pressure to obtain a crude product. The crude product was purified by distillation under reduced pressure at 5 mmHg and a temperature of 85° C. to obtain 33.1 g of a compound.

As a result of NMR spectrum (chemical shift σ) measurement, this compound was identified to be a compound (M) shown by the following formula (M).

σ: 3.8 ppm (ethoxy group), 2.2 ppm (acetoxy group), 1.2 ppm (ethoxy group)

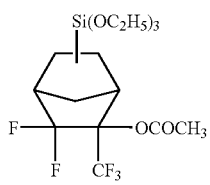

(M)

wherein the silicon atom bonds to the 2-position or 3-position of the bicyclo[2.2.1]heptane ring.

SYNTHESIS EXAMPLE 23

A three-necked flask equipped with a stirrer, a reflux condenser, and a thermometer was charged with 31.0 g of triethoxysilane and 30 g of 5,6,6-trifluoro-5-acetoxybicyclo[2.2.1]hept-2-ene. The mixture was stirred at room temperature and 0.1 ml of a 0.2 mol chloroplatinic acid solution in i-propyl alcohol was added to initiate the reaction. The reaction was continued for 30 hours at 100° C. while refluxing. The reaction mixture was allowed to cool to room temperature, diluted with n-hexane, and filtered through celite by suction. The solvent was removed from the filtrate by evaporation under reduced pressure to obtain a crude product. The crude product was purified by distillation under reduced pressure at 5 mmHg and a temperature of 95° C. to obtain 44.2 g of a compound.

As a result of NMR spectrum (chemical shift σ) measurement, this compound was identified to be a compound (N) shown by the following formula (N).

σ: 3.8 ppm (ethoxy group), 2.3 ppm (acetoxy group), 1.2 ppm (ethoxy group)

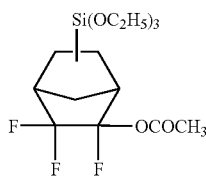

(N)

wherein the silicon atom bonds to the 2-position or 3-position of the bicyclo[2.2.1]heptane ring.

SYNTHESIS EXAMPLE 24

A three-necked flask equipped with a stirrer, a reflux condenser, and a thermometer was charged with 32.8 g of triethoxysilane and 30 g of 5,5-difluorobicyclo[2.2.1]hept-2-ene. The mixture was stirred at room temperature and 0.1 ml of a 0.2 mol chloroplatinic acid solution in i-propyl alcohol was added to initiate the reaction. The reaction was continued for 30 hours at 100° C. while refluxing. The reaction mixture was allowed to cool to room temperature, diluted with n-hexane, and filtered through celite by suction. The solvent was removed from the filtrate by evaporation under reduced pressure to obtain a crude product. The crude product was purified by distillation under reduced pressure at 5 mmHg and a temperature of 85° C. to obtain 38.8 g of a compound.

As a result of NMR spectrum (chemical shift σ) measurement, this compound was identified to be a compound (O) shown by the following formula (O).

σ: 3.8 ppm (ethoxy group), 1.2 ppm (ethoxy group)

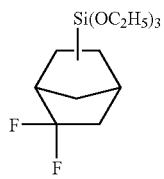

(O)

wherein the silicon atom bonds to the 2-position or 3-position of the bicyclo[2.2.1]heptane ring.

SYNTHESIS EXAMPLE 25

A 50 ml pressure vessel was charged with 6.2 g of triethoxysilane and 10 g of octafluorocyclopentene. After the addition of 0.1 ml of a 0.2 mol chloroplatinic acid solution in i-propyl alcohol, the vessel was sealed and heated at 140° C. for 24 hours. The crude product was purified by distillation under reduced pressure at 30 mmHg and 65° C. to obtain 3.5 g of a compound.

As a result of NMR spectrum (chemical shift σ) measurement, this compound was identified to be a compound (P) shown by the following formula (P).

σ: 5.9 ppm (CF—H bond), 3.8 ppm (ethoxy group), 1.2 ppm (ethoxy group)

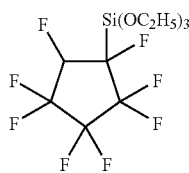

(P)

SYNTHESIS EXAMPLE 26

A 50 ml pressure vessel was charged with 5.1 g of triethoxysilane and 10 g of decafluorocyclohexene. After the addition of 0.1 ml of a 0.2 mol chloroplatinic acid solution in i-propyl alcohol, the vessel was sealed and heated at 140° C. for 24 hours. The crude product was purified by distillation under reduced pressure at 30 mmHg and 68° C. to obtain 3.7 g of a compound.

As a result of NMR spectrum (chemical shift σ) measurement, this compound was identified to be a compound (Q) shown by the following formula (Q).

σ: 5.9 ppm (CF—H bond), 3.8 ppm (ethoxy group), 1.2 ppm (ethoxy group)

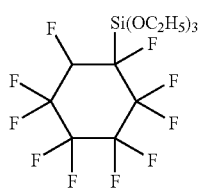

(Q)

SYNTHESIS EXAMPLE 27

A three-necked flask equipped with a stirrer, a reflux condenser, and a thermometer was charged with 17.2 g of triethoxysilane and 30 g of 5,6,6-trifluoro-5-(3-methoxycarbonyl-1,1,2,2,3,3-hexafluoro-n-propoxy)bicyclo[2.2.1]hept-2-ene. The mixture was stirred at room temperature and 1.0 ml of a 0.2 mol chloroplatinic acid solution in i-propyl alcohol was added to initiate the reaction. The reaction was continued for 48 hours at 100° C. while refluxing. The reaction mixture was allowed to cool to room temperature, diluted with n-hexane, and filtered through celite by suction. The solvent was removed from the filtrate by evaporation under reduced pressure to obtain a crude product. The crude product was purified by silica gel column chromatography to obtain 38 g of a compound.

As a result of NMR spectrum (chemical shift σ) measurement, this compound was identified to be a compound (R) shown by the following formula (R).

σ: 3.8 ppm (ethoxy group), 3.6 ppm (methoxy group), 1.2 ppm (ethoxy group)

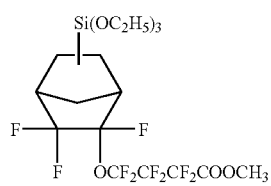

(R)

wherein the silicon atom bonds to the 2-position or 3-position of the bicyclo[2.2.1]heptane ring.

SYNTHESIS EXAMPLE 28

A three-necked flask equipped with a stirrer, a reflux condenser, and a thermometer was charged with 12.9 g of triethoxysilane and 25 g of 5,6,6-trifluoro-5-(3-t-butoxycarbonyl-1,1,2,2,3,3-hexafluoro-n-propoxy)bicyclo[2.2.1]hept-2-ene. The mixture was stirred at room temperature and 1.0 ml of a 0.2 mol chloroplatinic acid solution in i-propyl alcohol was added to initiate the reaction. The reaction was continued for 48 hours at 100° C. while refluxing. The reaction mixture was allowed to cool to room temperature, diluted with n-hexane, and filtered through celite by suction. The solvent was removed from the filtrate by evaporation under reduced pressure to obtain a crude product. The crude product was purified by silica gel column chromatography to obtain 32 g of a compound.

As a result of NMR spectrum (chemical shift σ) measurement, this compound was identified to be a compound (S) shown by the following formula (S).

σ: 3.8 ppm (ethoxy group), 1.2 ppm (ethoxy group), 1.4 ppm (t-butyl group)

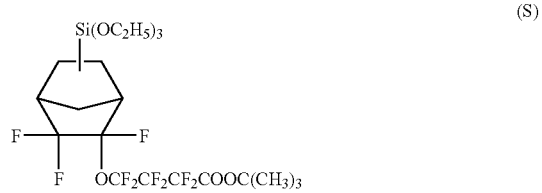

(S)

wherein the silicon atom bonds to the 2-position or 3-position of the bicyclo[2.2.1]heptane ring.

EXAMPLES 20–35

Synthesis of Polysiloxane (1)

Acid Polycondensation Reaction

A three-necked flask equipped with a stirrer, a reflux condenser, and a thermometer was charged with the compounds obtained in the above Synthesis Examples, 4-methyl-2-pentanone (MIBK), and 1.75 wt % oxalic acid aqueous solution (OAS). The mixture was reacted for the period of time at the temperature shown in Table 7-1. The reaction was terminated by cooling the flask with ice. The reaction mixture was poured into a separating funnel to remove the water layer. The organic layer was washed with ion-exchanged water until the reaction solution becomes neutral. The solvent was removed from the organic layer by evaporation under reduced pressure to obtain intermediate polymers.

Base Condensation Reaction

The intermediate polymers were dissolved in MIBK of the amount shown in Table 7-2, triethylamine (TEA) and distilled water of the amount shown in Table 7-2 were added, and the mixture was heated at 60° C. in a nitrogen stream. After six hours, the reaction solution was cooled with ice while stirring, then a solution of oxalic acid in 20-fold distilled water was added, followed by further stirring. The reaction mixture was poured into a separating funnel to remove the water layer. The organic layer was repeatedly washed with ion-exchanged water until the reaction solution becomes neutral. The solvent was removed from the organic layer to obtain the polysiloxane (1).

Mw, Mw/Mn, and yield of each polysiloxane (1) obtained are shown in Table 7-2.

TABLE 7-1

(Acid polycondensation reaction)

| | Compound (g) | | | MIBK (g) | 1.75 wt % OAS | Temp. (° C.) | Time |
|---|---|---|---|---|---|---|---|
| Example 20 | C(12.02) | B(17.98) | — | 30 | 5.47 | 80 | 6 |
| Example 21 | C(3.42) | B(12.54) | A(4.05) | 20 | 3.5 | 80 | 6 |
| Example 22 | C(5.07) | B(12.4) | F(2.54) | 20 | 3.46 | 60 | 10 |
| Example 23 | F(15.61) | H(4.39) | — | 20 | 3.26 | 80 | 6 |

TABLE 7-1-continued (Acid polycondensation reaction)

|  | Compound (g) | | | MIBK (g) | 1.75 wt % OAS | Temp. (° C.) | Time |
|---|---|---|---|---|---|---|---|
| Example 24 | C(5.03) | B(10.25) | G(4.72) | 20 | 3.43 | 80 | 6 |
| Example 25 | C(7.01) | I(12.99) | — | 20 | 3.59 | 80 | 6 |
| Example 26 | L(5.12) | J(9.88) | — | 15 | 2.16 | 60 | 10 |
| Example 27 | K(5.17) | I(9.83) | — | 15 | 2.33 | 60 | 10 |
| Example 28 | C(2.61) | B(9.59) | E(2.8) | 15 | 2.67 | 80 | 6 |
| Example 29 | C(2.57) | B(9.42) | M(3.01) | 15 | 2.63 | 80 | 6 |
| Example 30 | C(2.63) | B(9.65) | N(2.72) | 15 | 2.69 | 80 | 6 |
| Example 31 | C(2.73) | B(10.03) | O(2.24) | 15 | 2.79 | 80 | 6 |
| Example 32 | C(2.62) | B(9.62) | P(2.75) | 15 | 2.68 | 80 | 6 |
| Example 33 | C(2.56) | B(9.39) | Q(3.05) | 15 | 2.62 | 80 | 6 |
| Example 34 | C(2.43) | B(8.93) | P(3.64) | 15 | 2.49 | 80 | 6 |
| Example 35 | S(3.72) | B(11.28) | — | 15 | 2.36 | 80 | 6 |

TABLE 7-2

(Base polycondensation reaction)

| | MIBK (g) | TEA (g) | Distilled water (g) | Oxalic acid (g) | Mw | Mw/Mn | Yield (g) |
|---|---|---|---|---|---|---|---|
| Example 20 | 65.1 | 11.31 | 8.06 | 9.4 | 2,000 | 1.0 | 21.2 |
| Example 21 | 44.1 | 7.23 | 5.15 | 6.01 | 1,800 | 1.0 | 14.4 |
| Example 22 | 44.3 | 7.15 | 5.09 | 5.94 | 1,800 | 1.0 | 14.1 |
| Example 23 | 45.2 | 6.75 | 4.81 | 5.61 | 1,700 | 1.1 | 14.5 |
| Example 24 | 44.4 | 7.09 | 5.06 | 5.9 | 1,800 | 1.1 | 14.1 |
| Example 25 | 43.7 | 7.42 | 5.29 | 6.17 | 2,000 | 1.0 | 13.9 |
| Example 26 | 35.2 | 4.47 | 3.19 | 3.72 | 2,000 | 1.1 | 11.1 |
| Example 27 | 34.4 | 4.81 | 3.43 | 4.0 | 2,000 | 1.1 | 10.4 |
| Example 28 | 32.9 | 5.53 | 3.94 | 4.6 | 1,800 | 1.1 | 10.5 |
| Example 29 | 33.1 | 5.43 | 3.87 | 4.52 | 1,800 | 1.1 | 10.2 |
| Example 30 | 32.8 | 5.56 | 3.97 | 4.63 | 1,800 | 1.1 | 10.4 |
| Example 31 | 32.3 | 5.78 | 4.12 | 4.81 | 1,800 | 1.1 | 10.3 |
| Example 32 | 32.8 | 5.55 | 3.96 | 4.61 | 1,900 | 1.1 | 10.5 |
| Example 33 | 33.1 | 5.42 | 3.86 | 4.5 | 1,900 | 1.1 | 10.7 |
| Example 34 | 33.7 | 5.15 | 3.67 | 4.28 | 1,800 | 1.1 | 10.8 |
| Example 35 | 34.2 | 4.88 | 3.48 | 4.06 | 1,700 | 1.1 | 11.1 |

EVALUATION EXAMPLE 8

Evaluation of Radiation Transmittance

The radiation transmittance of the polysiloxanes (1) obtained in Examples 20–35 at wavelengths of 200–130 nm was measured using a film with a thickness of 1,000 Å. The results at a wavelength of 157 nm are shown in Table 8.

TABLE 8

| Polysiloxane (1) | Radiation transmittance (%) (157 nm) |
|---|---|
| Example 20 | 61.8 |
| Example 21 | 55.1 |
| Example 22 | 62.4 |
| Example 23 | 63.1 |
| Example 24 | 61.3 |
| Example 25 | 62.5 |
| Example 26 | 65.6 |
| Example 27 | 64.3 |
| Example 28 | 62.8 |
| Example 29 | 63.7 |
| Example 30 | 63.2 |
| Example 31 | 64.1 |
| Example 32 | 66.1 |
| Example 33 | 66.3 |

TABLE 8-continued

| Polysiloxane (1) | Radiation transmittance (%) (157 nm) |
|---|---|
| Example 34 | 64.0 |
| Example 35 | 65.3 |

The results show that the polysiloxanes (1) exhibit superior radiation transmittance at a wavelength of 157 nm.

EVALUATION EXAMPLE 9

Resolution by Exposure to ArF Excimer Laser

Composition solutions were prepared by homogeneously mixing 100 parts by weight of polysiloxanes (1) shown in Table 9 and 900 parts by weight of 2-heptanone with 3 parts by weight of the acid generators (B1), 1 part by weight of the acid generators (B2), and 8 mol % (for the total amount of the acid generators, hereinafter the same) of the acid diffusion controllers, respectively shown in Table 9.

The composition solutions were applied by spin coating onto a silicon wafer substrate on which an under layer film (β-1) was previously formed or a silicon wafer substrate on which an under layer film (d) was previously formed, and pre-baked (PB) for 90 seconds on a hot plate maintained at a temperature shown in Table 3 to form a resist film with a thickness of 1,000 Å.

The under layer film (β-1) was a film with a thickness of 3,000 Å prepared by spin coating the composition solution (β-1) shown below and baking the coating for 60 seconds at 180° C. and for 120 seconds at 300° C. The under layer film (d) was a film with a thickness of 520 Å formed by coating a commercially available antireflection film DUV-30J and baking the coating for 60 seconds at 205° C.

Preparation of Composition Solution (β-1)

A separable flask equipped with a thermometer was charged with 100 parts by weight of acenaphthylene, 78 parts by weight of toluene, 52 parts by weight of dioxane, and 3 parts by weight of azobisisobutyronitrile in a nitrogen atmosphere. The mixture was stirred for 5 hours at 70° C. Next, 5.2 parts by weight of p-toluenesulfonic acid monohydrate and 40 parts by weight of paraformaldehyde were added. After heating to 120° C., the mixture was stirred for 6 hours. The reaction solution was charged into a large amount of isopropanol. The resulting precipitate was collected by filtration and dried at 40° C. under reduced pressure to obtain an under layer film-forming polymer with an Mw of 22,000.

10 parts by weight of the under layer film-forming polymer, 0.5 part by weight of bis(4-t-butylphenyl)iodonium 10-camphorsulfonate, and 0.5 part by weight of 4,4'-[1-{4-(1-[4-hydroxyphenyl]-1-methylethyl)phenyl}-ethylidene] bisphenol were dissolved in 89 parts by weight of cyclohexanone. The solution obtained was filtered using a membrane filter with a pore diameter of 0.1 μm to obtain a composition solution for under layer film-forming polymer (hereinafter referred to as "composition solution (β-1)").

The resist films were exposed to an ArF excimer laser (wavelength: 193 nm, NA=0.60, and σ=0.70) while changing the irradiation dose, baked (PEB) for 90 seconds on a hot plate maintained at a temperature shown in Table 9, and developed in a 2.38 wt % aqueous solution of tetramethylammonium hydroxide, there by forming a line-and-space pattern (1L/1S) fore valuation of resolution. The evaluation results are shown in Table 9.

Components in Table 9 other than the polysiloxanes (1) are as follows. The following component list applies also to Tables 10–12.

Acid Generator (B1)
B1-1: Triphenylsulfonium nonafluoro-n-butanesulfonate
B1-2: Triphenylsulfonium 1,1,2,2-tetrafluoro-2-(norbornan-2-yl)-ethanesulfonate
B1-3: 1,4-Butylene-(1-butoxynaphth-4-yl)sulfonium 1,1,2,2-tetrafluoro-2-(norbornan-2-yl)-ethanesulfonate
B1-4: 1,4-Butylene-(1-butoxynaphth-4-yl)sulfonium nonafluoro-n-butanesulfonate
B1-5: Diphenyliodonium nonafluoro-n-butanesulfonate Acid Generator (B2)
B2-1: Triphenylsulfonium 10-camphorsulfonate
B2-2: 1,4-Butylene-(1-butoxynaphth-4-yl) 10-camphorsulfonate
B2-3: Diphenyliodonium 10-camphorsulfonate
B2-4: Triphenylsulfonium salicylate Acid Diffusion Controller
C-1: Tri-N-octylamine
C-2: 2-Phenylbenzimidazole
C-3: 4-Phenylpyridine Methods for synthesizing the acid generator (B1-2) and the acid generator (B1-3) are described below as Reference Examples.

REFERENCE EXAMPLE 1

A 2 l eggplant-shaped flask was charged with a solution of 20 g of triphenylsulfonium chloride in 500 ml of water. A separately prepared solution of 20 g of sodium 1,1,2,2-tetrafluoro-2-(norbornan-2-yl)ethanesulfonate in 500 ml of water was added dropwise to the solution at room temperature. The mixture was stirred. After 30 minutes, the reactant was extracted with ethyl acetate, the organic layer was washed with water twice, the solvent was evaporated under reduced pressure to obtain the acid generator (B1-2) in a yield of 43 wt %.

REFERENCE EXAMPLE 2

80 g of 1-butoxynaphthalene and 212 g of phosphorus pentaoxide-methanesulfonic acid was charged into a 5 l eggplant-shaped flask and the mixture was stirred for 15 minutes at room temperature. After adding 47 g of tetramethylene sulfoxide dropwise at 0° C., the mixture was stirred for 20 minutes. After slowly increasing the temperature to room temperature, the mixture was stirred for a further one hour. After cooling to 0° C., 2 l of water was added, the reaction solution adjusted to pH 7.0 using 25% ammonia water and stirred for a further one hour. Then, a separately prepared solution of 116 g of sodium 1,1,2,2-tetrafluoro-2-(norbornan-2-yl)ethanesulfonate in 150 ml of water was added to the reaction solution at room temperature. After stirring for one hour at room temperature, the reaction solution was extracted with methylene chloride and the organic layer was washed with water. The methylene chloride was evaporated under reduced pressure. The resulting residue was purified by silica gel column (methylene chloride:methanol=20:1) and further precipitated from a tetrahydrofuran/n-hexane mixture to obtain the acid generator (B1-3) in a yield of 35 wt %.

TABLE 9

(Exposure to ArF excimer laser)

| | Polysiloxane (1) used for radiation-sensitive resin composition | Acid generator | Acid diffusion controller | Substrate | Temperature (° C.) PB | PEB | Resolution (nm) |
|---|---|---|---|---|---|---|---|
| 1 | Example 20 | B1-1 | B2-1 | C-2 | Under layer film (d) | 140 | 90 | 140 |
| 2 | Example 21 | B1-1 | B2-1 | C-2 | Under layer film (d) | 110 | 110 | 130 |
| 3 | Example 22 | B1-1 | B2-1 | C-2 | Under layer film (d) | 140 | 90 | 140 |
| 4 | Example 23 | B1-1 | B2-1 | C-2 | Under layer film (d) | 140 | 90 | 130 |

TABLE 9-continued (Exposure to ArF excimer laser)

| | Polysiloxane (1) used for radiation-sensitive resin composition | Acid generator | | Acid diffusion controller | Substrate | Temperature (° C.) PB | PEB | Resolution (nm) |
|---|---|---|---|---|---|---|---|---|
| 5 | Example 24 | B1-1 | B2-1 | C-2 | Under layer film (d) | 140 | 90 | 130 |
| 6 | Example 25 | B1-1 | B2-1 | C-2 | Under layer film (d) | 140 | 90 | 140 |
| 7 | Example 26 | B1-1 | B2-1 | C-2 | Under layer film (d) | 90 | 90 | 140 |
| 8 | Example 27 | B1-1 | B2-1 | C-2 | Under layer film (d) | 90 | 90 | 140 |
| 9 | Example 28 | B1-1 | B2-1 | C-2 | Under layer film (d) | 140 | 90 | 140 |
| 10 | Example 29 | B1-1 | B2-1 | C-2 | Under layer film (d) | 140 | 90 | 140 |
| 11 | Example 30 | B1-1 | B2-1 | C-2 | Under layer film (d) | 140 | 90 | 140 |
| 12 | Example 31 | B1-1 | B2-1 | C-2 | Under layer film (d) | 140 | 90 | 140 |
| 13 | Example 32 | B1-1 | B2-1 | C-2 | Under layer film (d) | 140 | 90 | 140 |
| 14 | Example 33 | B1-1 | B2-1 | C-2 | Under layer film (d) | 140 | 90 | 140 |
| 15 | Example 34 | B1-1 | B2-1 | C-2 | Under layer film (d) | 140 | 90 | 140 |
| 16 | Example 35 | B1-1 | B2-1 | C-2 | Under layer film (d) | 140 | 100 | 140 |
| 17 | Example 20 | B1-1 | B2-1 | C-1 | Under layer film (d) | 140 | 90 | 140 |
| 18 | Example 20 | B1-1 | B2-1 | C-3 | Under layer film (d) | 140 | 90 | 140 |
| 19 | Example 20 | B1-2 | B2-1 | C-2 | Under layer film (d) | 140 | 90 | 130 |
| 20 | Example 20 | B1-3 | B2-1 | C-2 | Under layer film (d) | 140 | 90 | 140 |
| 21 | Example 20 | B1-4 | B2-2 | C-2 | Under layer film (d) | 140 | 90 | 140 |
| 22 | Example 20 | B1-5 | B2-3 | C-2 | Under layer film (d) | 140 | 90 | 140 |
| 23 | Example 20 | B1-1 | B2-4 | C-2 | Under layer film (d) | 140 | 90 | 140 |
| 24 | Example 20 | B1-1 | B2-1 | C-2 | Under layer film (β-1) | 140 | 90 | 140 |
| 25 | Example 20 | B1-1 | B2-1 | C-2 | Under layer film (β-1) | 110 | 110 | 130 |

EVALUATION EXAMPLE 10

Resolution by Exposure to $F_2$ Excimer Laser

Composition solutions were prepared by homogeneously mixing 100 parts by weight of polysiloxanes (1) shown in Tables 10, 11, and 12 and 1,000 parts by weight of 2-heptanone with 4 parts by weight of the acid generators (B1), 0.5 part by weight of the acid generators (B2), and 8 mol % of the acid diffusion controllers, each shown in Tables 10, 11, and 12.

The composition solutions were applied by spin coating onto a silicon wafer substrate (Si), an SiON substrate, a silicon wafer substrate on which an under layer film (β-1) was previously formed, or a silicon wafer substrate on which an under layer film (d) was previously formed, and prebaked (PB) for 90 seconds on a hot plate maintained at a temperature shown in Tables 10, 11 or 12 to form a resist film with a thickness of 1,200 Å.

The resist films were exposed to an $F_2$ excimer laser (wavelength: 157 nm, NA=0.60) in the case of composition solutions of Tables 10 and 11 and $F_2$ excimer laser (wavelength: 157 nm, NA=0.85) in the case of composition solutions of Tables 12, through a binary mask as a reticle, while changing the irradiation dose, baked (PEB) for 90 seconds on a hot plate maintained at a temperature shown in Tables 10, 11, and 12, and developed in a 2.38 wt % aqueous solution of tetramethylammonium hydroxide, there by forming a line-and-space pattern (1L/1S) for evaluation of resolution. The evaluation results are shown in Tables 10, 11 and 12.

TABLE 10

(Exposure to $F_2$ excimer laser)

| | Polysiloxane (1) used for radiation-sensitive resin composition | Acid generator | | Acid diffusion controller | Substrate | Temperature (° C.) PB | PEB | Resolution (nm) |
|---|---|---|---|---|---|---|---|---|
| 1 | Example 14 | B1-1 | B2-1 | C-2 | Under layer film (d) | 140 | 90 | 80 |
| 2 | Example 14 | B1-1 | B2-1 | C-2 | Under layer film (β-1) | 140 | 90 | 80 |
| 3 | Example 15 | B1-1 | B2-1 | C-2 | Under layer film (d) | 140 | 100 | 80 |
| 4 | Example 15 | B1-1 | B2-1 | C-2 | Under layer film (β-1) | 140 | 100 | 80 |
| 5 | Example 16 | B1-1 | B2-1 | C-2 | Under layer film (d) | 140 | 100 | 85 |
| 6 | Example 16 | B1-1 | B2-1 | C-2 | Under layer film (β-1) | 140 | 100 | 80 |
| 7 | Example 17 | B1-1 | B2-1 | C-2 | Under layer film (d) | 140 | 110 | 80 |
| 8 | Example 17 | B1-1 | B2-1 | C-2 | Under layer film (β-1) | 140 | 110 | 80 |
| 9 | Example 20 | B1-1 | B2-1 | C-2 | Si | 140 | 90 | 80 |
| 10 | Example 20 | B1-1 | B2-1 | C-2 | Under layer film (d) | 140 | 90 | 70 |
| 11 | Example 20 | B1-1 | B2-1 | C-2 | Under layer film (β-1) | 140 | 90 | 70 |
| 12 | Example 20 | B1-1 | B2-1 | C-2 | SiON | 140 | 90 | 70 |
| 13 | Example 20 | B1-1 | B2-1 | C-1 | Under layer film (β-1) | 140 | 90 | 75 |
| 14 | Example 20 | B1-1 | B2-1 | C-3 | Under layer film (β-1) | 140 | 90 | 70 |
| 15 | Example 20 | B1-2 | B2-1 | C-2 | Under layer film (β-1) | 140 | 90 | 70 |

TABLE 10-continued (Exposure to $F_2$ excimer laser)

| | Polysiloxane (1) used for radiation-sensitive resin composition | Acid generator | Acid diffusion controller | Substrate | Temperature (° C.) PB | Temperature (° C.) PEB | Resolution (nm) |
|---|---|---|---|---|---|---|---|
| 16 | Example 20 | B1-3 | B2-1 | C-2 | Under layer film (β-1) | 140 | 90 | 70 |
| 17 | Example 20 | B1-4 | B2-2 | C-2 | Under layer film (β-1) | 140 | 90 | 70 |
| 18 | Example 20 | B1-5 | B2-3 | C-2 | Under layer film (β-1) | 140 | 90 | 75 |
| 19 | Example 20 | B1-1 | B2-4 | C-2 | Under layer film (β-1) | 140 | 90 | 75 |

TABLE 11

(Exposure to $F_2$ excimer laser)

| | Polysiloxane (1) used for radiation-sensitive resin composition | Acid generator | Acid diffusion controller | Substrate | PB | PEB | Resolution (nm) |
|---|---|---|---|---|---|---|---|
| 20 | Example 21 | B1-1 | B2-1 | C-2 | Si | 110 | 110 | 70 |
| 21 | Example 21 | B1-1 | B2-1 | C-2 | SiON | 110 | 110 | 70 |
| 22 | Example 21 | B1-1 | B2-1 | C-2 | Under layer film (β-1) | 110 | 110 | 70 |
| 23 | Example 22 | B1-1 | B2-1 | C-2 | Si | 90 | 90 | 70 |
| 24 | Example 22 | B1-1 | B2-1 | C-2 | SiON | 90 | 90 | 70 |
| 25 | Example 22 | B1-1 | B2-1 | C-2 | Under layer film (β-1) | 90 | 90 | 70 |
| 26 | Example 23 | B1-5 | B2-3 | C-2 | Under layer film (β-1) | 140 | 90 | 70 |
| 27 | Example 24 | B1-1 | B2-4 | C-2 | Under layer film (β-1) | 140 | 90 | 70 |
| 28 | Example 25 | B1-1 | B2-1 | C-2 | Under layer film (β-1) | 140 | 90 | 70 |
| 29 | Example 26 | B1-1 | B2-1 | C-2 | Under layer film (β-1) | 90 | 90 | 70 |
| 30 | Example 27 | B1-4 | B2-2 | C-2 | Under layer film (β-1) | 90 | 90 | 70 |
| 31 | Example 28 | B1-5 | B2-3 | C-2 | Under layer film (β-1) | 140 | 90 | 70 |
| 32 | Example 29 | B1-1 | B2-4 | C-2 | Under layer film (β-1) | 140 | 90 | 70 |
| 33 | Example 30 | B1-1 | B2-1 | C-2 | Under layer film (β-1) | 140 | 90 | 70 |
| 34 | Example 31 | B1-1 | B2-1 | C-2 | Under layer film (β-1) | 110 | 90 | 70 |
| 35 | Example 32 | B1-1 | B2-1 | C-2 | Under layer film (β-1) | 110 | 90 | 70 |
| 36 | Example 33 | B1-4 | B2-2 | C-2 | Under layer film (β-1) | 140 | 90 | 70 |
| 37 | Example 34 | B1-5 | B2-3 | C-2 | Under layer film (β-1) | 140 | 90 | 70 |
| 38 | Example 35 | B1-1 | B2-4 | C-2 | Under layer film (β-1) | 140 | 100 | 70 |

TABLE 12

(Exposure to $F_2$ excimer laser)

| | Polysiloxane (1) used for radiation-sensitive resin composition | Acid generator | Acid diffusion controller | Substrate | PB | PEB | Resolution (nm) |
|---|---|---|---|---|---|---|---|
| 39 | Example 20 | B1-1 | B2-1 | C-2 | Under layer film (d) | 140 | 90 | 55 |
| 40 | Example 20 | B1-1 | B2-1 | C-2 | Under layer film (β-1) | 140 | 90 | 55 |
| 41 | Example 20 | B1-1 | B2-1 | C-2 | SiON | 140 | 90 | 60 |
| 42 | Example 20 | B1-1 | B2-1 | C-1 | Under layer film (β-1) | 140 | 90 | 55 |
| 43 | Example 20 | B1-2 | B2-1 | C-2 | Under layer film (β-1) | 140 | 90 | 50 |
| 44 | Example 21 | B1-1 | B2-1 | C-2 | Under layer film (d) | 140 | 110 | 55 |
| 45 | Example 21 | B1-1 | B2-1 | C-2 | Under layer film (β-1) | 140 | 110 | 55 |
| 46 | Example 21 | B1-2 | B2-1 | C-2 | Under layer film (d) | 140 | 110 | 50 |
| 47 | Example 21 | B1-2 | B2-1 | C-2 | Under layer film (β-1) | 140 | 110 | 50 |
| 48 | Example 22 | B1-1 | B2-1 | C-2 | Under layer film (d) | 110 | 90 | 60 |
| 49 | Example 22 | B1-1 | B2-1 | C-2 | Under layer film (β-1) | 110 | 90 | 60 |
| 50 | Example 22 | B1-2 | B2-1 | C-2 | Under layer film (d) | 110 | 90 | 55 |
| 51 | Example 22 | B1-2 | B2-1 | C-2 | Under layer film (β-1) | 110 | 90 | 55 |
| 52 | Example 23 | B1-1 | B2-1 | C-2 | Under layer film (β-1) | 140 | 90 | 50 |
| 53 | Example 23 | B1-2 | B2-1 | C-2 | Under layer film (β-1) | 140 | 90 | 50 |

INDUSTRIAL APPLICABILITY

The polysiloxanes (1) of the present invention exhibit high transparency to radiation of a wavelength of 193 nm or less, particularly to radiation of a wavelength of 157 nm or less, maintain high transparency to radiation of entire wavelength in the range of 160–130 nm, including 147 nm, 134 nm, and the like, and exhibit superior dry etching resistance and resolution properties. The polysiloxane (1) produced by the process of the present invention that includes an acid polycondensation reaction and a base condensation reaction has a narrow molecular weight distribution and can produce a resist exhibiting excellent resolution and pattern profile. Therefore, the radiation sensitive resin composition containing the polysiloxane (1) of the present invention exhibits a high sensitivity to short wavelength radiation and can form fine resist patterns at high precision. The resin composition can be extremely useful for fabricating semiconductor devices, which will become more and more minute in the future.

What is claimed is:

1. A polysiloxane having a structural unit (I) and/or structural unit (II) shown by the following formula (1), having an acid-dissociable group dissociable with an acid, and possessing a polystyrene-reduced weight average molecular weight determined by gel permeation chromatography (GPC) in the range of 500–1,000,000,

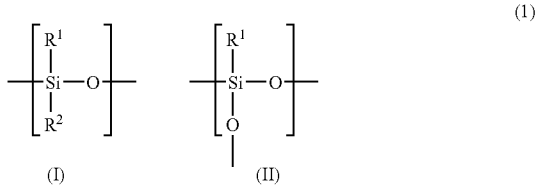

(1)

wherein $R^1$ represents: a monovalent aromatic group having 6–20 carbon atoms substituted with at least one group selected from the group consisting of a fluorine atom and a fluoroalkyl group having 1–10 carbon atoms; or a monovalent alicyclic group having 3–15 carbon atoms substituted with at least one group selected from the group consisting of a fluorine atom and a fluoroalkyl group having 1–10 carbon atoms; wherein the monovalent aromatic group or the monovalent alicyclic group is optionally substituted with a monovalent organic group comprising an acid-dissociable group, a halogen atom other than fluorine, an alkyl group having 1–10 carbon atoms, a hydroxyl group, or a carboxyl group; and $R^2$ represents: a monovalent aromatic group having 6–20 carbon atoms substituted with at least one group selected from the group consisting of a fluorine atom and a fluoroalkyl group having 1–10 carbon atoms; a monovalent alicyclic group having 3–15 carbon atoms substituted with at least one group selected from the group consisting of a fluorine atom and a fluoroalkyl group having 1–10 carbon atoms; a hydrogen atom; a halogen atom; a monovalent hydrocarbon group having 1–20 carbon atoms; a haloalkyl group having 1–20 carbon atoms; or a primary, secondary, or tertiary amino group.

2. The polysiloxane according to claim 1, wherein $R^1$ in the structural unit (I) and/or the structural unit (II) shown in the formula (1) is selected from the group consisting of the group of the formulas (2)–(7),

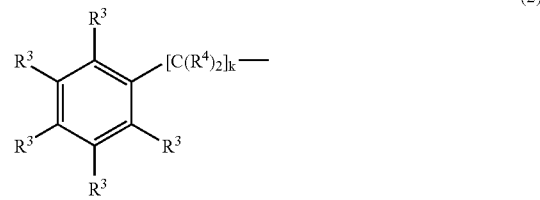

(2)

wherein $R^3$ individually represents a fluorine atom, fluoroalkyl group having 1–10 carbon atoms, hydrogen atom, halogen atom other than fluorine atom, alkyl group having 1–10 carbon atoms, or monovalent organic group having an acid-dissociable group, a hydroxyl group, or a carboxyl group, $R^4$ individually represents a fluorine atom, fluoroalkyl group having 1–10 carbon atoms, hydrogen atom, halogen atom other than fluorine atom, or alkyl group having 1–10 carbon atoms, provided that at least one of five $R^3$ groups and 2k $R^4$ groups represents a fluorine atom or fluoroalkyl group having 1–10 carbon atoms, and k is an integer of 0 to 10,

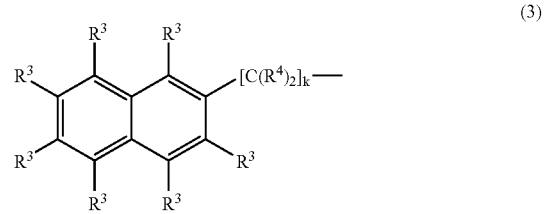

(3)

wherein $R^3$ individually represents a fluorine atom, fluoroalkyl group having 1–10 carbon atoms, hydrogen atom, halogen atom other than fluorine atom, alkyl group having 1–10 carbon atoms, or monovalent organic group having an acid-dissociable group, a hydroxyl group, or a carboxyl group, $R^4$ individually represents a fluorine atom, fluoroalkyl group having 1–10 carbon atoms, hydrogen atom, halogen atom other than fluorine atom, or alkyl group having 1–10 carbon atoms, provided that at least one of seven $R^3$ and 2k $R^4$ groups represents a fluorine atom or fluoroalkyl group having 1–10 carbon atoms, and k is an integer of 0 to 10,

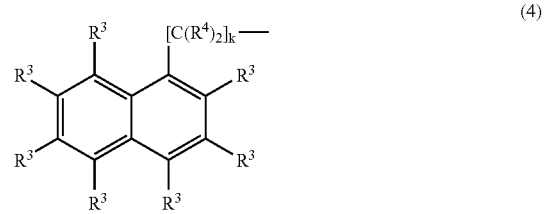

(4)

wherein $R^3$ individually represents a fluorine atom, fluoroalkyl group having 1–10 carbon atoms, hydrogen atom, halogen atom other than fluorine atom, alkyl group having 1–10 carbon atoms, or monovalent organic group having an acid-dissociable group, a hydroxyl group, or a carboxyl group, $R^4$ individually represents a fluorine atom, fluoroalkyl group having 1–10 carbon atoms, hydrogen atom, halogen atom other than fluorine atom, or alkyl group having 1–10 carbon atoms, provided that at least one of seven groups and 2k R$^4$ groups represents a fluorine atom or fluoroalkyl group having 1–10 carbon atoms, and k is an integer of 0 to 10,

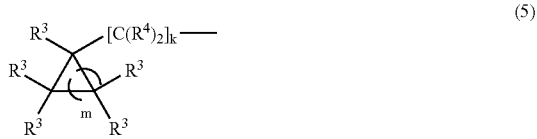
(5)

wherein R$^3$ individually represents a fluorine atom, fluoroalkyl group having 1–10 carbon atoms, hydrogen atom, halogen atom other than fluorine atom, alkyl group having 1–10 carbon atoms, or monovalent organic group having an acid-dissociable group, a hydroxyl group, or a carboxyl group, R$^4$ individually represents a fluorine atom, fluoroalkyl group having 1–10 carbon atoms, hydrogen atom, halogen atom other than fluorine atom, or alkyl group having 1–10 carbon atoms, provided that at least one of (3+2m) R$^3$ groups and 2k R$^4$ groups represents a fluorine atom or fluoroalkyl group having 1–10 carbon atoms, k is an integer of 0 to 10, and m is an integer of 1 to 18,

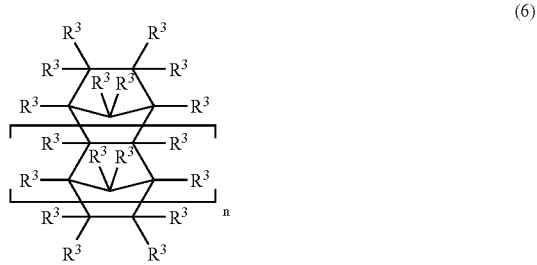
(6)

wherein one of (12+6n) R$^3$ groups represents a group —[C(R$^4$)$_2$]$_k$— (wherein R$^4$ individually represents a fluorine atom, fluoroalkyl group having 1–10 carbon atoms, hydrogen atom, halogen atom other than fluorine atom, alkyl group having 1–10 carbon atoms and k is an integer of 0–10) and the remaining R$^3$ groups individually represent a fluorine atom, fluoroalkyl group having 1–10 carbon atoms, hydrogen atom, halogen atom other than fluorine atom, alkyl group having 1–10 carbon atoms, or monovalent organic group having an acid-dissociable group, a hydroxyl group, or a carboxyl group, provided that at least one of the remaining (11+6n) R$^3$ groups and 2k R$^4$ groups represents a fluorine atom or fluoroalkyl group having 1–10 carbon atoms, and n is an integer of 0–3,

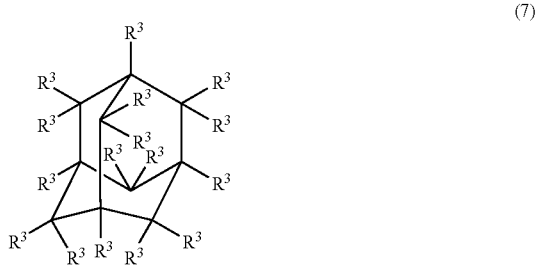
(7)

wherein one of 16 R$^3$ groups represents a group —[C(R$^4$)$_2$]$_k$— (wherein R$^4$ individually represents a fluorine atom, fluoroalkyl group having 1–10 carbon atoms, hydrogen atom, halogen atom other than fluorine atom, alkyl group having 1–10 carbon atoms and k is an integer of 0–10) and the remaining R$^3$ groups individually represent a fluorine atom, fluoroalkyl group having 1–10 carbon atoms, hydrogen atom, halogen atom other than fluorine atom, alkyl group having 1–10 carbon atoms, or monovalent organic group having an acid-dissociable group, a hydroxyl group, or a carboxyl group, provided that at least one of the remaining 15 R$^3$ groups and 2k R$^4$ groups represents a fluorine atom or fluoroalkyl group having 1–10 carbon atoms.

3. The polysiloxane according to claim 2, wherein the structural unit (I) and/or the structural unit (II) shown in the formula (1) contains the group of the following formula (8),

wherein P represents a single bond, a methylene group, difluoromethylene group, linear or branched alkylene group having 2–10 carbon atoms, or a linear or branched fluoroalkylene group having 2–10 carbon atoms, Q is —O— or —COO—, and R$^5$ represents a hydrogen atom or a monovalent organic group dissociating with an acid to produce a hydrogen atom.

4. The polysiloxane according to claim 2, wherein R$^1$ in the structural unit (I) and/or the structural unit (II) is a group of the formula (6) described in claim 2 and the group of the formula (6) contains a group of the formula (8) described in claim 3.

5. The polysiloxane according to claim 2, further comprising a structural unit with a norbornane skeleton in addition to the structural unit (I) and/or the structural unit (II) shown in the formula (1).

6. The polysiloxane according to claim 4, wherein the ratio (Mw/Mn) of the polystyrene-reduced weight average molecular weight (Mw) to the polystyrene-reduced number average molecular weight (Mn) determined by gel permeation chromatography (GPC) of the polysiloxane is 1.5 or less.

7. A radiation-sensitive resin composition comprising (A) the polysiloxane according to claim 1 and (B) a photoacid generator.

8. The radiation-sensitive resin composition according to claim 7, wherein the photoacid generator (B) comprises a compound generating trifluoromethane sulfonic acid or an acid of the following formula (17) upon exposure to light,

(17)

wherein Rf$_4$ individually represents a fluorine atom or trifluoromethyl group, Ra represents a hydrogen atom, fluorine atom, linear or branched alkyl group having 1–20 carbon atoms, linear or branched fluoroalkyl group having 1–20 carbon atoms, substituted or unsubstituted monovalent cyclic hydrocarbon group having 3–20 carbon atoms, or substituted or unsubstituted monovalent cyclic fluoro-hydrocarbon group having 3–20 carbon atoms.

9. The radiation-sensitive resin composition according to claim 8, wherein the photoacid generator (B) further comprises a compound generating an acid of the following formula (18), an acid of the following formula (19), or an acid of the following formula (20) upon exposure to light,

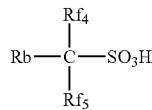 (18)

Rs-SO$_3$H (19)

Rc-COOH (20)

in the formula (18), Rf$_4$ represents a fluorine atom or trifluoromethyl group, Rf$_5$ represents a hydrogen atom, fluorine atom, methyl group, or trifluoromethyl group, Rb represents a hydrogen atom, a linear or branched alkyl group having 1–20 carbon atoms, a substituted or unsubstituted monovalent cyclic hydrocarbon group having 3–20 carbon atoms, or a substituted or unsubstituted monovalent cyclic fluoro-hydrocarbon group having 3–20 carbon atoms, in the formula (19), Rs represents a linear or branched alkyl group having 1–20 carbon atoms or a substituted or unsubstituted monovalent cyclic hydrocarbon group having 3–20 carbon atoms, and in the formula (20), Rc represents a linear or branched alkyl group having 1–20 carbon atoms, a linear or branched fluoroalkyl group having 1–20 carbon atoms, a substituted or unsubstituted monovalent cyclic hydrocarbon group having 3–20 carbon atoms, or a substituted or unsubstituted monovalent cyclic fluoro-hydrocarbon group having 3–20 carbon atoms.

10. The radiation-sensitive resin composition according to claim 7, further comprising (U) a nitrogen-containing organic compound as an acid diffusion controller.

11. The radiation-sensitive resin composition according to claim 10, wherein the nitrogen-containing organic compounds is at least one compound selected from the group consisting of tri(cyclo)alkylamines, N-t-butoxycarbonyl group-containing amino compounds, pyridines, and piperazines.

12. A radiation-sensitive resin composition comprising (A) the polysiloxane according to claim 2 and (B) a photoacid generator.

13. A radiation-sensitive resin composition comprising (A) the polysiloxane according to claim 3 and (B) a photoacid generator.

14. A radiation-sensitive resin composition comprising (A) the polysiloxane according to claim 4 and (B) a photoacid generator.

15. A radiation-sensitive resin composition comprising (A) the polysiloxane according to claim 5 and (B) a photoacid generator.

16. A radiation-sensitive resin composition comprising (A) the polysiloxane according to claim 6 and (B) a photoacid generator.

17. A process for producing the polysiloxane of claim 1 comprising:

polycondensing a silane compound (i) and/or a silane compound (ii) shown by the following formula (10) in the presence of an acid catalyst and further proceeding the condensation reaction in the presence of a base catalyst,

 (10)

(i)      (ii)

wherein R$^1$ represents a monovalent aromatic group having 6–20 carbon atoms substituted with at least one group selected from the group consisting of a fluorine atom and fluoroalkyl groups having 1–10 carbon atoms or a monovalent alicyclic group having 3–15 carbon atoms substituted with at least one group selected from the group consisting of a fluorine atom and fluoroalkyl groups having 1–10 carbon atoms, R$^2$ represents a monovalent aromatic group having 6–20 carbon atoms substituted with at least one group selected from the group consisting of a fluorine atom and fluoroalkyl groups having 1–10 carbon atoms, a monovalent alicyclic group having 3–15 carbon atoms substituted with at least one group selected from the group consisting of a fluorine atom and fluoroalkyl groups having 1–10 carbon atoms, a hydrogen atom, a halogen atom, a monovalent hydrocarbon group having 1–20 carbon atoms, a haloalkyl group having 1–20 carbon atoms, or a primary, secondary, or tertiary amino group, and R$^6$ individually represents a linear, branched, or cyclic alkyl group having 1–10 carbon atoms or a linear, branched, or cyclic haloalkyl group having 1–10 carbon atoms;

wherein the silane compound (i) or the silane compound (ii) comprises an acid-dissociable group or, alternatively, wherein the method further comprises polycondensing silane compound (i) and silane compound (ii) in the presence of a third silane compound comprising an acid-dissociable group.

* * * * *